US010931397B2

(12) United States Patent
Wang et al.

(10) Patent No.: US 10,931,397 B2
(45) Date of Patent: Feb. 23, 2021

(54) METHOD AND APPARATUS FOR SENDING MODULATION AND CODING SCHEME (MCS)

(71) Applicant: HUAWEI TECHNOLOGIES CO.,LTD., Guangdong (CN)

(72) Inventors: Jian Wang, Hangzhou (CN); Lingchen Huang, Hangzhou (CN); Yunfei Qiao, Hangzhou (CN); Rong Li, Hangzhou (CN); Jun Wang, Hangzhou (CN); Yinggang Du, Shenzhen (CN); Yiqun Ge, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/695,216

(22) Filed: Nov. 26, 2019

(65) Prior Publication Data

US 2020/0099467 A1 Mar. 26, 2020

Related U.S. Application Data

(63) Continuation of application No. PCT/CN2019/072045, filed on Jan. 16, 2019.

(30) Foreign Application Priority Data

Jan. 18, 2018 (CN) .......................... 201810050989.5
Feb. 24, 2018 (CN) .......................... 201810157629.5

(51) Int. Cl.
*H04L 1/00* (2006.01)

(52) U.S. Cl.
CPC .......... *H04L 1/0009* (2013.01); *H04L 1/0003* (2013.01); *H04L 1/0013* (2013.01); *H04L 1/0017* (2013.01); *H04L 1/0057* (2013.01)

(58) Field of Classification Search
CPC ... H04L 1/0009; H04L 1/0057; H04L 1/0017; H04L 1/0003; H04L 1/0013
See application file for complete search history.

(56) References Cited

U.S. PATENT DOCUMENTS

2010/0014500 A1   1/2010 Lee et al.
2010/0313098 A1* 12/2010 Lee .................. H03M 13/2707
                                              714/752

(Continued)

FOREIGN PATENT DOCUMENTS

CN   101521904 A   9/2009
CN   102624501 A   8/2012
(Continued)

OTHER PUBLICATIONS

3rd Generation Partnership Project Technical Specification Group Radio Access Network, Mar. 2019, 3GPP TS 38.214 V15.5.0 (Year: 2019).*

(Continued)

*Primary Examiner* — Tejis Daya
(74) *Attorney, Agent, or Firm* — Huawei Technologies Co., Ltd.

(57) ABSTRACT

This application provides a method for communicating a modulation and coding scheme (MCS). A terminal device obtains a modulation order, a code rate, or a spectral efficiency, determines an index of a reference MCS from a mapping table based on the obtained modulation order, code rate, or spectral efficiency, and reports the index of the reference MCS to a network device. The mapping table includes one or more mapping relationships between an MCS index and a modulation order, a code rate, or a spectral efficiency. The terminal device may process uplink or downlink data based on the determined MCS, thereby improving data transmission reliability.

16 Claims, 4 Drawing Sheets

(56) References Cited

U.S. PATENT DOCUMENTS

| | | | |
|---|---|---|---|
| 2011/0141941 A1* | 6/2011 | Lee | H04L 1/0038 370/252 |
| 2012/0058730 A1* | 3/2012 | Jitsukawa | H04L 1/0019 455/63.1 |
| 2012/0320862 A1* | 12/2012 | Ko | H04B 7/0417 370/329 |
| 2013/0182627 A1* | 7/2013 | Lee | H04L 5/0053 370/311 |
| 2015/0103798 A1 | 4/2015 | Li | |
| 2015/0117568 A1* | 4/2015 | Wang | H04L 5/1453 375/298 |
| 2015/0173064 A1* | 6/2015 | Kim | H04B 7/26 370/252 |
| 2015/0200746 A1 | 7/2015 | Pan et al. | |
| 2015/0207608 A1* | 7/2015 | Suikkanen | H04L 1/0003 370/329 |
| 2015/0271794 A1* | 9/2015 | Kang | H04L 1/0016 370/329 |
| 2016/0173253 A1 | 6/2016 | Hwang et al. | |
| 2016/0337023 A1 | 11/2016 | Yi et al. | |
| 2018/0097591 A1* | 4/2018 | Islam | H04L 5/0023 |
| 2018/0351625 A1* | 12/2018 | Xu | H04L 1/0003 |
| 2019/0044647 A1* | 2/2019 | Tomeba | H04L 1/0026 |
| 2019/0165894 A1* | 5/2019 | Choi | H04L 1/1887 |
| 2019/0215095 A1* | 7/2019 | Park | H04W 72/042 |
| 2019/0313426 A1* | 10/2019 | Lin | H04W 72/1205 |

FOREIGN PATENT DOCUMENTS

| | | |
|---|---|---|
| CN | 103580788 A | 2/2014 |
| CN | 104283638 A | 1/2015 |
| CN | 104468027 A | 3/2015 |
| CN | 105850066 A | 8/2016 |
| CN | 106160987 A | 11/2016 |
| CN | 106464647 A | 2/2017 |
| CN | 106559171 A | 4/2017 |
| WO | 2011015097 A1 | 2/2011 |
| WO | 2014000306 A1 | 1/2014 |
| WO | WO-2017050273 A1 * | 3/2017 ........... H04L 1/0026 |

OTHER PUBLICATIONS

3GPP TS 38.212 V15.0.0 (Dec. 2017);3rd Generation Partnership Project;Technical Specification Group Radio Access Network;NR;Multiplexing and channel coding(Release 15);total 82 pages.

3GPP TS 38.214 V15.0.0 (Dec. 2017);3rd Generation Partnership Project;Technical Specification Group Radio Access Network;NR;Physical layer procedures for data (Release 15);total 71 pages.

Intel Corporation, On link adaptation enhancements to support URLLC. 3GPP TSG RAN WG1 Meeting 90bis, Prague, Czech Republic, Oct. 9-13, 2017, R1-1717399, 5 pages.

Ericsson, CQI and MCS tables for URLLC. 3GPP TSG-RAN WG1 Meeting #91ah, Vancouver, Canada, Jan. 22-26, 2018, R1-1800959, 7 pages.

* cited by examiner

METHOD AND APPARATUS FOR SENDING MODULATION AND CODING SCHEME (MCS)

CROSS-REFERENCE TO RELATED APPLICATIONS

This application is a continuation of International Patent Application No. PCT/CN2019/072045, filed on Jan. 16, 2019, which claims priority to Chinese Patent Application No. 201810050989.5, filed on Jan. 18, 2018 and Chinese Patent Application No. 201810157629.5 filed on Feb. 24, 2018. The disclosures of the aforementioned patent applications are hereby incorporated by reference in their entireties.

TECHNICAL FIELD

This application relates to the field of communications technologies, and more specifically, to a data sending method and an apparatus.

BACKGROUND

Normally, in a Long Term Evolution (LTE) system, a base station does not know channel quality before sending downlink data to a terminal device. As wireless communications systems continuously evolve, increasingly high data transmission reliability is required. For example, in a fifth-generation mobile communications technology (also referred to as 5G), ultra-reliable data transmission is required in an ultra-reliable and low latency communications (URLLC) scenario, and a block error rate needs to be even less than 1e-9 in some application scenarios. It is readily to figure out that it is difficult to ensure transmission reliability when the base station sends downlink data without knowing channel quality at all. There is currently no feasible solution in the industry to meet a high requirement of data transmission reliability in a future communications system.

SUMMARY

This application provides a data sending method, to improve data transmission reliability. According to a first aspect, this application provides a data sending method. The method includes: obtaining, by a terminal device, a modulation order, a code rate, or spectral efficiency; selecting, by the terminal device, an index of a reference channel quality indicator (CQI) from a prestored mapping table based on the obtained modulation order, code rate, or spectral efficiency, where the mapping table includes a mapping relationship between a CQI index and a modulation order, a code rate, or spectral efficiency; sending, by the terminal device, first indication information to a network device, where the first indication information is used to indicate the index of the reference CQI; receiving, by the terminal device, second indication information from the network device, where the second indication information is used to indicate an index of a CQI; and determining, by the terminal device from the mapping table based on the index of the target CQI, at least one of a modulation order, a code rate, and a coding scheme that are corresponding to the target CQI.

In this embodiment of this application, the terminal device and the network device prestore the mapping table that records at least a mapping relationship between a CQI index and a modulation order, a code rate, and/or spectral efficiency. The CQI index is a sequence number obtained after channel quality is quantified, and therefore each CQI index can reflect the channel quality. The terminal device first measures channel quality, selects a CQI index that reflects current channel quality from the prestored mapping table, and feeds back the CQI index to the network device. In this way, with reference to the index, of the reference CQI, fed back by the terminal device and with reference to a current network resource status, the network device determines a resource allocation and modulation manner, a coding scheme, and the like that are used to send downlink data, and returns the index of the finally selected target CQI to the terminal device. Subsequently, the network device may send data to the terminal device by using the code rate, the modulation order, the coding scheme, and the like that are corresponding to the index of the target CQI, thereby improving data transmission reliability.

In addition, a process of measuring the channel quality by the terminal device may be implemented according to the prior art, and is not described in detail herein.

With reference to the first aspect, in some implementations of the first aspect, the mapping table further records a mapping relationship between a CQI index and a coding scheme.

A coding scheme is a code that is used to code a data channel. Optionally, the coding scheme in this embodiment of this application may include a polar code, an low density parity check (LDPC) base graph BG2, and an LDPC base graph BG1. Specifically, the LDPC BG2 represents an LDPC code obtained based on a base graph BG2. The LDPC BG1 represents an LDPC code obtained based on a base graph BG1.

According to a second aspect, this application provides a data sending method, where the method includes: determining, by a network device, a modulation order, a code rate, or spectral efficiency that needs to be used to send data; selecting, by the network device, an index of a target CQI from a prestored mapping table based on the determined modulation order, code rate, or spectral efficiency, where the mapping table includes a mapping relationship between a CQI index and a modulation order, a code rate, or spectral efficiency; and sending, by the network device, second indication information, where the second indication information is used to indicate the index of the target CQI.

With reference to the second aspect, in some implementations of the second aspect, the sending data is sending uplink data or sending downlink data.

With reference to the second aspect, in some implementations of the second aspect, the mapping table further includes a mapping relationship between a CQI index and a coding scheme.

With reference to the second aspect, in some implementations of the second aspect, the modulation order, the code rate, or the spectral efficiency that needs to be used to send data is determined by the network device based on an index of a reference CQI.

Further, in some implementations of the second aspect, the method further includes: receiving, by the network device, first indication information from a terminal device, where the first indication information is used to indicate the index of the reference CQI.

It is applicable to both the data sending methods of the first aspect and the second aspect that, in some implementations, any mapping relationship between a CQI index and a modulation order, a code rate, or spectral efficiency in the mapping table meets a mapping relationship shown in Table A or Table B.

TABLE A

| CQI index | Spectral efficiency | Code rate | Modulation order |
|---|---|---|---|
| 0 | — | — | — |
| 1 | 0.0781 | 40 | 2 |
| 2 | 0.1504 | 77 | 2 |
| 3 | 0.2813 | 144 | 2 |
| 4 | 0.4824 | 247 | 2 |
| 5 | 0.7734 | 396 | 2 |
| 6 | 1.1328 | 580 | 2 |
| 7 | 1.4922 | 764 | 2 |
| 8 | 1.9922 | 510 | 4 |
| 9 | 2.5742 | 659 | 4 |
| 10 | 3.1133 | 797 | 4 |
| 11 | 3.6738 | 627 | 6 |
| 12 | 4.3770 | 747 | 6 |
| 13 | 4.9746 | 849 | 6 |
| 14 | 5.4785 | 935 | 6 |
| 15 | 5.7070 | 974 | 6 |

TABLE B

| CQI index | Spectral efficiency | Code rate | Modulation order |
|---|---|---|---|
| 0 | — | — | — |
| 1 | 0.0781 | 40 | 2 |
| 2 | 0.1641 | 84 | 2 |
| 3 | 0.3164 | 162 | 2 |
| 4 | 0.5391 | 276 | 2 |
| 5 | 0.8555 | 438 | 2 |
| 6 | 1.2285 | 629 | 2 |
| 7 | 1.5898 | 407 | 4 |
| 8 | 2.168 | 555 | 4 |
| 9 | 2.7148 | 695 | 4 |
| 10 | 3.0703 | 786 | 4 |
| 11 | 3.8555 | 658 | 6 |
| 12 | 4.3301 | 739 | 6 |
| 13 | 4.9922 | 852 | 6 |
| 14 | 5.5254 | 943 | 6 |
| 15 | 5.7129 | 975 | 6 |

It is applicable to both the data sending methods of the first aspect and the second aspect that, in some implementations, any mapping relationship between a CQI index and a modulation order, a code rate, spectral efficiency, or a coding scheme in the mapping table meets a mapping relationship shown in any one of Table C to Table F.

TABLE C

| CQI index | Spectral efficiency | Code rate | Modulation order | Coding scheme |
|---|---|---|---|---|
| 0 | — | — | — | — |
| 1 | 0.0781 | 40 | 2 | Polar |
| 2 | 0.1387 | 71 | 2 | Polar |
| 3 | 0.2344 | 120 | 2 | Polar |
| 4 | 0.3945 | 202 | 2 | Polar |
| 5 | 0.6328 | 324 | 2 | Polar |
| 6 | 0.9551 | 489 | 2 | Polar |
| 7 | 1.3320 | 682 | 2 | Polar |
| 8 | 1.8125 | 464 | 4 | LDPC BG2 |
| 9 | 2.418 | 619 | 4 | LDPC BG2 |
| 10 | 3.0078 | 770 | 4 | LDPC BG2 |
| 11 | 3.5566 | 607 | 6 | LDPC BG2 |
| 12 | 4.2891 | 732 | 6 | LDPC BG2 |
| 13 | 4.9277 | 841 | 6 | LDPC BG2 |
| 14 | 5.4609 | 932 | 6 | LDPC BG2 |
| 15 | 5.707 | 974 | 6 | LDPC BG2 |

TABLE D

| CQI index | Spectral efficiency | Code rate | Modulation order | Coding scheme |
|---|---|---|---|---|
| 0 | — | — | — | — |
| 1 | 0.0781 | 40 | 2 | Polar |
| 2 | 0.1484 | 76 | 2 | Polar |
| 3 | 0.2578 | 132 | 2 | Polar |
| 4 | 0.4355 | 223 | 2 | Polar |
| 5 | 0.6992 | 358 | 2 | Polar |
| 6 | 1.0449 | 535 | 2 | Polar |
| 7 | 1.4238 | 729 | 2 | Polar |
| 8 | 1.9883 | 509 | 4 | LDPC BG2 |
| 9 | 2.5781 | 660 | 4 | LDPC BG2 |
| 10 | 2.9961 | 767 | 4 | LDPC BG2 |
| 11 | 3.709 | 633 | 6 | LDPC BG2 |
| 12 | 4.3008 | 734 | 6 | LDPC BG2 |
| 13 | 4.9277 | 841 | 6 | LDPC BG2 |
| 14 | 5.5020 | 939 | 6 | LDPC BG2 |
| 15 | 5.7129 | 975 | 6 | LDPC BG2 |

TABLE E

| CQI index | Spectral efficiency | Code rate | Modulation order | Coding scheme |
|---|---|---|---|---|
| 0 | — | — | — | — |
| 1 | 0.0781 | 40 | 2 | Polar |
| 2 | 0.1387 | 71 | 2 | Polar |
| 3 | 0.2344 | 120 | 2 | Polar |
| 4 | 0.3945 | 202 | 2 | Polar |
| 5 | 0.6328 | 324 | 2 | Polar |
| 6 | 0.9805 | 502 | 2 | LDPC BG2 |
| 7 | 1.3691 | 701 | 2 | LDPC BG2 |
| 8 | 1.8125 | 464 | 4 | LDPC BG2 |
| 9 | 2.418 | 619 | 4 | LDPC BG2 |
| 10 | 3.0078 | 770 | 4 | LDPC BG2 |
| 11 | 3.5566 | 607 | 6 | LDPC BG2 |
| 12 | 4.2891 | 732 | 6 | LDPC BG2 |
| 13 | 4.9277 | 841 | 6 | LDPC BG2 |
| 14 | 5.4609 | 932 | 6 | LDPC BG2 |
| 15 | 5.707 | 974 | 6 | LDPC BG2 |

TABLE F

| CQI index | Spectral efficiency | Code rate | Modulation order | Coding scheme |
|---|---|---|---|---|
| 0 | — | — | — | — |
| 1 | 0.0781 | 40 | 2 | Polar |
| 2 | 0.1484 | 76 | 2 | Polar |
| 3 | 0.2578 | 132 | 2 | Polar |
| 4 | 0.4355 | 223 | 2 | Polar |
| 5 | 0.7012 | 359 | 2 | LDPC BG2 |
| 6 | 1.0762 | 551 | 2 | LDPC BG2 |
| 7 | 1.4336 | 734 | 2 | LDPC BG2 |
| 8 | 1.9883 | 509 | 4 | LDPC BG2 |
| 9 | 2.5781 | 660 | 4 | LDPC BG2 |
| 10 | 3.043 | 779 | 4 | Polar |
| 11 | 3.709 | 633 | 6 | LDPC BG2 |
| 12 | 4.3008 | 734 | 6 | LDPC BG2 |
| 13 | 4.9512 | 845 | 6 | Polar |
| 14 | 5.5313 | 944 | 6 | Polar |
| 15 | 5.7129 | 975 | 6 | LDPC BG2 |

It should be noted that a code rate, in each table provided in this embodiment of this application, divided by 1024 is an actual code rate.

Further, a plurality of mapping tables designed in this embodiment of this application may be applied to different reliability requirements. A simple and feasible solution is provided for a plurality of scenarios with different block error rate (BLER) requirements.

It is applicable to both the data sending methods of the first aspect and the second aspect that, in some implementations, a first value set of the modulation order in the mapping table corresponds to a first coding scheme in the coding scheme, a second value set of the modulation order corresponds to a second coding scheme in the coding scheme, and the first value set and the second value set include at least one value of the modulation order.

In this implementation, there may be a mapping relationship between the coding scheme and a value of the modulation order. For example, when the value of the modulation order is equal to 2 and 4, the coding scheme uses the LDPC BG2; when the modulation order is equal to 6, the coding scheme uses the LDPC BG1. For another example, when the value of the modulation order is equal to 2, the coding scheme uses the polar code; when the value of the modulation order is equal to 4 and 6, the coding scheme uses the LDPC BG2. Certainly, there may be other mapping relationships that are not enumerated one by one herein.

It should be understood that the first coding scheme and the second coding scheme herein only represent two different coding schemes, but specific codes used by the first coding scheme and the second coding scheme are not limited. Similarly, the first value set and the second value set only represent two different value sets, and each value set includes at least one value of the modulation order. Apparently, the modulation order may not be limited to have only two value sets, for example, may have three or four value sets. A relationship between any two value sets meets a relationship between the first value set and the second value set herein.

According to a third aspect, this application provides a data sending method, where the method includes: obtaining, by a terminal device, a modulation order, a code rate, or spectral efficiency; selecting, by the terminal device, an index of a reference channel quality indicator (CQI) from a prestored mapping table based on the obtained modulation order, code rate, or spectral efficiency, where the mapping table includes a mapping relationship between a CQI index and a modulation order, a code rate, or spectral efficiency; and reporting, by the terminal device, the index of the reference CQI to a network device.

In this embodiment of this application, the terminal device and the network device prestore the mapping table that records at least a mapping relationship between a CQI index and a modulation order, a code rate, and/or spectral efficiency. The CQI index is a sequence number obtained after channel quality is quantified, and therefore each CQI index can reflect the channel quality. The terminal device first measures channel quality, selects a CQI index that reflects current channel quality from the prestored mapping table, and feeds back the CQI index to the network device. In this way, data transmission reliability can be improved.

According to a fourth aspect, a method for receiving a channel quality indicator (CQI) is provided, where the method includes: receiving, by a terminal device, indication information from a network device, where the indication information is used to indicate an index of a target CQI; determining, by the terminal device from a mapping table based on the index of the target CQI, a modulation order, a code rate, or spectral efficiency that is corresponding to the target CQI, where the mapping table includes a mapping relationship between a CQI index and a modulation order, a code rate, or spectral efficiency; and processing, by the terminal device, uplink or downlink data based on the determined modulation order, code rate, or spectral efficiency.

Optionally, the receiving, by a terminal device, indication information from a network device includes: receiving, by the terminal device, the index of the target CQI from the network device by using 4 bits.

According to a fifth aspect, a method for sending a channel quality indicator (CQI) is provided, where the method includes: determining, by a network device, a modulation order, a code rate, or spectral efficiency that needs to be used by the network device to send data or used by a terminal device to send data; selecting, by the network device, an index of a target CQI from a prestored mapping table based on the determined modulation order, code rate, or spectral efficiency, where the mapping table includes a mapping relationship between a CQI index and a modulation order, a code rate, or spectral efficiency; and sending, by the network device, indication information to the terminal device, where the indication information is used to indicate the index of the target CQI.

Optionally, the sending, by the network device, indication information includes: sending, by the network device, the index of the target CQI by using 4 bits.

Optionally, the determining, by a network device, a modulation order, a code rate, or spectral efficiency that needs to be used by the network device to send data or used by a terminal device to send data includes: determining, by the network device based on a network resource status, the modulation order, the code rate, or the spectral efficiency that needs to be used by the network device to send data or used by the terminal device to send data; or determining, by the network device from the mapping table with reference to an index, of a reference CQI, reported by the terminal device, a modulation order, a code rate, or spectral efficiency that is corresponding to the reference CQI.

According to a sixth aspect, a terminal device for sending a channel quality indicator (CQI) is provided, where the terminal device includes:

a processing unit, configured to obtain a modulation order, a code rate, or spectral efficiency, where the processing unit is further configured to select an index of a reference CQI from a prestored mapping table based on the obtained modulation order, code rate, or spectral efficiency, and the mapping table includes a mapping relationship between a CQI index and a modulation order, a code rate, or spectral efficiency; and a transceiver unit, configured to report the index of the reference CQI to a network device.

Optionally, that the transceiver unit reports the index of the reference CQI to a network device includes: the transceiver unit reports the index of the reference CQI to the network device by using 4 bits.

According to a seventh aspect, a terminal device for receiving a channel quality indicator (CQI) is provided, where the terminal device includes:

a transceiver unit, configured to receive indication information from a network device, where the indication information is used to indicate an index of a target CQI; and a processing unit, configured to determine, from a mapping table based on the index of the target CQI, a modulation order, a code rate, or spectral efficiency that is corresponding to the target CQI, where the mapping table includes a mapping relationship between a CQI index and a modulation order, a code rate, or spectral efficiency, and the processing unit is further configured to process uplink or downlink data based on the determined modulation order, code rate, or spectral efficiency.

According to an eighth aspect, a network device for sending a channel quality indicator (CQI) is provided, where the network device includes: a processing unit, configured to determine a modulation order, a code rate, or spectral efficiency that needs to be used by the network device to send data or used by a terminal device to send data, where the processing unit is further configured to select an index of a target CQI from a prestored mapping table based on the determined modulation order, code rate, or spectral efficiency, and the mapping table includes a mapping relationship between a CQI index and a modulation order, a code rate, or spectral efficiency; and a transceiver unit, configured to send indication information to the terminal device, where the indication information is used to indicate the index of the target CQI.

Optionally, the transceiver unit is configured to send the index of the target CQI by using 4 bits.

The processing unit is configured to determine, based on a network resource status, the modulation order, the code rate, or the spectral efficiency that needs to be used by the network device to send data or used by the terminal device to send data; or the processing unit determines, from the mapping table with reference to an index, of a reference CQI, reported by the terminal device, a modulation order, a code rate, or spectral efficiency that is corresponding to the reference CQI.

With reference to the second aspect to the eighth aspect, in a possible design, a CQI index in the mapping table corresponds to a modulation order 2, a code rate 30, or spectral efficiency 0.0586, where an actual code rate is obtained by dividing the value 30 of the code rate by 1024; or with reference to the second aspect to the eighth aspect, in a possible design, a CQI index in the mapping table corresponds to a modulation order 2, a code rate 50, or spectral efficiency 0.0977, where an actual code rate is obtained by dividing the value 50 of the code rate by 1024.

With reference to the second aspect to the eighth aspect, in a possible design, the method or the device is applied to ultra-reliable and low latency communications (URLLC).

With reference to the second aspect to the eighth aspect, in a possible design, the mapping table further records a mapping relationship between a CQI index and a coding scheme.

According to a ninth aspect, a method for sending a modulation and coding scheme MCS is provided, where the method includes: obtaining, by a terminal device, a modulation order, a code rate, or spectral efficiency; selecting, by the terminal device, an index of a reference MCS from a prestored mapping table based on the obtained modulation order, code rate, or spectral efficiency, where the mapping table includes a mapping relationship between an MCS index and a modulation order, a code rate, or spectral efficiency; and reporting, by the terminal device, the index of the reference MCS to a network device.

According to a tenth aspect, a method for receiving a modulation and coding scheme MCS is provided, where the method includes: receiving, by a terminal device, indication information from a network device, where the indication information is used to indicate an index of a target MCS; determining, by the terminal device from a mapping table based on the index of the target MCS, a modulation order, a code rate, or spectral efficiency that is corresponding to the target MCS, where the mapping table includes a mapping relationship between an MCS index and a modulation order, a code rate, or spectral efficiency; and processing, by the terminal device, uplink or downlink data based on the determined modulation order, code rate, or spectral efficiency.

According to an eleventh aspect, a method for sending a modulation and coding scheme MCS is provided, where the method includes: determining, by a network device, a modulation order, a code rate, or spectral efficiency that needs to be used by the network device to send data or used by a terminal device to send data; selecting, by the network device, an index of a target MCS from a prestored mapping table based on the determined modulation order, code rate, or spectral efficiency, where the mapping table includes a mapping relationship between an MCS index and a modulation order, a code rate, or spectral efficiency; and sending, by the network device, indication information to the terminal device, where the indication information is used to indicate the index of the target MCS.

Optionally, the determining, by a network device, a modulation order, a code rate, or spectral efficiency that needs to be used by the network device to send data or used by a terminal device to send data includes: determining, by the network device based on a network resource status, the modulation order, the code rate, or the spectral efficiency that needs to be used by the network device to send data or used by the terminal device to send data; or determining, by the network device from the mapping table with reference to an index, of a reference MCS, reported by the terminal device, a modulation order, a code rate, or spectral efficiency that is corresponding to the reference MCS.

According to a twelfth aspect, a terminal device for sending a modulation and coding scheme MCS is provided, where the terminal device includes: a processing unit, configured to obtain a modulation order, a code rate, or spectral efficiency, where the processing unit is further configured to select an index of a reference MCS from a prestored mapping table based on the obtained modulation order, code rate, or spectral efficiency, and the mapping table includes a mapping relationship between an MCS index and a modulation order, a code rate, or spectral efficiency; and a transceiver unit, configured to report the index of the reference MCS to a network device.

According to a thirteenth aspect, a terminal device for receiving a modulation and coding scheme MCS is provided, where the terminal device includes: a transceiver unit, configured to receive indication information from a network device, where the indication information is used to indicate an index of a target MCS; and a processing unit, configured to determine, from a mapping table based on the index of the target MCS, a modulation order, a code rate, or spectral efficiency that is corresponding to the target MCS, where the mapping table includes a mapping relationship between an MCS index and a modulation order, a code rate, or spectral efficiency, and the processing unit is further configured to process uplink or downlink data based on the determined modulation order, code rate, or spectral efficiency.

According to a fourteenth aspect, a network device for sending a modulation and coding scheme MCS is provided, where the network device includes:

a processing unit, configured to determine a modulation order, a code rate, or spectral efficiency that needs to be used by the network device to send data or used by a terminal device to send data, where the processing unit is further configured to select an index of a target MCS from a prestored mapping table based on the determined modulation order, code rate, or spectral efficiency, and the mapping table includes a mapping relationship between an MCS index and a modulation order, a code rate, or spectral efficiency; and a transceiver unit, configured to send indication information to the terminal device, where the indication information is used to indicate the index of the target MCS.

Optionally, the processing unit is configured to determine, based on a network resource status, the modulation order, the code rate, or the spectral efficiency that actually needs to be used by the network device to send data or used by the terminal device to send data; or the processing unit determines, from the mapping table with reference to an index, of a reference MCS, reported by the terminal device, a modulation order, a code rate, or spectral efficiency that is corresponding to the reference MCS.

With reference to any one of the ninth aspect to the fourteenth aspect, in a possible design, an MCS index in the mapping table corresponds to a modulation order 2, a code rate 30, or spectral efficiency 0.0586, where an actual code rate is obtained by dividing the value 30 of the code rate in the mapping table by 1024; or with reference to any one of the ninth aspect to the fourteenth aspect, in a possible design, an MCS index in the mapping table corresponds to a modulation order 2, a code rate 50, or spectral efficiency 0.0977, where an actual code rate is obtained by dividing the value 50 of the code rate in the mapping table by 1024; or with reference to any one of the ninth aspect to the fourteenth aspect, in a possible design, an MCS index in the mapping table corresponds to a modulation order 2, a code rate 40, or spectral efficiency 0.0781, where an actual code rate is obtained by dividing the value 40 of the code rate in the mapping table by 1024; or with reference to any one of the ninth aspect to the fourteenth aspect, in a possible design, an MCS index in the mapping table corresponds to a modulation order 2, a code rate 64, or spectral efficiency 0.1250, where an actual code rate is obtained by dividing the value 64 of the code rate in the mapping table by 1024.

With reference to any one of the ninth aspect to the fourteenth aspect, in a possible design, the method or the device is applied to ultra-reliable and low latency communications (URLLC).

With reference to any one of the ninth aspect to the fourteenth aspect, in a possible design, the mapping table further records a mapping relationship between an MCS index and a coding scheme.

According to a fifteenth aspect, this application provides a data sending apparatus. The apparatus has a function of implementing the method in the first aspect and any possible implementation of the first aspect. The function may be implemented by using hardware, or may be implemented by executing corresponding software by hardware. The hardware or the software includes one or more units corresponding to the foregoing function.

According to a sixteenth aspect, this application provides a data sending apparatus. The apparatus has a function of implementing the method in the second aspect and any possible implementation of the second aspect. The function may be implemented by using hardware, or may be implemented by executing corresponding software by hardware. The hardware or the software includes one or more units corresponding to the foregoing function.

According to a seventeenth aspect, this application provides a data sending apparatus. The apparatus has a function of implementing the method in the third aspect, the fourth aspect, the fifth aspect, the ninth aspect, the tenth aspect, the eleventh aspect, and any possible implementation thereof. The function may be implemented by using hardware, or may be implemented by executing corresponding software by hardware. The hardware or the software includes one or more units corresponding to the foregoing function.

According to an eighteenth aspect, this application provides a computer readable storage medium. The computer readable storage medium stores a computer instruction, and when the computer instruction runs on a computer, the computer performs the method in the first aspect or any possible implementation of the first aspect.

According to a nineteenth aspect, this application provides a computer readable storage medium. The computer readable storage medium stores a computer instruction, and when the computer instruction runs on a computer, the computer performs the method in the second aspect or any possible implementation of the second aspect.

According to a twentieth aspect, this application provides a computer readable storage medium. The computer readable storage medium stores a computer instruction, and when the computer instruction runs on a computer, the computer performs the method in the third aspect, the fourth aspect, the fifth aspect, the ninth aspect, the tenth aspect, the eleventh aspect, or any possible implementation thereof.

According to a twenty-first aspect, this application provides a chip (or a chip system), including a memory and a processor. The memory is configured to store a computer program, and the processor is configured to invoke the computer program from the memory and run the computer program, so that a communications device in which the chip is installed performs the method in the first aspect and any possible implementation of the first aspect.

According to a twenty-second aspect, this application provides a chip (or a chip system), including a memory and a processor. The memory is configured to store a computer program, and the processor is configured to invoke the computer program from the memory and run the computer program, so that a communications device in which the chip is installed performs the method in the second aspect and any possible implementation of the second aspect.

According to a twenty-third aspect, this application provides a communications device, including a memory and a processor. The memory is configured to store a computer program, and the processor is configured to invoke the computer program from the memory and run the computer program, so that the communications device performs the method in the third aspect, the fourth aspect, the fifth aspect, the ninth aspect, the tenth aspect, the eleventh aspect, or any possible implementation thereof.

According to a twenty-fourth aspect, this application provides a chip (or a chip system), including a memory and a processor. The memory is configured to store a computer program, and the processor is configured to invoke the computer program from the memory and run the computer program, so that a communications device in which the chip is installed performs the method in the third aspect, the fourth aspect, the fifth aspect, the ninth aspect, the tenth aspect, the eleventh aspect, or any possible implementation thereof.

According to a twenty-fifth aspect, this application provides a computer program product. The computer program product includes computer program code. When the computer program code runs on a computer, the computer performs the method in the first aspect and any possible implementation of the first aspect.

According to a twenty-sixth aspect, this application provides a computer program product. The computer program product includes computer program code. When the computer program code runs on a computer, the computer performs the method in the second aspect and any possible implementation of the second aspect.

According to a twenty-seventh aspect, this application provides a computer program product. The computer program product includes computer program code. When the computer program code runs on a computer, the computer performs the method in the third aspect, the fourth aspect, the fifth aspect, the ninth aspect, the tenth aspect, the eleventh aspect, or any possible implementation thereof.

In the technical solutions of the embodiments of this application, before the network device sends downlink data, the terminal device measures channel quality, and selects the index of the reference CQI from the mapping table and reports the index of the reference CQI, to feed back the channel quality to the network device. Based on the index, of the reference CQI, reported by the terminal device and/or the current network resource status, the network device determines the modulation order, the code rate, or the spectral efficiency that needs to be used to send data, selects the index of the target CQI from the mapping table based on the determined modulation order, code rate, or spectral efficiency that needs to be used to send data, and indicates the index of the target CQI to the terminal device, to improve data transmission reliability.

DESCRIPTION OF EMBODIMENTS

The following describes technical solutions in embodiments of this application with reference to accompanying drawings.

Figure 1:
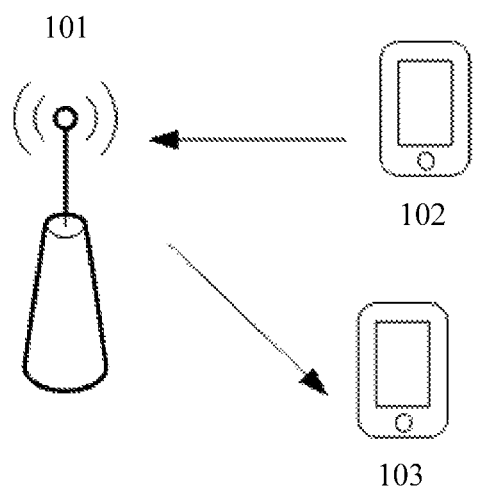
FIG. 1 shows a wireless communications system 100 applicable to an embodiment of this application.

FIG. 1 shows a wireless communications system 100 applicable to an embodiment of this application. The wireless communications system may include at least one network device 101, and the network device communicates with one or more terminal devices (for example, a terminal device 102 and a terminal device 103 shown in FIG. 1). The network device may be a base station, may be a device obtained after a base station and a base station controller are integrated, or may be another device with a similar communication function.

The terminal device is a device having a communication function, and may include a handheld device, an in-vehicle device, a wearable device, a computing device, another processing device connected to a wireless modem, or the like that has a wireless communication function. The terminal device may be deployed on the land, including an indoors or outdoors device and a handheld or in-vehicle device, or may be deployed on the water (for example, on a ship), or may be deployed in the air (for example, on a plane, a balloon, or a satellite). The terminal device may be a mobile phone, a tablet computer (Pad), a computer with a wireless transmission/reception function, a virtual reality (VR) terminal device, an augmented reality (AR) terminal device, a wireless terminal device in industrial control, a wireless terminal device in self driving, a wireless terminal device in telemedicine, a wireless terminal device in a smart grid, a wireless terminal device in transportation safety, a wireless terminal device in a smart city, a wireless terminal device in a smart home, and the like. The terminal device may have different names in different networks, for example, user equipment, a mobile station, a subscriber unit, a station, a cellular phone, a personal digital assistant, a wireless modem, a wireless communications device, a handheld device, a laptop computer, a cordless phone, and a wireless local loop station. For ease of description, these devices are simply referred to as a terminal device in this application.

The base station (BS) may also be referred to as a base station device, and is a device deployed in a radio access network to provide a wireless communication function. The base station may have different names in different wireless access systems. For example, a base station in a universal mobile telecommunications system (UMTS) network is referred to as a NodeB a base station in an LTE network is referred to as an evolved NodeB (eNB or eNodeB), a base station in a new radio (NR) network is referred to as a transmission reception point (TRP) or a next-generation NodeB (gNB), or a base station in another network integrating a plurality of technologies or in other evolved networks may have another name. This is not limited in the present invention.

The wireless communications system in the embodiments of this application includes but is not limited to: a narrowband Internet of Things (NB-IoT) system, a global system for mobile communications (GSM), an enhanced data rate for GSM evolution (EDGE) system, a wideband code division multiple access (WCDMA) system, a code division multiple access 2000 (CDMA2000) system, a time division-synchronous code division multiple access (TTD-SCDMA) system, a long term evolution (LTE) system, three major application scenarios of a next-generation 5G mobile communications system: enhanced mobile broadband (eMBB), ultra-reliable and low latency communications (URLLC), and massive machine type communication (mMTC), or a future new communications system.

For ease of understanding, related concepts in the embodiments of this application are first described briefly.

As a next-generation wireless communication technology, 5G has gained extensive attention and is widely researched by the 3GPP and other international organizations for standardization. A channel coding technology is a commonly used method in the field of communications technologies to improve data transmission reliability. It is proposed in 5G that a low density parity check (LDPC) code is used for a data channel, and a polar code is used for a control channel.

The LDPC code is a type of linear block code with a sparse parity check matrix, to be specific, there are far more zero elements than non-zero elements in a parity check matrix of the LDPC code, and the non-zero elements are irregularly distributed. A linear block code with a code length equal to N and an information sequence length equal to K may be uniquely determined by a parity check matrix of the linear block code. The LDPC code not only has good performance close to a Shannon limit, but also has relatively low decoding complexity and a flexible structure. The LDPC code is a research hotspot in the field of channel coding in recent years, and has been widely used in fields such as deep space communications, fiber optic communications, and a satellite digital video and audio radio service. A quasi-cyclic low-density parity-check (QC-LDPC) code is a subclass of the LDPC code. A parity check matrix of the QC-LDPC code is obtained by extending a base graph, and the parity check matrix of the QC-LDPC is characterized by simple description and easy construction. In 3GPP TS38.212.V15.0.0 (2017-12), two different base graphs (BG) of the LDPC code are introduced for LDPC coding: a BG 1 and a BG 2. For details, refer to the document 3GPP TS38.212.V15.0.0 (2017-12).

The polar code is also a linear block code with a coding matrix (also referred to as a generation matrix) $G_N$ and a coding process $x_1^N = u_1^N \cdot G_N$. $u_1^N = (u_1, u_2, \ldots, u_N)$ is a binary row vector with a length (a code length) of N, and is also referred to as a to-be-coded vector. $N=2^n$, and n is a positive integer. $x_1^N$ is a coded mother codeword. $G_N$ is an N×N matrix, and $G_N = F_2^{\otimes (\log_2 N)}$. $F_2^{\otimes (\log_2 N)}$ is defined as a Kronecker product of $\log_2 N$ matrices $F_2$, where $$F_2 = \begin{bmatrix} 1 & 0 \\ 1 & 1 \end{bmatrix}.$$

Addition and multiplication operations in the foregoing formulas are all addition and multiplication operations in a binary Galois field. In the coding process of the polar code, some bits in $u_1^N$ are used to carry information, and are referred to as an information bit set. A set of indexes of these bits is denoted as A. Other bits are set as fixed values predetermined on a receive end and a transmit end and are referred to as a fixed bit set or a frozen bit set, and a set of indexes of the frozen bit set is denoted as a complementary set $A^c$ of A. The coding process of the polar code is equivalent to $x_1^N = u_A F_N(A) \oplus u_{A^c} F_N(A^c)$. Herein, $F_N(A)$ is a submatrix, in $F_N$, derived from rows corresponding to the indexes in the set A. $F_N(A^c)$ is a submatrix, in $F_N$, derived from rows corresponding to the indexes in the set $A^c$. $u_A$ is a set of information bits in $u_1^N$, and a quantity of the information bits is K. $u_{A^c}$ is a set of fixed bits in $u_1^N$, a quantity of the fixed bits is (N−K), and the fixed bits are known bits. These fixed bits are generally set to 0. However, the fixed bits may be set to any value provided that the receive end and the transmit end pre-agree on the value. Therefore, coding output of the polar code may be simplified as: $x_1^N = u_A \cdot F_N(A)$. Herein, $u_A$ is the set of information bits in $u_1^N$, $u_A$ is a row vector with a length of K, that is, |A|=K, a symbol |·| represents a quantity of elements in a set, K is a size of an information block, $F_N(A)$ is the submatrix that is in the matrix $F_N$ and that is derived from the rows corresponding to the indexes in the set A, and $F_N(A)$ is an N×N matrix. A construction process of the polar code is a selection process of the set A. This determines performance of the polar code.

The technical solution in the embodiments of this application is applicable to a scenario in which a terminal device reports a channel quality indicator (CQI) to a network device, to improve data transmission reliability. The following uses a URLLC scenario in a new radio (NR) technology in 5G as an example to describe a process of a data sending method in the embodiments of this application.

Figure 2:
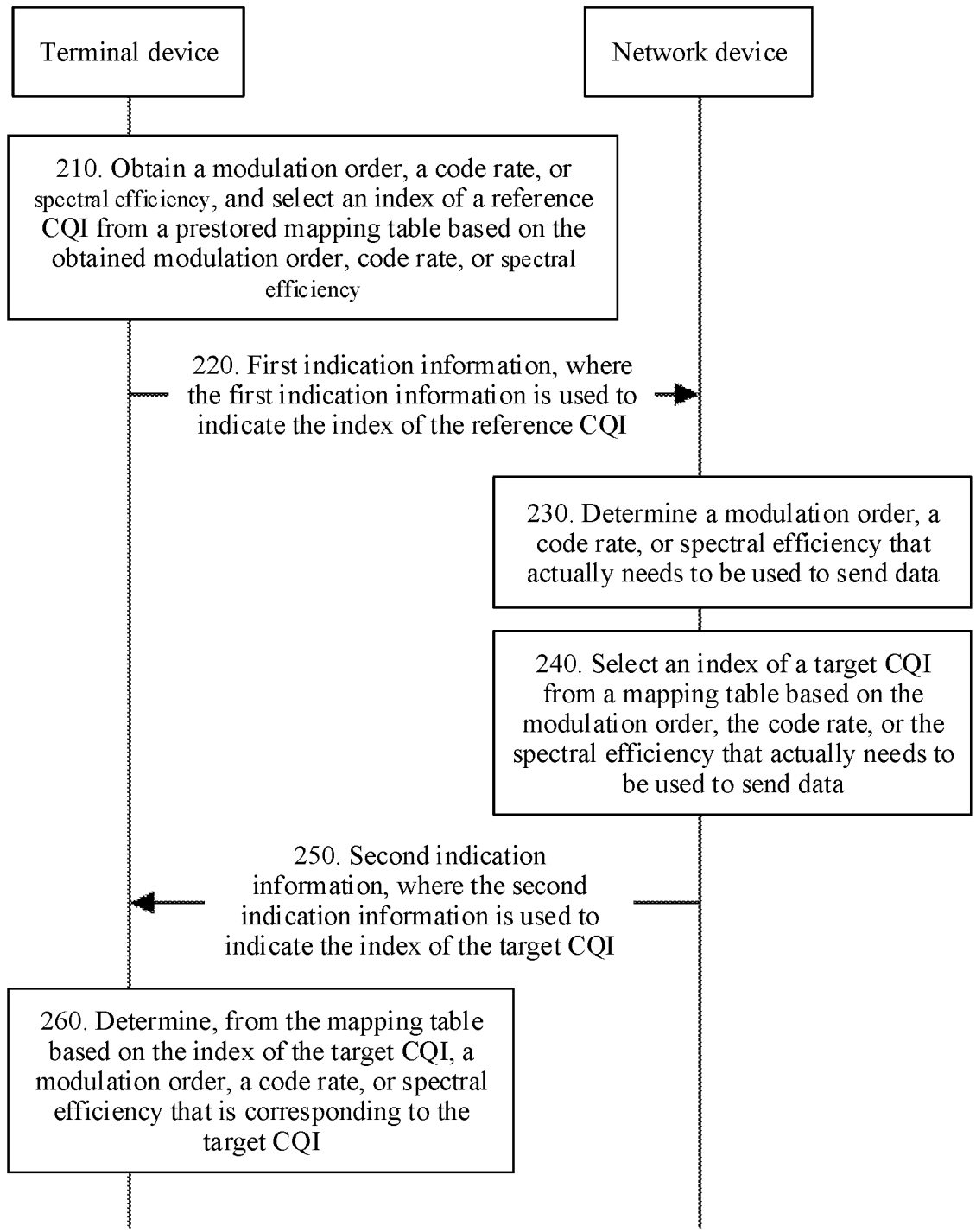
FIG. 2 is a schematic interaction diagram of a data sending method 200 according to an embodiment of this application.

FIG. 2 is a schematic interaction diagram of a data sending method 200 according to an embodiment of this application. It should be understood that steps 210 to 260 are merely intended to illustrate a process of the data sending method 200, and should not constitute any limitation on the method 200. These steps may also be split into more steps or merged into fewer steps.

210. A terminal device obtains a modulation order, a code rate, or spectral efficiency, and selects an index of a reference CQI from a prestored mapping table based on the obtained modulation order, code rate, or spectral efficiency.

The modulation order, the code rate, or the spectral efficiency that is obtained by the terminal device can reflect current channel quality. Channel quality may be quantified as and represented by a channel quality indicator (CQI) index.

The mapping table in this specification may also be referred to as a CQI table or a modulation and coding scheme (MCS) table. The mapping table includes a mapping relationship between a CQI index and a modulation order, a code rate, or spectral efficiency.

The modulation order determines a quantity of bits transmitted in one symbol. For example, QPSK corresponds to a modulation order 2, 16QAM corresponds to a modulation order 4, and 64QAM corresponds to a modulation order 6.

The code rate is a ratio of a quantity of information bits in a transport block to a total quantity of bits on a physical channel.

The spectral efficiency represents information bits that can be carried in one resource element (RE).

It may be understood that before sending downlink data, a network device does not know a data channel condition. To improve data transmission reliability, the terminal device may measure channel quality and feed back the channel quality to the network device. The channel quality is quantified as a sequence of 0 to 15 in communication protocols and is defined as a CQI. Each CQI corresponds to one index (referred to as a CQI index below). A CQI that the terminal device feeds back to the network device is only used as a reference. Therefore, an index of the CQI that the terminal device feeds back to the network device is referred to as an index of a reference CQI in this specification.

220. The terminal device sends first indication information to a network device, and the network device receives the first indication information from the terminal device, where the first indication information is used to indicate the index of the reference CQI.

A form of the first indication information is not limited in this specification, and a person skilled in the art can easily figure out a plurality of feasible manners in which the terminal device reports the index of the reference CQI to the network device. For example, the terminal device may indicate the index of the reference CQI to the network device by using 4 bits.

230. The network device determines a modulation order, a code rate, or spectral efficiency that actually needs to be used to send data.

In step 230, the network device may determine, based on a network resource status, the modulation order, the code rate, or the spectral efficiency that actually needs to be used to send data. Alternatively, the network device may determine, from a mapping table with reference to the index, of the reference CQI, reported by the terminal device, a modulation order, a code rate, or spectral efficiency that is corresponding to the reference CQI. In this way, the network device can learn of the current channel quality, to determine the modulation order, the code rate, or the spectral efficiency that actually needs to be used to send data.

240. The network device selects an index of a target CQI from a prestored mapping table based on the modulation order, the code rate, or the spectral efficiency that actually needs to be used to send data.

Similarly, the mapping table includes the mapping relationship between a CQI index and a modulation order, a code rate, or spectral efficiency.

250. The network device sends second indication information to the terminal device, and the terminal device receives the second indication information from the network device.

The second indication information indicates the index of the target CQI.

260. The terminal device determines, from the mapping table based on the index of the target CQI, at least one of a modulation order, a code rate, and a coding scheme that are corresponding to the index of the target CQI. Subsequently, the terminal device processes received data based on the determined modulation order, code rate, and/or coding scheme.

It may be understood that the target CQI may be the same as or different from the reference CQI. The network device may determine, based on a current network resource status, the modulation order, the code rate, or the spectral efficiency that actually needs to be used to send data, to select, from the mapping table, the index of the target CQI corresponding to the modulation order, the code rate, or the spectral efficiency that actually needs to be used. Alternatively, the network device may select the index of the target CQI with reference to a current network resource status and the index of the reference CQI. Finally, the network device notifies the terminal device of the selected index of the target CQI by using the second indication information. According to the method in this embodiment of this application, before sending data, the network device makes reference to the current channel quality, so that data transmission reliability can be improved.

Actually, the mapping table is applied to uplink data sending according to a similar principle, except that the terminal device does not need to feed back an index of a reference CQI. The network device may directly determine, based on an uplink channel, at least one of a modulation order, a code rate, and a coding scheme that are used in uplink, determine, according to the mapping table, an index of a target CQI for uplink data sending, and send the index to the terminal device by using indication information. The terminal device may determine, based on the received index of the target CQI and the mapping table, a modulation order, a code rate, or a coding scheme that is corresponding to the received index of the target CQI, and process to-be-sent uplink data based on the determined modulation order, code rate, and/or coding scheme.

Currently, as a next-generation wireless communication technology, 5G has gained extensive attention and is widely researched by the 3GPP and other international organizations for standardization. 5G can meet a customization requirement of an operator on various industries, vertical industries, and virtual operation services. Three application scenarios of 5G include enhanced mobile broadband (eMBB), ultra-reliable and low latency communications (URLLC), and massive machine type communications (mMTC). A target BLER in the URLLC scenario is accepted to be less than 10%, and needs to be at least $10^{-5}$ or even lower. Considering that the URLLC scenario includes a plurality of different use cases, BLER requirements in different use cases are different and have a relatively large span. It is not proper to design only one CQI table. For example, if a same CQI table is used for data transmission in a plurality of use cases, BLERs may be unable to be ensured in some use cases, while BLERs are excessively strict and are not necessary in some use cases.

For this, further, this application proposes a CQI table design scheme, to design a CQI table that meets different BLER requirements. In use cases with different BLER requirements, the data transmission reliability can be ensured to some extent.

The following describes in detail CQI tables designed in this application.

BLERs required in different use cases are referred to as target BLERs below. In view of a plurality of feasible forms of CQI tables provided in this specification, for clarity, the CQI tables are described one by one based on coding schemes in the CQI tables. In each coding scheme, some forms of CQI tables are provided depending on a target BLER and limitations of a system on a code rate.

The coding schemes in the CQI tables provided in the following include: Polar, LDPC BG1, and LDPC BG2. As is known from the descriptions above, the BG1 and the BG2 represent two different base graphs. Therefore, the LDPC BG1 represents LDPC obtained based on the base graph BG1. The LDPC BG2 represents LDPC obtained based on the base graph BG2. For description of the BG1 and the BG2, refer to the document 3GPP TS 38.212.V15.0.0 (2017-12).

The limitations of the system on the code rate below include: no limitation on a code rate, limitation on a minimum code rate without limitation on a maximum code rate, limitation on a highest code rate without limitation on a lowest code rate, limitations on both a lowest code rate and a highest code rate.

The following provides the CQI tables designed in this application.

For brevity, the CQI index is denoted as an index below. SE represents spectral efficiency, CR represents a code rate, Mod represents a modulation scheme (namely, a modulation order), and Code represents a used coding scheme.

It should be noted that a CR in each table in this specification is not an actual code rate, and an actual code rate should be a value of a CR in the table divided by 1024. This is also common practice in the industry.

1. A coding scheme relates to only the polar code.
1.1 No limitation on a code rate.
1.1.1 Target BLER=$10^{-1}$

TABLE 1

| Index | SE | CR | Mod | Code |
|---|---|---|---|---|
| 0 | — | — | — | — |
| 1 | 0.0684 | 35 | 2 | Polar |
| 2 | 0.1113 | 57 | 2 | Polar |
| 3 | 0.1875 | 96 | 2 | Polar |
| 4 | 0.3008 | 154 | 2 | Polar |
| 5 | 0.4863 | 249 | 2 | Polar |
| 6 | 0.752 | 385 | 2 | Polar |
| 7 | 1.0996 | 563 | 2 | Polar |
| 8 | 1.4785 | 757 | 2 | Polar |
| 9 | 1.9688 | 504 | 4 | Polar |
| 10 | 2.5547 | 654 | 4 | Polar |
| 11 | 3.1563 | 808 | 4 | Polar |
| 12 | 3.75 | 640 | 6 | Polar |
| 13 | 4.4824 | 765 | 6 | Polar |
| 14 | 5.1797 | 884 | 6 | Polar |
| 15 | 5.7012 | 973 | 6 | Polar |

Table 1 is used to provide an example of selecting a CQI index based on SE and a CR. This is applicable to all tables in this specification. For example, SE=0.07 is obtained based on channel quality or by using another calculation method, and then a CQI index corresponding to an SE value that is less than or equal to 0.07 and that is closest to 0.07 is selected from Table 1, that is, the corresponding CQI index is 1. For another example, CR=60 is obtained based on channel quality or by using another calculation method, and then a CQI index corresponding to a CR value that is less than or equal to 60 and that is closest to 60 is selected from Table 1, that is, the corresponding CQI index is 2. In this embodiment of this application, the terminal device selects the index of the reference CQI according to this rule, or the network device selects the index of the target CQI according to this rule.

1.1.2 Target BLER=$10^{-2}$

TABLE 2

| Index | SE | CR | Mod | Code |
|---|---|---|---|---|
| 0 | — | — | — | — |
| 1 | 0.0684 | 35 | 2 | Polar |
| 2 | 0.1133 | 58 | 2 | Polar |
| 3 | 0.1953 | 100 | 2 | Polar |
| 4 | 0.3223 | 165 | 2 | Polar |
| 5 | 0.5215 | 267 | 2 | Polar |
| 6 | 0.8027 | 411 | 2 | Polar |
| 7 | 1.1602 | 594 | 2 | Polar |
| 8 | 1.5313 | 784 | 2 | Polar |
| 9 | 2.043 | 523 | 4 | Polar |
| 10 | 2.6289 | 673 | 4 | Polar |
| 11 | 3.2188 | 824 | 4 | Polar |
| 12 | 3.791 | 647 | 6 | Polar |
| 13 | 4.5234 | 772 | 6 | Polar |
| 14 | 5.2031 | 888 | 6 | Polar |
| 15 | 5.707 | 974 | 6 | Polar |

1.1.3 Target BLER=$10^{-3}$

TABLE 3

| Index | SE | CR | Mod | Code |
|---|---|---|---|---|
| 0 | — | — | — | — |
| 1 | 0.0703 | 36 | 2 | Polar |
| 2 | 0.1172 | 60 | 2 | Polar |
| 3 | 0.2031 | 104 | 2 | Polar |
| 4 | 0.3379 | 173 | 2 | Polar |
| 5 | 0.5508 | 282 | 2 | Polar |
| 6 | 0.8418 | 431 | 2 | Polar |
| 7 | 1.2051 | 617 | 2 | Polar |
| 8 | 1.5703 | 804 | 2 | Polar |
| 9 | 2.0938 | 536 | 4 | Polar |
| 10 | 2.6836 | 687 | 4 | Polar |
| 11 | 3.2656 | 836 | 4 | Polar |
| 12 | 3.8203 | 652 | 6 | Polar |
| 13 | 4.5469 | 776 | 6 | Polar |
| 14 | 5.2207 | 891 | 6 | Polar |
| 15 | 5.707 | 974 | 6 | Polar |

1.1.4 Target BLER=$10^{-4}$

TABLE 4

| Index | SE | CR | Mod | Code |
|---|---|---|---|---|
| 0 | — | — | — | — |
| 1 | 0.0703 | 36 | 2 | Polar |
| 2 | 0.1211 | 62 | 2 | Polar |
| 3 | 0.209 | 107 | 2 | Polar |
| 4 | 0.3516 | 180 | 2 | Polar |
| 5 | 0.5723 | 293 | 2 | Polar |
| 6 | 0.873 | 447 | 2 | Polar |
| 7 | 1.2402 | 635 | 2 | Polar |
| 8 | 1.5977 | 818 | 2 | Polar |
| 9 | 2.1289 | 545 | 4 | Polar |
| 10 | 2.7227 | 697 | 4 | Polar |
| 11 | 3.2969 | 844 | 4 | Polar |
| 12 | 3.8438 | 656 | 6 | Polar |
| 13 | 4.5645 | 779 | 6 | Polar |
| 14 | 5.2266 | 892 | 6 | Polar |
| 15 | 5.707 | 974 | 6 | Polar |

1.1.5 Target BLER=$10^{-5}$

TABLE 5

| Index | SE | CR | Mod | Code |
|---|---|---|---|---|
| 0 | — | — | — | — |
| 1 | 0.0703 | 36 | 2 | Polar |
| 2 | 0.123 | 63 | 2 | Polar |
| 3 | 0.2129 | 109 | 2 | Polar |
| 4 | 0.3633 | 186 | 2 | Polar |
| 5 | 0.5879 | 301 | 2 | Polar |
| 6 | 0.8984 | 460 | 2 | Polar |
| 7 | 1.2656 | 648 | 2 | Polar |
| 8 | 1.6191 | 829 | 2 | Polar |
| 9 | 2.1602 | 553 | 4 | Polar |
| 10 | 2.7539 | 705 | 4 | Polar |
| 11 | 3.3242 | 851 | 4 | Polar |
| 12 | 3.8555 | 658 | 6 | Polar |
| 13 | 4.5762 | 781 | 6 | Polar |
| 14 | 5.2383 | 894 | 6 | Polar |
| 15 | 5.707 | 974 | 6 | Polar |

1.1.6 Target BLER=$10^{-6}$

TABLE 6

| Index | SE | CR | Mod | Code |
|---|---|---|---|---|
| 0 | — | — | — | — |
| 1 | 0.0703 | 36 | 2 | Polar |
| 2 | 0.125 | 64 | 2 | Polar |
| 3 | 0.2168 | 111 | 2 | Polar |
| 4 | 0.3711 | 190 | 2 | Polar |
| 5 | 0.6016 | 308 | 2 | Polar |
| 6 | 0.918 | 470 | 2 | Polar |
| 7 | 1.2852 | 658 | 2 | Polar |
| 8 | 1.6328 | 418 | 4 | Polar |
| 9 | 2.1836 | 559 | 4 | Polar |
| 10 | 2.7773 | 711 | 4 | Polar |
| 11 | 3.3438 | 856 | 4 | Polar |
| 12 | 3.8672 | 660 | 6 | Polar |
| 13 | 4.5879 | 783 | 6 | Polar |
| 14 | 5.2441 | 895 | 6 | Polar |
| 15 | 5.707 | 974 | 6 | Polar |

1.2 Minimum code rate $R_{min}$=40/1024, and no limitation on a maximum code rate 1.2.1 Target BLER=$10^{-1}$

TABLE 7

| Index | SE | CR | Mod | Code |
|---|---|---|---|---|
| 0 | — | — | — | — |
| 1 | 0.0781 | 40 | 2 | Polar |
| 2 | 0.123 | 63 | 2 | Polar |
| 3 | 0.2031 | 104 | 2 | Polar |
| 4 | 0.3262 | 167 | 2 | Polar |
| 5 | 0.5195 | 266 | 2 | Polar |
| 6 | 0.793 | 406 | 2 | Polar |
| 7 | 1.1426 | 585 | 2 | Polar |
| 8 | 1.5156 | 776 | 2 | Polar |
| 9 | 2.0195 | 517 | 4 | Polar |
| 10 | 2.6016 | 666 | 4 | Polar |
| 11 | 3.1914 | 817 | 4 | Polar |
| 12 | 3.7793 | 645 | 6 | Polar |

TABLE 7-continued

| Index | SE | CR | Mod | Code |
|---|---|---|---|---|
| 13 | 4.5059 | 769 | 6 | Polar |
| 14 | 5.1914 | 886 | 6 | Polar |
| 15 | 5.7012 | 973 | 6 | Polar |

1.2.2 Target BLER=$10^{-2}$

TABLE 8

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.2129 | 109 | 2 | Polar |
| 4 | 0.3477 | 178 | 2 | Polar |
| 5 | 0.5566 | 285 | 2 | Polar |
| 6 | 0.8438 | 432 | 2 | Polar |
| 7 | 1.2031 | 616 | 2 | Polar |
| 8 | 1.5645 | 801 | 2 | Polar |
| 9 | 2.0898 | 535 | 4 | Polar |
| 10 | 2.6719 | 684 | 4 | Polar |
| 11 | 3.25 | 832 | 4 | Polar |
| 12 | 3.8203 | 652 | 6 | Polar |
| 13 | 4.541 | 775 | 6 | Polar |
| 14 | 5.209 | 889 | 6 | Polar |
| 15 | 5.707 | 974 | 6 | Polar |

1.2.3 Target BLER=$10^{-3}$

TABLE 9

| Index | SE | CR | Mod | Code |
|---|---|---|---|---|
| 0 | — | — | — | — |
| 1 | 0.0781 | 40 | 2 | Polar |
| 2 | 0.1367 | 70 | 2 | Polar |
| 3 | 0.2285 | 117 | 2 | Polar |
| 4 | 0.377 | 193 | 2 | Polar |
| 5 | 0.5996 | 307 | 2 | Polar |
| 6 | 0.9004 | 461 | 2 | Polar |
| 7 | 1.2637 | 647 | 2 | Polar |
| 8 | 1.6152 | 827 | 2 | Polar |
| 9 | 2.1563 | 552 | 4 | Polar |
| 10 | 2.7422 | 702 | 4 | Polar |
| 11 | 3.3047 | 846 | 4 | Polar |
| 12 | 3.8613 | 659 | 6 | Polar |
| 13 | 4.5762 | 781 | 6 | Polar |
| 14 | 5.2324 | 893 | 6 | Polar |
| 15 | 5.707 | 974 | 6 | Polar |

1.2.4 Target BLER=$10^{-4}$

TABLE 10

| Index | SE | CR | Mod | Code |
|---|---|---|---|---|
| 0 | — | — | — | — |
| 1 | 0.0781 | 40 | 2 | Polar |
| 2 | 0.1406 | 72 | 2 | Polar |
| 3 | 0.2344 | 120 | 2 | Polar |
| 4 | 0.3906 | 200 | 2 | Polar |
| 5 | 0.623 | 319 | 2 | Polar |
| 6 | 0.9336 | 478 | 2 | Polar |
| 7 | 1.2969 | 664 | 2 | Polar |
| 8 | 1.6523 | 423 | 4 | Polar |
| 9 | 2.1953 | 562 | 4 | Polar |
| 10 | 2.7813 | 712 | 4 | Polar |
| 11 | 3.3398 | 855 | 4 | Polar |

TABLE 10-continued

| Index | SE | CR | Mod | Code |
|---|---|---|---|---|
| 12 | 3.8848 | 663 | 6 | Polar |
| 13 | 4.5879 | 783 | 6 | Polar |
| 14 | 5.2383 | 894 | 6 | Polar |
| 15 | 5.707 | 974 | 6 | Polar |

1.2.5 Target BLER=$10^{-5}$

TABLE 11

| Index | SE | CR | Mod | Code |
|---|---|---|---|---|
| 0 | — | — | — | — |
| 1 | 0.0781 | 40 | 2 | Polar |
| 2 | 0.1445 | 74 | 2 | Polar |
| 3 | 0.2461 | 126 | 2 | Polar |
| 4 | 0.4102 | 210 | 2 | Polar |
| 5 | 0.6504 | 333 | 2 | Polar |
| 6 | 0.9688 | 496 | 2 | Polar |
| 7 | 1.332 | 682 | 2 | Polar |
| 8 | 1.6914 | 433 | 4 | Polar |
| 9 | 2.2344 | 572 | 4 | Polar |
| 10 | 2.8203 | 722 | 4 | Polar |
| 11 | 3.3711 | 863 | 4 | Polar |
| 12 | 3.9082 | 667 | 6 | Polar |
| 13 | 4.6113 | 787 | 6 | Polar |
| 14 | 5.25 | 896 | 6 | Polar |
| 15 | 5.707 | 974 | 6 | Polar |

1.2.6 Target BLER=$10^{-6}$

TABLE 12

| Index | SE | CR | Mod | Code |
|---|---|---|---|---|
| 0 | — | — | — | — |
| 1 | 0.0781 | 40 | 2 | Polar |
| 2 | 0.1484 | 76 | 2 | Polar |
| 3 | 0.2539 | 130 | 2 | Polar |
| 4 | 0.4219 | 216 | 2 | Polar |
| 5 | 0.668 | 342 | 2 | Polar |
| 6 | 0.9922 | 508 | 2 | Polar |
| 7 | 1.3555 | 694 | 2 | Polar |
| 8 | 1.7188 | 440 | 4 | Polar |
| 9 | 2.2656 | 580 | 4 | Polar |
| 10 | 2.8477 | 729 | 4 | Polar |
| 11 | 3.3867 | 867 | 4 | Polar |
| 12 | 3.9199 | 669 | 6 | Polar |
| 13 | 4.623 | 789 | 6 | Polar |
| 14 | 5.2559 | 897 | 6 | Polar |
| 15 | 5.707 | 974 | 6 | Polar |

1.3 No limitation on a minimum code rate, and a maximum code rate $R_{max}=2/3$ 1.3.1 Target BLER=$10^{-1}$

TABLE 13

| Index | SE | CR | Mod | Code |
|---|---|---|---|---|
| 0 | — | — | — | — |
| 1 | 0.0684 | 35 | 2 | Polar |
| 2 | 0.0996 | 51 | 2 | Polar |
| 3 | 0.1543 | 79 | 2 | Polar |
| 4 | 0.2285 | 117 | 2 | Polar |
| 5 | 0.3398 | 174 | 2 | Polar |
| 6 | 0.498 | 255 | 2 | Polar |
| 7 | 0.709 | 363 | 2 | Polar |
| 8 | 0.9766 | 500 | 2 | Polar |
| 9 | 1.2832 | 657 | 2 | Polar |
| 10 | 1.582 | 810 | 2 | Polar |
| 11 | 2.0273 | 519 | 4 | Polar |
| 12 | 2.5039 | 641 | 4 | Polar |
| 13 | 2.9961 | 767 | 4 | Polar |

TABLE 13-continued

| Index | SE | CR | Mod | Code |
|---|---|---|---|---|
| 14 | 3.4492 | 883 | 4 | Polar |
| 15 | 4.002 | 683 | 6 | Polar |

1.3.2 Target BLER=$10^{-2}$

TABLE 14

| Index | SE | CR | Mod | Code |
|---|---|---|---|---|
| 0 | — | — | — | — |
| 1 | 0.0684 | 35 | 2 | Polar |
| 2 | 0.1016 | 52 | 2 | Polar |
| 3 | 0.1621 | 83 | 2 | Polar |
| 4 | 0.2402 | 123 | 2 | Polar |
| 5 | 0.3594 | 184 | 2 | Polar |
| 6 | 0.5293 | 271 | 2 | Polar |
| 7 | 0.752 | 385 | 2 | Polar |
| 8 | 1.0273 | 526 | 2 | Polar |
| 9 | 1.3301 | 681 | 2 | Polar |
| 10 | 1.6289 | 417 | 4 | Polar |
| 11 | 2.0781 | 532 | 4 | Polar |
| 12 | 2.5508 | 653 | 4 | Polar |
| 13 | 3.0352 | 777 | 4 | Polar |
| 14 | 3.4727 | 889 | 4 | Polar |
| 15 | 4.002 | 683 | 6 | Polar |

1.3.3 Target BLER=$10^{-3}$

TABLE 15

| Index | SE | CR | Mod | Code |
|---|---|---|---|---|
| 0 | — | — | — | — |
| 1 | 0.0703 | 36 | 2 | Polar |
| 2 | 0.1055 | 54 | 2 | Polar |
| 3 | 0.166 | 85 | 2 | Polar |
| 4 | 0.25 | 128 | 2 | Polar |
| 5 | 0.377 | 193 | 2 | Polar |
| 6 | 0.5547 | 284 | 2 | Polar |
| 7 | 0.7832 | 401 | 2 | Polar |
| 8 | 1.0645 | 545 | 2 | Polar |
| 9 | 1.3672 | 700 | 2 | Polar |
| 10 | 1.6641 | 426 | 4 | Polar |
| 11 | 2.1133 | 541 | 4 | Polar |
| 12 | 2.5859 | 662 | 4 | Polar |
| 13 | 3.0625 | 784 | 4 | Polar |
| 14 | 3.4922 | 894 | 4 | Polar |
| 15 | 3.9961 | 682 | 6 | Polar |

1.3.4 Target BLER=$10^{-4}$

TABLE 16

| Index | SE | CR | Mod | Code |
|---|---|---|---|---|
| 0 | — | — | — | — |
| 1 | 0.0703 | 36 | 2 | Polar |
| 2 | 0.1074 | 55 | 2 | Polar |
| 3 | 0.1699 | 87 | 2 | Polar |
| 4 | 0.2578 | 132 | 2 | Polar |
| 5 | 0.3906 | 200 | 2 | Polar |
| 6 | 0.5742 | 294 | 2 | Polar |
| 7 | 0.8086 | 414 | 2 | Polar |
| 8 | 1.0938 | 560 | 2 | Polar |
| 9 | 1.3926 | 713 | 2 | Polar |
| 10 | 1.6953 | 434 | 4 | Polar |
| 11 | 2.1406 | 548 | 4 | Polar |

TABLE 16-continued

| Index | SE | CR | Mod | Code |
|---|---|---|---|---|
| 12 | 2.6133 | 669 | 4 | Polar |
| 13 | 3.0859 | 790 | 4 | Polar |
| 14 | 3.5078 | 898 | 4 | Polar |
| 15 | 4.002 | 683 | 6 | Polar |

1.3.5 Target BLER=$10^{-5}$

TABLE 17

| Index | SE | CR | Mod | Code |
|---|---|---|---|---|
| 0 | — | — | — | — |
| 1 | 0.0703 | 36 | 2 | Polar |
| 2 | 0.1094 | 56 | 2 | Polar |
| 3 | 0.1719 | 88 | 2 | Polar |
| 4 | 0.2637 | 135 | 2 | Polar |
| 5 | 0.4004 | 205 | 2 | Polar |
| 6 | 0.5879 | 301 | 2 | Polar |
| 7 | 0.8301 | 425 | 2 | Polar |
| 8 | 1.1152 | 571 | 2 | Polar |
| 9 | 1.4141 | 724 | 2 | Polar |
| 10 | 1.7148 | 439 | 4 | Polar |
| 11 | 2.1602 | 553 | 4 | Polar |
| 12 | 2.6328 | 674 | 4 | Polar |
| 13 | 3.1055 | 795 | 4 | Polar |
| 14 | 3.5156 | 900 | 4 | Polar |
| 15 | 4.002 | 683 | 6 | Polar |

1.3.6 Target BLER=$10^{-6}$

TABLE 18

| Index | SE | CR | Mod | Code |
|---|---|---|---|---|
| 0 | — | — | — | — |
| 1 | 0.0703 | 36 | 2 | Polar |
| 2 | 0.1113 | 57 | 2 | Polar |
| 3 | 0.1738 | 89 | 2 | Polar |
| 4 | 0.2695 | 138 | 2 | Polar |
| 5 | 0.4102 | 210 | 2 | Polar |
| 6 | 0.6016 | 308 | 2 | Polar |
| 7 | 0.8457 | 433 | 2 | Polar |
| 8 | 1.1328 | 580 | 2 | Polar |
| 9 | 1.4297 | 732 | 2 | Polar |
| 10 | 1.7344 | 444 | 4 | Polar |
| 11 | 2.1758 | 557 | 4 | Polar |
| 12 | 2.6484 | 678 | 4 | Polar |
| 13 | 3.1211 | 799 | 4 | Polar |
| 14 | 3.5234 | 902 | 4 | Polar |
| 15 | 3.9961 | 682 | 6 | Polar |

1.4 Minimum code rate $R_{min}$=40/1024, and maximum code rate $R_{max}$=2/3

1.4.1 Target BLER=$10^{-1}$

TABLE 19

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.1699 | 87 | 2 | Polar |
| 4 | 0.248 | 127 | 2 | Polar |
| 5 | 0.3652 | 187 | 2 | Polar |
| 6 | 0.5293 | 271 | 2 | Polar |
| 7 | 0.7441 | 381 | 2 | Polar |
| 8 | 1.0156 | 520 | 2 | Polar |
| 9 | 1.3164 | 674 | 2 | Polar |
| 10 | 1.6172 | 414 | 4 | Polar |

TABLE 19-continued

| Index | SE | CR | Mod | Code |
|---|---|---|---|---|
| 11 | 2.0625 | 528 | 4 | Polar |
| 12 | 2.5313 | 648 | 4 | Polar |
| 13 | 3.0156 | 772 | 4 | Polar |
| 14 | 3.457 | 885 | 4 | Polar |
| 15 | 4.002 | 683 | 6 | Polar |

1.4.2 Target BLER=$10^{-2}$

TABLE 20

| Index | SE | CR | Mod | Code |
|---|---|---|---|---|
| 0 | — | — | — | — |
| 1 | 0.0781 | 40 | 2 | Polar |
| 2 | 0.1133 | 58 | 2 | Polar |
| 3 | 0.1758 | 90 | 2 | Polar |
| 4 | 0.2598 | 133 | 2 | Polar |
| 5 | 0.3848 | 197 | 2 | Polar |
| 6 | 0.5605 | 287 | 2 | Polar |
| 7 | 0.7852 | 402 | 2 | Polar |
| 8 | 1.0625 | 544 | 2 | Polar |
| 9 | 1.3613 | 697 | 2 | Polar |
| 10 | 1.668 | 427 | 4 | Polar |
| 11 | 2.1094 | 540 | 4 | Polar |
| 12 | 2.5742 | 659 | 4 | Polar |
| 13 | 3.0508 | 781 | 4 | Polar |
| 14 | 3.4805 | 891 | 4 | Polar |
| 15 | 4.002 | 683 | 6 | Polar |

1.4.3 Target BLER=$10^{-3}$

TABLE 21

| Index | SE | CR | Mod | Code |
|---|---|---|---|---|
| 0 | — | — | — | — |
| 1 | 0.0781 | 40 | 2 | Polar |
| 2 | 0.1211 | 62 | 2 | Polar |
| 3 | 0.1855 | 95 | 2 | Polar |
| 4 | 0.2793 | 143 | 2 | Polar |
| 5 | 0.4141 | 212 | 2 | Polar |
| 6 | 0.5996 | 307 | 2 | Polar |
| 7 | 0.834 | 427 | 2 | Polar |
| 8 | 1.1133 | 570 | 2 | Polar |
| 9 | 1.4082 | 721 | 2 | Polar |
| 10 | 1.7148 | 439 | 4 | Polar |
| 11 | 2.1563 | 552 | 4 | Polar |
| 12 | 2.6172 | 670 | 4 | Polar |
| 13 | 3.0859 | 790 | 4 | Polar |
| 14 | 3.5039 | 897 | 4 | Polar |
| 15 | 3.9961 | 682 | 6 | Polar |

1.4.4 Target BLER=$10^{-4}$

TABLE 22

| Index | SE | CR | Mod | Code |
|---|---|---|---|---|
| 0 | — | — | — | — |
| 1 | 0.0781 | 40 | 2 | Polar |
| 2 | 0.125 | 64 | 2 | Polar |
| 3 | 0.1914 | 98 | 2 | Polar |
| 4 | 0.2871 | 147 | 2 | Polar |
| 5 | 0.4297 | 220 | 2 | Polar |
| 6 | 0.6191 | 317 | 2 | Polar |
| 7 | 0.8594 | 440 | 2 | Polar |
| 8 | 1.1426 | 585 | 2 | Polar |
| 9 | 1.4355 | 735 | 2 | Polar |
| 10 | 1.7461 | 447 | 4 | Polar |
| 11 | 2.1836 | 559 | 4 | Polar |
| 12 | 2.6445 | 677 | 4 | Polar |

TABLE 22-continued

| Index | SE | CR | Mod | Code |
|---|---|---|---|---|
| 13 | 3.1094 | 796 | 4 | Polar |
| 14 | 3.5156 | 900 | 4 | Polar |
| 15 | 4.002 | 683 | 6 | Polar |

1.4.5 Target BLER=$10^{-5}$

TABLE 23

| Index | SE | CR | Mod | Code |
|---|---|---|---|---|
| 0 | — | — | — | — |
| 1 | 0.0781 | 40 | 2 | Polar |
| 2 | 0.1289 | 66 | 2 | Polar |
| 3 | 0.1973 | 101 | 2 | Polar |
| 4 | 0.3008 | 154 | 2 | Polar |
| 5 | 0.4473 | 229 | 2 | Polar |
| 6 | 0.6426 | 329 | 2 | Polar |
| 7 | 0.8887 | 455 | 2 | Polar |
| 8 | 1.1738 | 601 | 2 | Polar |
| 9 | 1.4609 | 748 | 2 | Polar |
| 10 | 1.7734 | 454 | 4 | Polar |
| 11 | 2.2109 | 566 | 4 | Polar |
| 12 | 2.6719 | 684 | 4 | Polar |
| 13 | 3.1289 | 801 | 4 | Polar |
| 14 | 3.5273 | 903 | 4 | Polar |
| 15 | 4.002 | 683 | 6 | Polar |

1.4.6 Target BLER=$10^{-6}$

TABLE 24

| Index | SE | CR | Mod | Code |
|---|---|---|---|---|
| 0 | — | — | — | — |
| 1 | 0.0781 | 40 | 2 | Polar |
| 2 | 0.1328 | 68 | 2 | Polar |
| 3 | 0.2031 | 104 | 2 | Polar |
| 4 | 0.3105 | 159 | 2 | Polar |
| 5 | 0.4609 | 236 | 2 | Polar |
| 6 | 0.6602 | 338 | 2 | Polar |
| 7 | 0.9102 | 466 | 2 | Polar |
| 8 | 1.1934 | 611 | 2 | Polar |
| 9 | 1.4785 | 757 | 2 | Polar |
| 10 | 1.7969 | 460 | 4 | Polar |
| 11 | 2.2305 | 571 | 4 | Polar |
| 12 | 2.6914 | 689 | 4 | Polar |
| 13 | 3.1445 | 805 | 4 | Polar |
| 14 | 3.5313 | 904 | 4 | Polar |
| 15 | 3.9961 | 682 | 6 | Polar |

2. A coding scheme relates to only the LDPC BG2.
2.1 No limitation on a code rate.
2.1.1 Target BLER=$10^{-1}$

TABLE 25

| Index | SE | CR | Mod | Code |
|---|---|---|---|---|
| 0 | — | — | — | — |
| 1 | 0.0703 | 36 | 2 | LDPC BG2 |
| 2 | 0.127 | 65 | 2 | LDPC BG2 |
| 3 | 0.2266 | 116 | 2 | LDPC BG2 |
| 4 | 0.4004 | 205 | 2 | LDPC BG2 |
| 5 | 0.6543 | 335 | 2 | LDPC BG2 |
| 6 | 0.9922 | 508 | 2 | LDPC BG2 |
| 7 | 1.375 | 704 | 2 | LDPC BG2 |
| 8 | 1.8086 | 463 | 4 | LDPC BG2 |
| 9 | 2.4063 | 616 | 4 | LDPC BG2 |
| 10 | 3 | 768 | 4 | LDPC BG2 |
| 11 | 3.5391 | 604 | 6 | LDPC BG2 |

TABLE 25-continued

| Index | SE | CR | Mod | Code |
|---|---|---|---|---|
| 12 | 4.2773 | 730 | 6 | LDPC BG2 |
| 13 | 4.9336 | 842 | 6 | LDPC BG2 |
| 14 | 5.4551 | 931 | 6 | LDPC BG2 |
| 15 | 5.707 | 974 | 6 | LDPC BG2 |

2.1.2 Target BLER=$10^{-2}$

TABLE 26

| Index | SE | CR | Mod | Code |
|---|---|---|---|---|
| 0 | — | — | — | — |
| 1 | 0.0703 | 36 | 2 | LDPC BG2 |
| 2 | 0.1328 | 68 | 2 | LDPC BG2 |
| 3 | 0.2441 | 125 | 2 | LDPC BG2 |
| 4 | 0.4277 | 219 | 2 | LDPC BG2 |
| 5 | 0.6973 | 357 | 2 | LDPC BG2 |
| 6 | 1.0469 | 536 | 2 | LDPC BG2 |
| 7 | 1.4238 | 729 | 2 | LDPC BG2 |
| 8 | 1.8828 | 482 | 4 | LDPC BG2 |
| 9 | 2.4766 | 634 | 4 | LDPC BG2 |
| 10 | 3.0547 | 782 | 4 | LDPC BG2 |
| 11 | 3.5977 | 614 | 6 | LDPC BG2 |
| 12 | 4.3184 | 737 | 6 | LDPC BG2 |
| 13 | 4.9512 | 845 | 6 | LDPC BG2 |
| 14 | 5.4609 | 932 | 6 | LDPC BG2 |
| 15 | 5.707 | 974 | 6 | LDPC BG2 |

2.1.3 Target BLER=$10^{-3}$

TABLE 27

| Index | SE | CR | Mod | Code |
|---|---|---|---|---|
| 0 | — | — | — | — |
| 1 | 0.0684 | 35 | 2 | LDPC BG2 |
| 2 | 0.1367 | 70 | 2 | LDPC BG2 |
| 3 | 0.2617 | 134 | 2 | LDPC BG2 |
| 4 | 0.4551 | 233 | 2 | LDPC BG2 |
| 5 | 0.7383 | 378 | 2 | LDPC BG2 |
| 6 | 1.0957 | 561 | 2 | LDPC BG2 |
| 7 | 1.4629 | 749 | 2 | LDPC BG2 |
| 8 | 1.9492 | 499 | 4 | LDPC BG2 |
| 9 | 2.5391 | 650 | 4 | LDPC BG2 |
| 10 | 3.0898 | 791 | 4 | LDPC BG2 |
| 11 | 3.6445 | 622 | 6 | LDPC BG2 |
| 12 | 4.3535 | 743 | 6 | LDPC BG2 |
| 13 | 4.9688 | 848 | 6 | LDPC BG2 |
| 14 | 5.4727 | 934 | 6 | LDPC BG2 |
| 15 | 5.707 | 974 | 6 | LDPC BG2 |

2.1.4 Target BLER=$10^{-4}$

TABLE 28

| Index | SE | CR | Mod | Code |
|---|---|---|---|---|
| 0 | — | — | — | — |
| 1 | 0.0684 | 35 | 2 | LDPC BG2 |
| 2 | 0.1445 | 74 | 2 | LDPC BG2 |
| 3 | 0.2793 | 143 | 2 | LDPC BG2 |
| 4 | 0.4844 | 248 | 2 | LDPC BG2 |
| 5 | 0.7813 | 400 | 2 | LDPC BG2 |
| 6 | 1.1484 | 588 | 2 | LDPC BG2 |
| 7 | 1.4922 | 764 | 2 | LDPC BG2 |
| 8 | 2.0273 | 519 | 4 | LDPC BG2 |
| 9 | 2.6133 | 669 | 4 | LDPC BG2 |
| 10 | 3.0742 | 787 | 4 | LDPC BG2 |
| 11 | 3.709 | 633 | 6 | LDPC BG2 |

TABLE 28-continued

| Index | SE | CR | Mod | Code |
|---|---|---|---|---|
| 12 | 4.3535 | 743 | 6 | LDPC BG2 |
| 13 | 4.9922 | 852 | 6 | LDPC BG2 |
| 14 | 5.4961 | 938 | 6 | LDPC BG2 |
| 15 | 5.707 | 974 | 6 | LDPC BG2 |

2.1.5 Target BLER=$10^{-5}$

TABLE 29

| Index | SE | CR | Mod | Code |
|---|---|---|---|---|
| 0 | — | — | — | — |
| 1 | 0.0684 | 35 | 2 | LDPC BG2 |
| 2 | 0.1543 | 79 | 2 | LDPC BG2 |
| 3 | 0.3027 | 155 | 2 | LDPC BG2 |
| 4 | 0.5195 | 266 | 2 | LDPC BG2 |
| 5 | 0.834 | 427 | 2 | LDPC BG2 |
| 6 | 1.209 | 619 | 2 | LDPC BG2 |
| 7 | 1.5625 | 400 | 4 | LDPC BG2 |
| 8 | 2.1445 | 549 | 4 | LDPC BG2 |
| 9 | 2.6953 | 690 | 4 | LDPC BG2 |
| 10 | 3.0586 | 783 | 4 | LDPC BG2 |
| 11 | 3.832 | 654 | 6 | LDPC BG2 |
| 12 | 4.3301 | 739 | 6 | LDPC BG2 |
| 13 | 4.9805 | 850 | 6 | LDPC BG2 |
| 14 | 5.5195 | 942 | 6 | LDPC BG2 |
| 15 | 5.7129 | 975 | 6 | LDPC BG2 |

2.1.6 Target BLER=$10^{-6}$

TABLE 30

| Index | SE | CR | Mod | Code |
|---|---|---|---|---|
| 0 | — | — | — | — |
| 1 | 0.0664 | 34 | 2 | LDPC BG2 |
| 2 | 0.1699 | 87 | 2 | LDPC BG2 |
| 3 | 0.332 | 170 | 2 | LDPC BG2 |
| 4 | 0.5586 | 286 | 2 | LDPC BG2 |
| 5 | 0.8809 | 451 | 2 | LDPC BG2 |
| 6 | 1.2539 | 642 | 2 | LDPC BG2 |
| 7 | 1.5977 | 409 | 4 | LDPC BG2 |
| 8 | 2.2188 | 568 | 4 | LDPC BG2 |
| 9 | 2.7148 | 695 | 4 | LDPC BG2 |
| 10 | 3.0664 | 785 | 4 | LDPC BG2 |
| 11 | 3.8203 | 652 | 6 | LDPC BG2 |
| 12 | 4.3301 | 739 | 6 | LDPC BG2 |
| 13 | 4.9629 | 847 | 6 | LDPC BG2 |
| 14 | 5.5137 | 941 | 6 | LDPC BG2 |
| 15 | 5.7363 | 979 | 6 | LDPC BG2 |

2.2 Minimum code rate $R_{min}$=40/1024, and no limitation on a maximum code rate 2.2.1 Target BLER=$10^{-1}$

TABLE 31

| Index | SE | CR | Mod | Code |
|---|---|---|---|---|
| 0 | — | — | — | — |
| 1 | 0.0781 | 40 | 2 | LDPC BG2 |
| 2 | 0.1406 | 72 | 2 | LDPC BG2 |
| 3 | 0.25 | 128 | 2 | LDPC BG2 |
| 4 | 0.4316 | 221 | 2 | LDPC BG2 |
| 5 | 0.6953 | 356 | 2 | LDPC BG2 |
| 6 | 1.0352 | 530 | 2 | LDPC BG2 |
| 7 | 1.4141 | 724 | 2 | LDPC BG2 |
| 8 | 1.8594 | 476 | 4 | LDPC BG2 |
| 9 | 2.4531 | 628 | 4 | LDPC BG2 |
| 10 | 3.0391 | 778 | 4 | LDPC BG2 |
| 11 | 3.5801 | 611 | 6 | LDPC BG2 |
| 12 | 4.3008 | 734 | 6 | LDPC BG2 |
| 13 | 4.9453 | 844 | 6 | LDPC BG2 |

TABLE 31-continued

| Index | SE | CR | Mod | Code |
|---|---|---|---|---|
| 14 | 5.4609 | 932 | 6 | LDPC BG2 |
| 15 | 5.707 | 974 | 6 | LDPC BG2 |

2.2.2 Target BLER=$10^{-2}$

TABLE 32

| Index | SE | CR | Mod | Code |
|---|---|---|---|---|
| 0 | — | — | — | — |
| 1 | 0.0781 | 40 | 2 | LDPC BG2 |
| 2 | 0.1484 | 76 | 2 | LDPC BG2 |
| 3 | 0.2695 | 138 | 2 | LDPC BG2 |
| 4 | 0.4648 | 238 | 2 | LDPC BG2 |
| 5 | 0.7422 | 380 | 2 | LDPC BG2 |
| 6 | 1.0957 | 561 | 2 | LDPC BG2 |
| 7 | 1.4648 | 750 | 2 | LDPC BG2 |
| 8 | 1.9414 | 497 | 4 | LDPC BG2 |
| 9 | 2.5273 | 647 | 4 | LDPC BG2 |
| 10 | 3.0898 | 791 | 4 | LDPC BG2 |
| 11 | 3.6328 | 620 | 6 | LDPC BG2 |
| 12 | 4.3477 | 742 | 6 | LDPC BG2 |
| 13 | 4.9629 | 847 | 6 | LDPC BG2 |
| 14 | 5.4668 | 933 | 6 | LDPC BG2 |
| 15 | 5.707 | 974 | 6 | LDPC BG2 |

2.2.3 Target BLER=$10^{-3}$

TABLE 33

| Index | SE | CR | Mod | Code |
|---|---|---|---|---|
| 0 | — | — | — | — |
| 1 | 0.0781 | 40 | 2 | LDPC BG2 |
| 2 | 0.1504 | 77 | 2 | LDPC BG2 |
| 3 | 0.2813 | 144 | 2 | LDPC BG2 |
| 4 | 0.4824 | 247 | 2 | LDPC BG2 |
| 5 | 0.7734 | 396 | 2 | LDPC BG2 |
| 6 | 1.1328 | 580 | 2 | LDPC BG2 |
| 7 | 1.4922 | 764 | 2 | LDPC BG2 |
| 8 | 1.9922 | 510 | 4 | LDPC BG2 |
| 9 | 2.5742 | 659 | 4 | LDPC BG2 |
| 10 | 3.1133 | 797 | 4 | LDPC BG2 |
| 11 | 3.6738 | 627 | 6 | LDPC BG2 |
| 12 | 4.377 | 747 | 6 | LDPC BG2 |
| 13 | 4.9746 | 849 | 6 | LDPC BG2 |
| 14 | 5.4785 | 935 | 6 | LDPC BG2 |
| 15 | 5.707 | 974 | 6 | LDPC BG2 |

2.2.4 Target BLER=$10^{-4}$

TABLE 34

| Index | SE | CR | Mod | Code |
|---|---|---|---|---|
| 0 | — | — | — | — |
| 1 | 0.0781 | 40 | 2 | LDPC BG2 |
| 2 | 0.1543 | 79 | 2 | LDPC BG2 |
| 3 | 0.2949 | 151 | 2 | LDPC BG2 |
| 4 | 0.5039 | 258 | 2 | LDPC BG2 |
| 5 | 0.8066 | 413 | 2 | LDPC BG2 |
| 6 | 1.1738 | 601 | 2 | LDPC BG2 |
| 7 | 1.5098 | 773 | 2 | LDPC BG2 |
| 8 | 2.0586 | 527 | 4 | LDPC BG2 |
| 9 | 2.6367 | 675 | 4 | LDPC BG2 |
| 10 | 3.0898 | 791 | 4 | LDPC BG2 |
| 11 | 3.7266 | 636 | 6 | LDPC BG2 |

TABLE 34-continued

| Index | SE | CR | Mod | Code |
|---|---|---|---|---|
| 12 | 4.3652 | 745 | 6 | LDPC BG2 |
| 13 | 5.0039 | 854 | 6 | LDPC BG2 |
| 14 | 5.502 | 939 | 6 | LDPC BG2 |
| 15 | 5.707 | 974 | 6 | LDPC BG2 |

2.2.5 Target BLER=$10^{-5}$

TABLE 35

| Index | SE | CR | Mod | Code |
|---|---|---|---|---|
| 0 | — | — | — | — |
| 1 | 0.0781 | 40 | 2 | LDPC BG2 |
| 2 | 0.1641 | 84 | 2 | LDPC BG2 |
| 3 | 0.3164 | 162 | 2 | LDPC BG2 |
| 4 | 0.5391 | 276 | 2 | LDPC BG2 |
| 5 | 0.8555 | 438 | 2 | LDPC BG2 |
| 6 | 1.2285 | 629 | 2 | LDPC BG2 |
| 7 | 1.5898 | 407 | 4 | LDPC BG2 |
| 8 | 2.168 | 555 | 4 | LDPC BG2 |
| 9 | 2.7148 | 695 | 4 | LDPC BG2 |
| 10 | 3.0703 | 786 | 4 | LDPC BG2 |
| 11 | 3.8555 | 658 | 6 | LDPC BG2 |
| 12 | 4.3301 | 739 | 6 | LDPC BG2 |
| 13 | 4.9922 | 852 | 6 | LDPC BG2 |
| 14 | 5.5254 | 943 | 6 | LDPC BG2 |
| 15 | 5.7129 | 975 | 6 | LDPC BG2 |

2.2.6 Target BLER=$10^{-6}$

TABLE 36

| Index | SE | CR | Mod | Code |
|---|---|---|---|---|
| 0 | — | — | — | — |
| 1 | 0.0781 | 40 | 2 | LDPC BG2 |
| 2 | 0.1777 | 91 | 2 | LDPC BG2 |
| 3 | 0.3418 | 175 | 2 | LDPC BG2 |
| 4 | 0.5723 | 293 | 2 | LDPC BG2 |
| 5 | 0.8965 | 459 | 2 | LDPC BG2 |
| 6 | 1.2676 | 649 | 2 | LDPC BG2 |
| 7 | 1.6133 | 413 | 4 | LDPC BG2 |
| 8 | 2.2344 | 572 | 4 | LDPC BG2 |
| 9 | 2.7266 | 698 | 4 | LDPC BG2 |
| 10 | 3.0742 | 787 | 4 | LDPC BG2 |
| 11 | 3.832 | 654 | 6 | LDPC BG2 |
| 12 | 4.3301 | 739 | 6 | LDPC BG2 |
| 13 | 4.9688 | 848 | 6 | LDPC BG2 |
| 14 | 5.5195 | 942 | 6 | LDPC BG2 |
| 15 | 5.7363 | 979 | 6 | LDPC BG2 |

2.3 No limitation on a minimum code rate, and a maximum code rate $R_{max}=2/3$ 2.3.1 Target BLER=$10^{-1}$

TABLE 37

| Index | SE | CR | Mod | Code |
|---|---|---|---|---|
| 0 | — | — | — | — |
| 1 | 0.0703 | 36 | 2 | LDPC BG2 |
| 2 | 0.1113 | 57 | 2 | LDPC BG2 |
| 3 | 0.1719 | 88 | 2 | LDPC BG2 |
| 4 | 0.2676 | 137 | 2 | LDPC BG2 |
| 5 | 0.4063 | 208 | 2 | LDPC BG2 |
| 6 | 0.5957 | 305 | 2 | LDPC BG2 |
| 7 | 0.832 | 426 | 2 | LDPC BG2 |
| 8 | 1.1094 | 568 | 2 | LDPC BG2 |
| 9 | 1.4023 | 718 | 2 | LDPC BG2 |
| 10 | 1.7109 | 438 | 4 | LDPC BG2 |
| 11 | 2.1523 | 551 | 4 | LDPC BG2 |

TABLE 37-continued

| Index | SE | CR | Mod | Code |
|---|---|---|---|---|
| 12 | 2.6133 | 669 | 4 | LDPC BG2 |
| 13 | 3.0586 | 783 | 4 | LDPC BG2 |
| 14 | 3.4141 | 874 | 4 | LDPC BG2 |
| 15 | 4.002 | 683 | 6 | LDPC BG2 |

2.3.2 Target BLER=$10^{-2}$

TABLE 38

| Index | SE | CR | Mod | Code |
|---|---|---|---|---|
| 0 | — | — | — | — |
| 1 | 0.0703 | 36 | 2 | LDPC BG2 |
| 2 | 0.1133 | 58 | 2 | LDPC BG2 |
| 3 | 0.1797 | 92 | 2 | LDPC BG2 |
| 4 | 0.2852 | 146 | 2 | LDPC BG2 |
| 5 | 0.4316 | 221 | 2 | LDPC BG2 |
| 6 | 0.627 | 321 | 2 | LDPC BG2 |
| 7 | 0.8711 | 446 | 2 | LDPC BG2 |
| 8 | 1.1504 | 589 | 2 | LDPC BG2 |
| 9 | 1.4336 | 734 | 2 | LDPC BG2 |
| 10 | 1.7578 | 450 | 4 | LDPC BG2 |
| 11 | 2.1992 | 563 | 4 | LDPC BG2 |
| 12 | 2.6484 | 678 | 4 | LDPC BG2 |
| 13 | 3.0742 | 787 | 4 | LDPC BG2 |
| 14 | 3.418 | 875 | 4 | LDPC BG2 |
| 15 | 4.002 | 683 | 6 | LDPC BG2 |

2.3.3 Target BLER=$10^{-3}$

TABLE 39

| Index | SE | CR | Mod | Code |
|---|---|---|---|---|
| 0 | — | — | — | — |
| 1 | 0.0684 | 35 | 2 | LDPC BG2 |
| 2 | 0.1172 | 60 | 2 | LDPC BG2 |
| 3 | 0.1914 | 98 | 2 | LDPC BG2 |
| 4 | 0.3027 | 155 | 2 | LDPC BG2 |
| 5 | 0.4531 | 232 | 2 | LDPC BG2 |
| 6 | 0.6563 | 336 | 2 | LDPC BG2 |
| 7 | 0.9082 | 465 | 2 | LDPC BG2 |
| 8 | 1.1875 | 608 | 2 | LDPC BG2 |
| 9 | 1.4609 | 748 | 2 | LDPC BG2 |
| 10 | 1.8008 | 461 | 4 | LDPC BG2 |
| 11 | 2.2344 | 572 | 4 | LDPC BG2 |
| 12 | 2.6797 | 686 | 4 | LDPC BG2 |
| 13 | 3.082 | 789 | 4 | LDPC BG2 |
| 14 | 3.4219 | 876 | 4 | LDPC BG2 |
| 15 | 4.002 | 683 | 6 | LDPC BG2 |

2.3.4 Target BLER=$10^{-4}$

TABLE 40

| Index | SE | CR | Mod | Code |
|---|---|---|---|---|
| 0 | — | — | — | — |
| 1 | 0.0684 | 35 | 2 | LDPC BG2 |
| 2 | 0.1211 | 62 | 2 | LDPC BG2 |
| 3 | 0.2031 | 104 | 2 | LDPC BG2 |
| 4 | 0.3184 | 163 | 2 | LDPC BG2 |
| 5 | 0.4727 | 242 | 2 | LDPC BG2 |
| 6 | 0.6816 | 349 | 2 | LDPC BG2 |
| 7 | 0.9375 | 480 | 2 | LDPC BG2 |
| 8 | 1.2168 | 623 | 2 | LDPC BG2 |
| 9 | 1.4688 | 752 | 2 | LDPC BG2 |

TABLE 40-continued

| Index | SE | CR | Mod | Code |
|---|---|---|---|---|
| 10 | 1.832 | 469 | 4 | LDPC BG2 |
| 11 | 2.2617 | 579 | 4 | LDPC BG2 |
| 12 | 2.6914 | 689 | 4 | LDPC BG2 |
| 13 | 3.0352 | 777 | 4 | LDPC BG2 |
| 14 | 3.375 | 864 | 4 | LDPC BG2 |
| 15 | 4.002 | 683 | 6 | LDPC BG2 |

2.3.5 Target BLER=$10^{-5}$

TABLE 41

| Index | SE | CR | Mod | Code |
|---|---|---|---|---|
| 0 | — | — | — | — |
| 1 | 0.0684 | 35 | 2 | LDPC BG2 |
| 2 | 0.125 | 64 | 2 | LDPC BG2 |
| 3 | 0.2148 | 110 | 2 | LDPC BG2 |
| 4 | 0.3359 | 172 | 2 | LDPC BG2 |
| 5 | 0.4961 | 254 | 2 | LDPC BG2 |
| 6 | 0.709 | 363 | 2 | LDPC BG2 |
| 7 | 0.9668 | 495 | 2 | LDPC BG2 |
| 8 | 1.2402 | 635 | 2 | LDPC BG2 |
| 9 | 1.4727 | 377 | 4 | LDPC BG2 |
| 10 | 1.8789 | 481 | 4 | LDPC BG2 |
| 11 | 2.2969 | 588 | 4 | LDPC BG2 |
| 12 | 2.6953 | 690 | 4 | LDPC BG2 |
| 13 | 2.9688 | 760 | 4 | LDPC BG2 |
| 14 | 3.5156 | 600 | 6 | LDPC BG2 |
| 15 | 4.002 | 683 | 6 | LDPC BG2 |

2.3.6 Target BLER=$10^{-6}$

TABLE 42

| Index | SE | CR | Mod | Code |
|---|---|---|---|---|
| 0 | — | — | — | — |
| 1 | 0.0664 | 34 | 2 | LDPC BG2 |
| 2 | 0.1367 | 70 | 2 | LDPC BG2 |
| 3 | 0.2402 | 123 | 2 | LDPC BG2 |
| 4 | 0.3672 | 188 | 2 | LDPC BG2 |
| 5 | 0.5352 | 274 | 2 | LDPC BG2 |
| 6 | 0.7578 | 388 | 2 | LDPC BG2 |
| 7 | 1.0215 | 523 | 2 | LDPC BG2 |
| 8 | 1.291 | 661 | 2 | LDPC BG2 |
| 9 | 1.5352 | 393 | 4 | LDPC BG2 |
| 10 | 1.9727 | 505 | 4 | LDPC BG2 |
| 11 | 2.3711 | 607 | 4 | LDPC BG2 |
| 12 | 2.7266 | 698 | 4 | LDPC BG2 |
| 13 | 2.9727 | 761 | 4 | LDPC BG2 |
| 14 | 3.6035 | 615 | 6 | LDPC BG2 |
| 15 | 3.9961 | 682 | 6 | LDPC BG2 |

2.4 Minimum code rate $R_{min}$=40/1024, and maximum code rate $R_{max}$=2/3

2.4.1 Target BLER=$10^{-1}$

TABLE 43

| Index | SE | CR | Mod | Code |
|---|---|---|---|---|
| 0 | — | — | — | — |
| 1 | 0.0781 | 40 | 2 | LDPC BG2 |
| 2 | 0.123 | 63 | 2 | LDPC BG2 |
| 3 | 0.1875 | 96 | 2 | LDPC BG2 |
| 4 | 0.291 | 149 | 2 | LDPC BG2 |
| 5 | 0.4355 | 223 | 2 | LDPC BG2 |
| 6 | 0.6289 | 322 | 2 | LDPC BG2 |
| 7 | 0.8672 | 444 | 2 | LDPC BG2 |
| 8 | 1.1445 | 586 | 2 | LDPC BG2 |
| 9 | 1.4297 | 732 | 2 | LDPC BG2 |
| 10 | 1.75 | 448 | 4 | LDPC BG2 |
| 11 | 2.1875 | 560 | 4 | LDPC BG2 |

TABLE 43-continued

| Index | SE | CR | Mod | Code |
|---|---|---|---|---|
| 12 | 2.6367 | 675 | 4 | LDPC BG2 |
| 13 | 3.0703 | 786 | 4 | LDPC BG2 |
| 14 | 3.418 | 875 | 4 | LDPC BG2 |
| 15 | 4.002 | 683 | 6 | LDPC BG2 |

2.4.2 Target BLER=$10^{-2}$

TABLE 44

| Index | SE | CR | Mod | Code |
|---|---|---|---|---|
| 0 | — | — | — | — |
| 1 | 0.0781 | 40 | 2 | LDPC BG2 |
| 2 | 0.127 | 65 | 2 | LDPC BG2 |
| 3 | 0.1992 | 102 | 2 | LDPC BG2 |
| 4 | 0.3105 | 159 | 2 | LDPC BG2 |
| 5 | 0.4648 | 238 | 2 | LDPC BG2 |
| 6 | 0.6641 | 340 | 2 | LDPC BG2 |
| 7 | 0.9121 | 467 | 2 | LDPC BG2 |
| 8 | 1.1895 | 609 | 2 | LDPC BG2 |
| 9 | 1.4648 | 750 | 2 | LDPC BG2 |
| 10 | 1.8008 | 461 | 4 | LDPC BG2 |
| 11 | 2.2344 | 572 | 4 | LDPC BG2 |
| 12 | 2.6758 | 685 | 4 | LDPC BG2 |
| 13 | 3.0898 | 791 | 4 | LDPC BG2 |
| 14 | 3.4258 | 877 | 4 | LDPC BG2 |
| 15 | 4.002 | 683 | 6 | LDPC BG2 |

2.4.3 Target BLER=$10^{-3}$

TABLE 45

| Index | SE | CR | Mod | Code |
|---|---|---|---|---|
| 0 | — | — | — | — |
| 1 | 0.0781 | 40 | 2 | LDPC BG2 |
| 2 | 0.127 | 65 | 2 | LDPC BG2 |
| 3 | 0.207 | 106 | 2 | LDPC BG2 |
| 4 | 0.3223 | 165 | 2 | LDPC BG2 |
| 5 | 0.4785 | 245 | 2 | LDPC BG2 |
| 6 | 0.6855 | 351 | 2 | LDPC BG2 |
| 7 | 0.9395 | 481 | 2 | LDPC BG2 |
| 8 | 1.2168 | 623 | 2 | LDPC BG2 |
| 9 | 1.4824 | 759 | 2 | LDPC BG2 |
| 10 | 1.832 | 469 | 4 | LDPC BG2 |
| 11 | 2.2617 | 579 | 4 | LDPC BG2 |
| 12 | 2.6953 | 690 | 4 | LDPC BG2 |
| 13 | 3.0938 | 792 | 4 | LDPC BG2 |
| 14 | 3.4258 | 877 | 4 | LDPC BG2 |
| 15 | 4.002 | 683 | 6 | LDPC BG2 |

2.4.4 Target BLER=$10^{-4}$

TABLE 46

| Index | SE | CR | Mod | Code |
|---|---|---|---|---|
| 0 | — | — | — | — |
| 1 | 0.0781 | 40 | 2 | LDPC BG2 |
| 2 | 0.1289 | 66 | 2 | LDPC BG2 |
| 3 | 0.2148 | 110 | 2 | LDPC BG2 |
| 4 | 0.332 | 170 | 2 | LDPC BG2 |
| 5 | 0.4922 | 252 | 2 | LDPC BG2 |
| 6 | 0.7031 | 360 | 2 | LDPC BG2 |
| 7 | 0.959 | 491 | 2 | LDPC BG2 |
| 8 | 1.2344 | 632 | 2 | LDPC BG2 |
| 9 | 1.4824 | 759 | 2 | LDPC BG2 |
| 10 | 1.8516 | 474 | 4 | LDPC BG2 |
| 11 | 2.2813 | 584 | 4 | LDPC BG2 |
| 12 | 2.707 | 693 | 4 | LDPC BG2 |
| 13 | 3.0391 | 778 | 4 | LDPC BG2 |
| 14 | 3.4395 | 587 | 6 | LDPC BG2 |
| 15 | 4.002 | 683 | 6 | LDPC BG2 |

2.4.5 Target BLER=$10^{-5}$

TABLE 47

| Index | SE | CR | Mod | Code |
|---|---|---|---|---|
| 0 | — | — | — | — |
| 1 | 0.0781 | 40 | 2 | LDPC BG2 |
| 2 | 0.1328 | 68 | 2 | LDPC BG2 |
| 3 | 0.2266 | 116 | 2 | LDPC BG2 |
| 4 | 0.3496 | 179 | 2 | LDPC BG2 |
| 5 | 0.5117 | 262 | 2 | LDPC BG2 |
| 6 | 0.7266 | 372 | 2 | LDPC BG2 |
| 7 | 0.9863 | 505 | 2 | LDPC BG2 |
| 8 | 1.2559 | 643 | 2 | LDPC BG2 |
| 9 | 1.4883 | 381 | 4 | LDPC BG2 |
| 10 | 1.8984 | 486 | 4 | LDPC BG2 |
| 11 | 2.3125 | 592 | 4 | LDPC BG2 |
| 12 | 2.7031 | 692 | 4 | LDPC BG2 |
| 13 | 2.9727 | 761 | 4 | LDPC BG2 |
| 14 | 3.5215 | 601 | 6 | LDPC BG2 |
| 15 | 4.002 | 683 | 6 | LDPC BG2 |

2.4.6 Target BLER=$10^{-6}$

TABLE 48

| Index | SE | CR | Mod | Code |
|---|---|---|---|---|
| 0 | — | — | — | — |
| 1 | 0.0781 | 40 | 2 | LDPC BG2 |
| 2 | 0.1426 | 73 | 2 | LDPC BG2 |
| 3 | 0.248 | 127 | 2 | LDPC BG2 |
| 4 | 0.377 | 193 | 2 | LDPC BG2 |
| 5 | 0.5469 | 280 | 2 | LDPC BG2 |
| 6 | 0.7695 | 394 | 2 | LDPC BG2 |
| 7 | 1.0352 | 530 | 2 | LDPC BG2 |
| 8 | 1.3008 | 666 | 2 | LDPC BG2 |
| 9 | 1.543 | 395 | 4 | LDPC BG2 |
| 10 | 1.9844 | 508 | 4 | LDPC BG2 |
| 11 | 2.3789 | 609 | 4 | LDPC BG2 |
| 12 | 2.7305 | 699 | 4 | LDPC BG2 |
| 13 | 2.9766 | 762 | 4 | LDPC BG2 |
| 14 | 3.6035 | 615 | 6 | LDPC BG2 |
| 15 | 3.9961 | 682 | 6 | LDPC BG2 |

3. A coding scheme includes the LDPC BG2 and the LDPC BG1.

This section may allow some adjustments to a given mapping table for engineering use, for example, the LDPC BG2 is used for quadrature phase shift keying (QPSK) and quadrature amplitude modulation (16QAM), and the LDPC BG1 is used for 64QAM. In other words, an idea of adjusting the mapping table is to correspond a value of the modulation order to the coding scheme, or to map the modulation order to the coding scheme.

3.1 No limitation on a code rate 3.1.1 Target BLER=$10^{-1}$

TABLE 49

| Index | SE | CR | Mod | Code |
|---|---|---|---|---|
| 0 | — | — | — | — |
| 1 | 0.0781 | 40 | 2 | LDPC BG2 |

TABLE 49-continued

| Index | SE | CR | Mod | Code |
|---|---|---|---|---|
| 2 | 0.1387 | 71 | 2 | LDPC BG2 |
| 3 | 0.2422 | 124 | 2 | LDPC BG2 |
| 4 | 0.4121 | 211 | 2 | LDPC BG2 |
| 5 | 0.6563 | 336 | 2 | LDPC BG2 |
| 6 | 0.9766 | 500 | 2 | LDPC BG2 |
| 7 | 1.3418 | 687 | 2 | LDPC BG2 |
| 8 | 1.7305 | 443 | 4 | LDPC BG2 |
| 9 | 2.293 | 587 | 4 | LDPC BG2 |
| 10 | 2.8672 | 734 | 4 | LDPC BG2 |
| 11 | 3.3945 | 869 | 4 | LDPC BG1 |
| 12 | 4.0371 | 689 | 6 | LDPC BG2 |
| 13 | 4.7285 | 807 | 6 | LDPC BG1 |
| 14 | 5.332 | 910 | 6 | LDPC BG1 |
| 15 | 5.7129 | 975 | 6 | LDPC BG1 |

An adjusted table is Table 50.

TABLE 50

| Index | SE | CR | Mod | Code |
|---|---|---|---|---|
| 0 | — | — | — | — |
| 1 | 0.0781 | 40 | 2 | LDPC BG2 |
| 2 | 0.1387 | 71 | 2 | LDPC BG2 |
| 3 | 0.2422 | 124 | 2 | LDPC BG2 |
| 4 | 0.4121 | 211 | 2 | LDPC BG2 |
| 5 | 0.6563 | 336 | 2 | LDPC BG2 |
| 6 | 0.9766 | 500 | 2 | LDPC BG2 |
| 7 | 1.3418 | 687 | 2 | LDPC BG2 |
| 8 | 1.7305 | 443 | 4 | LDPC BG2 |
| 9 | 2.293 | 587 | 4 | LDPC BG2 |
| 10 | 2.8672 | 734 | 4 | LDPC BG2 |
| 11 | 3.3516 | 858 | 4 | LDPC BG2 |
| 12 | 4.0137 | 685 | 6 | LDPC BG1 |
| 13 | 4.7285 | 807 | 6 | LDPC BG1 |
| 14 | 5.332 | 910 | 6 | LDPC BG1 |
| 15 | 5.7129 | 975 | 6 | LDPC BG1 |

3.1.2 Target BLER=$10^{-2}$

TABLE 51

| Index | SE | CR | Mod | Code |
|---|---|---|---|---|
| 0 | — | — | — | — |
| 1 | 0.0898 | 46 | 2 | LDPC BG2 |
| 2 | 0.1621 | 83 | 2 | LDPC BG2 |
| 3 | 0.2871 | 147 | 2 | LDPC BG2 |
| 4 | 0.4766 | 244 | 2 | LDPC BG2 |
| 5 | 0.7461 | 382 | 2 | LDPC BG2 |
| 6 | 1.0801 | 553 | 2 | LDPC BG2 |
| 7 | 1.4355 | 735 | 2 | LDPC BG2 |
| 8 | 1.8633 | 477 | 4 | LDPC BG2 |
| 9 | 2.4219 | 620 | 4 | LDPC BG2 |
| 10 | 2.9727 | 761 | 4 | LDPC BG2 |
| 11 | 3.457 | 885 | 4 | LDPC BG1 |
| 12 | 4.125 | 704 | 6 | LDPC BG2 |
| 13 | 4.7871 | 817 | 6 | LDPC BG1 |
| 14 | 5.3555 | 914 | 6 | LDPC BG1 |
| 15 | 5.7129 | 975 | 6 | LDPC BG1 |

An adjusted table is Table 52.

TABLE 52

| Index | SE | CR | Mod | Code |
|---|---|---|---|---|
| 0 | — | — | — | — |
| 1 | 0.0898 | 46 | 2 | LDPC BG2 |
| 2 | 0.1621 | 83 | 2 | LDPC BG2 |
| 3 | 0.2871 | 147 | 2 | LDPC BG2 |
| 4 | 0.4766 | 244 | 2 | LDPC BG2 |
| 5 | 0.7461 | 382 | 2 | LDPC BG2 |

TABLE 52-continued

| Index | SE | CR | Mod | Code |
|---|---|---|---|---|
| 6 | 1.0801 | 553 | 2 | LDPC BG2 |
| 7 | 1.4355 | 735 | 2 | LDPC BG2 |
| 8 | 1.8633 | 477 | 4 | LDPC BG2 |
| 9 | 2.4219 | 620 | 4 | LDPC BG2 |
| 10 | 2.9727 | 761 | 4 | LDPC BG2 |
| 11 | 3.4141 | 874 | 4 | LDPC BG2 |
| 12 | 4.0898 | 698 | 6 | LDPC BG1 |
| 13 | 4.7871 | 817 | 6 | LDPC BG1 |
| 14 | 5.3555 | 914 | 6 | LDPC BG1 |
| 15 | 5.7129 | 975 | 6 | LDPC BG1 |

3.1.3 Target BLER=$10^{-3}$

TABLE 53

| Index | SE | CR | Mod | Code |
|---|---|---|---|---|
| 0 | — | — | — | — |
| 1 | 0.1055 | 54 | 2 | LDPC BG2 |
| 2 | 0.1914 | 98 | 2 | LDPC BG2 |
| 3 | 0.3359 | 172 | 2 | LDPC BG2 |
| 4 | 0.5449 | 279 | 2 | LDPC BG2 |
| 5 | 0.834 | 427 | 2 | LDPC BG2 |
| 6 | 1.1758 | 602 | 2 | LDPC BG2 |
| 7 | 1.5078 | 772 | 2 | LDPC BG2 |
| 8 | 1.9883 | 509 | 4 | LDPC BG2 |
| 9 | 2.5313 | 648 | 4 | LDPC BG2 |
| 10 | 3.0508 | 781 | 4 | LDPC BG2 |
| 11 | 3.5449 | 605 | 6 | LDPC BG2 |
| 12 | 4.2012 | 717 | 6 | LDPC BG2 |
| 13 | 4.834 | 825 | 6 | LDPC BG1 |
| 14 | 5.373 | 917 | 6 | LDPC BG1 |
| 15 | 5.707 | 974 | 6 | LDPC BG1 |

An adjusted table is Table 54.

TABLE 54

| Index | SE | CR | Mod | Code |
|---|---|---|---|---|
| 0 | — | — | — | — |
| 1 | 0.1055 | 54 | 2 | LDPC BG2 |
| 2 | 0.1914 | 98 | 2 | LDPC BG2 |
| 3 | 0.3359 | 172 | 2 | LDPC BG2 |
| 4 | 0.5449 | 279 | 2 | LDPC BG2 |
| 5 | 0.834 | 427 | 2 | LDPC BG2 |
| 6 | 1.1758 | 602 | 2 | LDPC BG2 |
| 7 | 1.5078 | 772 | 2 | LDPC BG2 |
| 8 | 1.9883 | 509 | 4 | LDPC BG2 |
| 9 | 2.5313 | 648 | 4 | LDPC BG2 |
| 10 | 3.0508 | 781 | 4 | LDPC BG2 |
| 11 | 3.5156 | 600 | 6 | LDPC BG1 |
| 12 | 4.1602 | 710 | 6 | LDPC BG1 |
| 13 | 4.834 | 825 | 6 | LDPC BG1 |
| 14 | 5.373 | 917 | 6 | LDPC BG1 |
| 15 | 5.707 | 974 | 6 | LDPC BG1 |

3.1.4 Target BLER=$10^{-4}$

TABLE 55

| Index | SE | CR | Mod | Code |
|---|---|---|---|---|
| 0 | — | — | — | — |
| 1 | 0.1211 | 62 | 2 | LDPC BG2 |
| 2 | 0.2266 | 116 | 2 | LDPC BG2 |
| 3 | 0.3848 | 197 | 2 | LDPC BG2 |
| 4 | 0.6133 | 314 | 2 | LDPC BG2 |
| 5 | 0.918 | 470 | 2 | LDPC BG2 |
| 6 | 1.2598 | 645 | 2 | LDPC BG2 |
| 7 | 1.5781 | 404 | 4 | LDPC BG2 |
| 8 | 2.0977 | 537 | 4 | LDPC BG2 |
| 9 | 2.6289 | 673 | 4 | LDPC BG2 |

TABLE 55-continued

| Index | SE | CR | Mod | Code |
|---|---|---|---|---|
| 10 | 3.1211 | 799 | 4 | LDPC BG1 |
| 11 | 3.627 | 619 | 6 | LDPC BG2 |
| 12 | 4.2539 | 726 | 6 | LDPC BG2 |
| 13 | 4.875 | 832 | 6 | LDPC BG1 |
| 14 | 5.3906 | 920 | 6 | LDPC BG1 |
| 15 | 5.707 | 974 | 6 | LDPC BG1 |

An adjusted table is Table 56.

TABLE 56

| Index | SE | CR | Mod | Code |
|---|---|---|---|---|
| 0 | — | — | — | — |
| 1 | 0.1211 | 62 | 2 | LDPC BG2 |
| 2 | 0.2266 | 116 | 2 | LDPC BG2 |
| 3 | 0.3848 | 197 | 2 | LDPC BG2 |
| 4 | 0.6133 | 314 | 2 | LDPC BG2 |
| 5 | 0.918 | 470 | 2 | LDPC BG2 |
| 6 | 1.2598 | 645 | 2 | LDPC BG2 |
| 7 | 1.5781 | 404 | 4 | LDPC BG2 |
| 8 | 2.0977 | 537 | 4 | LDPC BG2 |
| 9 | 2.6289 | 673 | 4 | LDPC BG2 |
| 10 | 3.0547 | 782 | 4 | LDPC BG2 |
| 11 | 3.5918 | 613 | 6 | LDPC BG1 |
| 12 | 4.2305 | 722 | 6 | LDPC BG1 |
| 13 | 4.875 | 832 | 6 | LDPC BG1 |
| 14 | 5.3906 | 920 | 6 | LDPC BG1 |
| 15 | 5.707 | 974 | 6 | LDPC BG1 |

3.1.5 Target BLER=$10^{-5}$

TABLE 57

| Index | SE | CR | Mod | Code |
|---|---|---|---|---|
| 0 | — | — | — | — |
| 1 | 0.1426 | 73 | 2 | LDPC BG2 |
| 2 | 0.2676 | 137 | 2 | LDPC BG2 |
| 3 | 0.4395 | 225 | 2 | LDPC BG2 |
| 4 | 0.6836 | 350 | 2 | LDPC BG2 |
| 5 | 1 | 512 | 2 | LDPC BG2 |
| 6 | 1.3242 | 678 | 2 | LDPC BG2 |
| 7 | 1.6875 | 432 | 4 | LDPC BG2 |
| 8 | 2.2031 | 564 | 4 | LDPC BG2 |
| 9 | 2.6953 | 690 | 4 | LDPC BG1 |
| 10 | 3.1758 | 813 | 4 | LDPC BG1 |
| 11 | 3.6738 | 627 | 6 | LDPC BG1 |
| 12 | 4.3066 | 735 | 6 | LDPC BG1 |
| 13 | 4.8984 | 836 | 6 | LDPC BG1 |
| 14 | 5.4082 | 923 | 6 | LDPC BG1 |
| 15 | 5.7129 | 975 | 6 | LDPC BG1 |

An adjusted table is Table 58.

TABLE 58

| Index | SE | CR | Mod | Code |
|---|---|---|---|---|
| 0 | — | — | — | — |
| 1 | 0.1426 | 73 | 2 | LDPC BG2 |
| 2 | 0.2676 | 137 | 2 | LDPC BG2 |
| 3 | 0.4395 | 225 | 2 | LDPC BG2 |
| 4 | 0.6836 | 350 | 2 | LDPC BG2 |
| 5 | 1 | 512 | 2 | LDPC BG2 |
| 6 | 1.3242 | 678 | 2 | LDPC BG2 |
| 7 | 1.6875 | 432 | 4 | LDPC BG2 |
| 8 | 2.2031 | 564 | 4 | LDPC BG2 |
| 9 | 2.6953 | 690 | 4 | LDPC BG2 |
| 10 | 3.0195 | 773 | 4 | LDPC BG2 |
| 11 | 3.6738 | 627 | 6 | LDPC BG1 |
| 12 | 4.3066 | 735 | 6 | LDPC BG1 |
| 13 | 4.8984 | 836 | 6 | LDPC BG1 |
| 14 | 5.4082 | 923 | 6 | LDPC BG1 |
| 15 | 5.7129 | 975 | 6 | LDPC BG1 |

3.1.6 Target BLER=$10^{-6}$

TABLE 59

| Index | SE | CR | Mod | Code |
|---|---|---|---|---|
| 0 | — | — | — | — |
| 1 | 0.1699 | 87 | 2 | LDPC BG2 |
| 2 | 0.3086 | 158 | 2 | LDPC BG2 |
| 3 | 0.4902 | 251 | 2 | LDPC BG2 |
| 4 | 0.7441 | 381 | 2 | LDPC BG2 |
| 5 | 1.0625 | 544 | 2 | LDPC BG2 |
| 6 | 1.377 | 705 | 2 | LDPC BG1 |
| 7 | 1.7344 | 444 | 4 | LDPC BG2 |
| 8 | 2.2656 | 580 | 4 | LDPC BG2 |
| 9 | 2.7617 | 707 | 4 | LDPC BG1 |
| 10 | 3.1992 | 819 | 4 | LDPC BG1 |
| 11 | 3.7324 | 637 | 6 | LDPC BG1 |
| 12 | 4.3359 | 740 | 6 | LDPC BG1 |
| 13 | 4.8926 | 835 | 6 | LDPC BG1 |
| 14 | 5.4258 | 926 | 6 | LDPC BG1 |
| 15 | 5.7129 | 975 | 6 | LDPC BG1 |

An adjusted table is Table 60.

TABLE 60

| Index | SE | CR | Mod | Code |
|---|---|---|---|---|
| 0 | — | — | — | — |
| 1 | 0.1699 | 87 | 2 | LDPC BG2 |
| 2 | 0.3086 | 158 | 2 | LDPC BG2 |
| 3 | 0.4902 | 251 | 2 | LDPC BG2 |
| 4 | 0.7441 | 381 | 2 | LDPC BG2 |
| 5 | 1.0625 | 544 | 2 | LDPC BG2 |
| 6 | 1.3691 | 701 | 2 | LDPC BG2 |
| 7 | 1.7344 | 444 | 4 | LDPC BG2 |
| 8 | 2.2656 | 580 | 4 | LDPC BG2 |
| 9 | 2.7031 | 692 | 4 | LDPC BG2 |
| 10 | 3.0039 | 769 | 4 | LDPC BG2 |
| 11 | 3.7324 | 637 | 6 | LDPC BG1 |
| 12 | 4.3359 | 740 | 6 | LDPC BG1 |
| 13 | 4.8926 | 835 | 6 | LDPC BG1 |
| 14 | 5.4258 | 926 | 6 | LDPC BG1 |
| 15 | 5.7129 | 975 | 6 | LDPC BG1 |

3.2 Minimum code rate $R_{min}$=40/1024, and no limitation on a maximum code rate 3.2.1 Target BLER=$10^{-1}$

TABLE 61

| Index | SE | CR | Mod | Code |
|---|---|---|---|---|
| 0 | — | — | — | — |
| 1 | 0.0781 | 40 | 2 | LDPC BG2 |
| 2 | 0.1387 | 71 | 2 | LDPC BG2 |
| 3 | 0.2402 | 123 | 2 | LDPC BG2 |
| 4 | 0.4082 | 209 | 2 | LDPC BG2 |
| 5 | 0.6543 | 335 | 2 | LDPC BG2 |
| 6 | 0.9727 | 498 | 2 | LDPC BG2 |
| 7 | 1.3379 | 685 | 2 | LDPC BG2 |
| 8 | 1.7266 | 442 | 4 | LDPC BG2 |
| 9 | 2.2891 | 586 | 4 | LDPC BG2 |
| 10 | 2.8633 | 733 | 4 | LDPC BG2 |
| 11 | 3.3945 | 869 | 4 | LDPC BG1 |
| 12 | 4.0371 | 689 | 6 | LDPC BG2 |

TABLE 61-continued

| Index | SE | CR | Mod | Code |
|---|---|---|---|---|
| 13 | 4.7285 | 807 | 6 | LDPC BG1 |
| 14 | 5.332 | 910 | 6 | LDPC BG1 |
| 15 | 5.7129 | 975 | 6 | LDPC BG1 |

An adjusted table is Table 62.

TABLE 62

| Index | SE | CR | Mod | Code |
|---|---|---|---|---|
| 0 | — | — | — | — |
| 1 | 0.0781 | 40 | 2 | LDPC BG2 |
| 2 | 0.1387 | 71 | 2 | LDPC BG2 |
| 3 | 0.2402 | 123 | 2 | LDPC BG2 |
| 4 | 0.4082 | 209 | 2 | LDPC BG2 |
| 5 | 0.6543 | 335 | 2 | LDPC BG2 |
| 6 | 0.9727 | 498 | 2 | LDPC BG2 |
| 7 | 1.3379 | 685 | 2 | LDPC BG2 |
| 8 | 1.7266 | 442 | 4 | LDPC BG2 |
| 9 | 2.2891 | 586 | 4 | LDPC BG2 |
| 10 | 2.8633 | 733 | 4 | LDPC BG2 |
| 11 | 3.3516 | 858 | 4 | LDPC BG2 |
| 12 | 4.0137 | 685 | 6 | LDPC BG1 |
| 13 | 4.7285 | 807 | 6 | LDPC BG1 |
| 14 | 5.332 | 910 | 6 | LDPC BG1 |
| 15 | 5.7129 | 975 | 6 | LDPC BG1 |

3.2.2 Target BLER=$10^{-2}$

TABLE 63

| Index | SE | CR | Mod | Code |
|---|---|---|---|---|
| 0 | — | — | — | — |
| 1 | 0.0781 | 40 | 2 | LDPC BG2 |
| 2 | 0.1445 | 74 | 2 | LDPC BG2 |
| 3 | 0.2598 | 133 | 2 | LDPC BG2 |
| 4 | 0.4414 | 226 | 2 | LDPC BG2 |
| 5 | 0.7012 | 359 | 2 | LDPC BG2 |
| 6 | 1.0332 | 529 | 2 | LDPC BG2 |
| 7 | 1.3945 | 714 | 2 | LDPC BG2 |
| 8 | 1.8086 | 463 | 4 | LDPC BG2 |
| 9 | 2.3711 | 607 | 4 | LDPC BG2 |
| 10 | 2.9336 | 751 | 4 | LDPC BG2 |
| 11 | 3.4336 | 879 | 4 | LDPC BG1 |
| 12 | 4.0957 | 699 | 6 | LDPC BG1 |
| 13 | 4.7695 | 814 | 6 | LDPC BG1 |
| 14 | 5.3496 | 913 | 6 | LDPC BG1 |
| 15 | 5.7129 | 975 | 6 | LDPC BG1 |

An adjusted table is Table 64.

TABLE 64

| Index | SE | CR | Mod | Code |
|---|---|---|---|---|
| 0 | — | — | — | — |
| 1 | 0.0781 | 40 | 2 | LDPC BG2 |
| 2 | 0.1445 | 74 | 2 | LDPC BG2 |
| 3 | 0.2598 | 133 | 2 | LDPC BG2 |
| 4 | 0.4414 | 226 | 2 | LDPC BG2 |
| 5 | 0.7012 | 359 | 2 | LDPC BG2 |
| 6 | 1.0332 | 529 | 2 | LDPC BG2 |
| 7 | 1.3945 | 714 | 2 | LDPC BG2 |
| 8 | 1.8086 | 463 | 4 | LDPC BG2 |
| 9 | 2.3711 | 607 | 4 | LDPC BG2 |
| 10 | 2.9336 | 751 | 4 | LDPC BG2 |
| 11 | 3.3906 | 868 | 4 | LDPC BG2 |

TABLE 64-continued

| Index | SE | CR | Mod | Code |
|---|---|---|---|---|
| 12 | 4.0605 | 693 | 6 | LDPC BG1 |
| 13 | 4.7695 | 814 | 6 | LDPC BG1 |
| 14 | 5.3496 | 913 | 6 | LDPC BG1 |
| 15 | 5.7129 | 975 | 6 | LDPC BG1 |

3.2.3 Target BLER=$10^{-3}$

TABLE 65

| Index | SE | CR | Mod | Code |
|---|---|---|---|---|
| 0 | — | — | — | — |
| 1 | 0.0781 | 40 | 2 | LDPC BG2 |
| 2 | 0.1465 | 75 | 2 | LDPC BG2 |
| 3 | 0.2715 | 139 | 2 | LDPC BG2 |
| 4 | 0.459 | 235 | 2 | LDPC BG2 |
| 5 | 0.7305 | 374 | 2 | LDPC BG2 |
| 6 | 1.0703 | 548 | 2 | LDPC BG2 |
| 7 | 1.4258 | 730 | 2 | LDPC BG2 |
| 8 | 1.8633 | 477 | 4 | LDPC BG2 |
| 9 | 2.4219 | 620 | 4 | LDPC BG2 |
| 10 | 2.9727 | 761 | 4 | LDPC BG2 |
| 11 | 3.457 | 885 | 4 | LDPC BG1 |
| 12 | 4.1367 | 706 | 6 | LDPC BG2 |
| 13 | 4.793 | 818 | 6 | LDPC BG1 |
| 14 | 5.3555 | 914 | 6 | LDPC BG1 |
| 15 | 5.707 | 974 | 6 | LDPC BG1 |

An adjusted table is Table 66.

TABLE 66

| Index | SE | CR | Mod | Code |
|---|---|---|---|---|
| 0 | — | — | — | — |
| 1 | 0.0781 | 40 | 2 | LDPC BG2 |
| 2 | 0.1465 | 75 | 2 | LDPC BG2 |
| 3 | 0.2715 | 139 | 2 | LDPC BG2 |
| 4 | 0.459 | 235 | 2 | LDPC BG2 |
| 5 | 0.7305 | 374 | 2 | LDPC BG2 |
| 6 | 1.0703 | 548 | 2 | LDPC BG2 |
| 7 | 1.4258 | 730 | 2 | LDPC BG2 |
| 8 | 1.8633 | 477 | 4 | LDPC BG2 |
| 9 | 2.4219 | 620 | 4 | LDPC BG2 |
| 10 | 2.9727 | 761 | 4 | LDPC BG2 |
| 11 | 3.4141 | 874 | 4 | LDPC BG2 |
| 12 | 4.0957 | 699 | 6 | LDPC BG1 |
| 13 | 4.793 | 818 | 6 | LDPC BG1 |
| 14 | 5.3555 | 914 | 6 | LDPC BG1 |
| 15 | 5.707 | 974 | 6 | LDPC BG1 |

3.2.4 Target BLER=$10^{-4}$

TABLE 67

| Index | SE | CR | Mod | Code |
|---|---|---|---|---|
| 0 | — | — | — | — |
| 1 | 0.0781 | 40 | 2 | LDPC BG2 |
| 2 | 0.1504 | 77 | 2 | LDPC BG2 |
| 3 | 0.2832 | 145 | 2 | LDPC BG2 |
| 4 | 0.4766 | 244 | 2 | LDPC BG2 |
| 5 | 0.7578 | 388 | 2 | LDPC BG2 |
| 6 | 1.1055 | 566 | 2 | LDPC BG2 |
| 7 | 1.4453 | 740 | 2 | LDPC BG2 |
| 8 | 1.9102 | 489 | 4 | LDPC BG2 |
| 9 | 2.4688 | 632 | 4 | LDPC BG2 |
| 10 | 2.9922 | 766 | 4 | LDPC BG1 |
| 11 | 3.5039 | 598 | 6 | LDPC BG2 |
| 12 | 4.1836 | 714 | 6 | LDPC BG2 |

TABLE 67-continued

| Index | SE | CR | Mod | Code |
|---|---|---|---|---|
| 13 | 4.8164 | 822 | 6 | LDPC BG1 |
| 14 | 5.3672 | 916 | 6 | LDPC BG1 |
| 15 | 5.707 | 974 | 6 | LDPC BG1 |

An adjusted table is Table 68.

TABLE 68

| Index | SE | CR | Mod | Code |
|---|---|---|---|---|
| 0 | — | — | — | — |
| 1 | 0.0781 | 40 | 2 | LDPC BG2 |
| 2 | 0.1504 | 77 | 2 | LDPC BG2 |
| 3 | 0.2832 | 145 | 2 | LDPC BG2 |
| 4 | 0.4766 | 244 | 2 | LDPC BG2 |
| 5 | 0.7578 | 388 | 2 | LDPC BG2 |
| 6 | 1.1055 | 566 | 2 | LDPC BG2 |
| 7 | 1.4453 | 740 | 2 | LDPC BG2 |
| 8 | 1.9102 | 489 | 4 | LDPC BG2 |
| 9 | 2.4688 | 632 | 4 | LDPC BG2 |
| 10 | 2.9727 | 761 | 4 | LDPC BG2 |
| 11 | 3.4688 | 592 | 6 | LDPC BG1 |
| 12 | 4.1309 | 705 | 6 | LDPC BG1 |
| 13 | 4.8164 | 822 | 6 | LDPC BG1 |
| 14 | 5.3672 | 916 | 6 | LDPC BG1 |
| 15 | 5.707 | 974 | 6 | LDPC BG1 |

3.2.5 Target BLER=$10^{-5}$

TABLE 69

| Index | SE | CR | Mod | Code |
|---|---|---|---|---|
| 0 | — | — | — | — |
| 1 | 0.0781 | 40 | 2 | LDPC BG2 |
| 2 | 0.1582 | 81 | 2 | LDPC BG2 |
| 3 | 0.2988 | 153 | 2 | LDPC BG2 |
| 4 | 0.5 | 256 | 2 | LDPC BG2 |
| 5 | 0.7852 | 402 | 2 | LDPC BG2 |
| 6 | 1.1367 | 582 | 2 | LDPC BG2 |
| 7 | 1.4688 | 752 | 2 | LDPC BG1 |
| 8 | 1.9727 | 505 | 4 | LDPC BG2 |
| 9 | 2.5078 | 642 | 4 | LDPC BG2 |
| 10 | 3.0273 | 775 | 4 | LDPC BG1 |
| 11 | 3.5859 | 612 | 6 | LDPC BG2 |
| 12 | 4.2012 | 717 | 6 | LDPC BG2 |
| 13 | 4.8281 | 824 | 6 | LDPC BG1 |
| 14 | 5.3848 | 919 | 6 | LDPC BG1 |
| 15 | 5.7129 | 975 | 6 | LDPC BG1 |

An adjusted table is Table 70.

TABLE 70

| Index | SE | CR | Mod | Code |
|---|---|---|---|---|
| 0 | — | — | — | — |
| 1 | 0.0781 | 40 | 2 | LDPC BG2 |
| 2 | 0.1582 | 81 | 2 | LDPC BG2 |
| 3 | 0.2988 | 153 | 2 | LDPC BG2 |
| 4 | 0.5 | 256 | 2 | LDPC BG2 |
| 5 | 0.7852 | 402 | 2 | LDPC BG2 |
| 6 | 1.1367 | 582 | 2 | LDPC BG2 |
| 7 | 1.4512 | 743 | 2 | LDPC BG2 |
| 8 | 1.9727 | 505 | 4 | LDPC BG2 |
| 9 | 2.5078 | 642 | 4 | LDPC BG2 |
| 10 | 2.9297 | 750 | 4 | LDPC BG2 |
| 11 | 3.5156 | 600 | 6 | LDPC BG1 |

TABLE 70-continued

| Index | SE | CR | Mod | Code |
|---|---|---|---|---|
| 12 | 4.1719 | 712 | 6 | LDPC BG1 |
| 13 | 4.8281 | 824 | 6 | LDPC BG1 |
| 14 | 5.3848 | 919 | 6 | LDPC BG1 |
| 15 | 5.7129 | 975 | 6 | LDPC BG1 |

3.2.6 Target BLER=$10^{-6}$

TABLE 71

| Index | SE | CR | Mod | Code |
|---|---|---|---|---|
| 0 | — | — | — | — |
| 1 | 0.0781 | 40 | 2 | LDPC BG2 |
| 2 | 0.1699 | 87 | 2 | LDPC BG2 |
| 3 | 0.3203 | 164 | 2 | LDPC BG2 |
| 4 | 0.5254 | 269 | 2 | LDPC BG2 |
| 5 | 0.8145 | 417 | 2 | LDPC BG2 |
| 6 | 1.1641 | 596 | 2 | LDPC BG2 |
| 7 | 1.5 | 384 | 4 | LDPC BG2 |
| 8 | 2.0117 | 515 | 4 | LDPC BG2 |
| 9 | 2.5234 | 646 | 4 | LDPC BG1 |
| 10 | 3.0391 | 778 | 4 | LDPC BG1 |
| 11 | 3.6035 | 615 | 6 | LDPC BG2 |
| 12 | 4.166 | 711 | 6 | LDPC BG1 |
| 13 | 4.8281 | 824 | 6 | LDPC BG1 |
| 14 | 5.3906 | 920 | 6 | LDPC BG1 |
| 15 | 5.7129 | 975 | 6 | LDPC BG1 |

An adjusted table is Table 72.

TABLE 72

| Index | SE | CR | Mod | Code |
|---|---|---|---|---|
| 0 | — | — | — | — |
| 1 | 0.0781 | 40 | 2 | LDPC BG2 |
| 2 | 0.1699 | 87 | 2 | LDPC BG2 |
| 3 | 0.3203 | 164 | 2 | LDPC BG2 |
| 4 | 0.5254 | 269 | 2 | LDPC BG2 |
| 5 | 0.8145 | 417 | 2 | LDPC BG2 |
| 6 | 1.1641 | 596 | 2 | LDPC BG2 |
| 7 | 1.5 | 384 | 4 | LDPC BG2 |
| 8 | 2.0117 | 515 | 4 | LDPC BG2 |
| 9 | 2.5117 | 643 | 4 | LDPC BG2 |
| 10 | 2.8906 | 740 | 4 | LDPC BG2 |
| 11 | 3.5391 | 604 | 6 | LDPC BG1 |
| 12 | 4.166 | 711 | 6 | LDPC BG1 |
| 13 | 4.8281 | 824 | 6 | LDPC BG1 |
| 14 | 5.3906 | 920 | 6 | LDPC BG1 |
| 15 | 5.7129 | 975 | 6 | LDPC BG1 |

3.3 No limitation on a minimum code rate, and a maximum code rate $R_{max}=2/3$ 3.3.1 Target BLER=$10^{-1}$

TABLE 73

| Index | SE | CR | Mod | Code |
|---|---|---|---|---|
| 0 | — | — | — | — |
| 1 | 0.0703 | 36 | 2 | LDPC BG2 |
| 2 | 0.1113 | 57 | 2 | LDPC BG2 |
| 3 | 0.1719 | 88 | 2 | LDPC BG2 |
| 4 | 0.2676 | 137 | 2 | LDPC BG2 |
| 5 | 0.4063 | 208 | 2 | LDPC BG2 |
| 6 | 0.5957 | 305 | 2 | LDPC BG2 |
| 7 | 0.832 | 426 | 2 | LDPC BG2 |
| 8 | 1.1094 | 568 | 2 | LDPC BG2 |
| 9 | 1.4023 | 718 | 2 | LDPC BG2 |
| 10 | 1.7109 | 438 | 4 | LDPC BG2 |

TABLE 73-continued

| Index | SE | CR | Mod | Code |
|---|---|---|---|---|
| 11 | 2.1523 | 551 | 4 | LDPC BG2 |
| 12 | 2.6133 | 669 | 4 | LDPC BG2 |
| 13 | 3.0586 | 783 | 4 | LDPC BG2 |
| 14 | 3.4609 | 886 | 4 | LDPC BG1 |
| 15 | 4.002 | 683 | 6 | LDPC BG2 |

An adjusted table is Table 74.

TABLE 74

| Index | SE | CR | Mod | Code |
|---|---|---|---|---|
| 0 | — | — | — | — |
| 1 | 0.0703 | 36 | 2 | LDPC BG2 |
| 2 | 0.1113 | 57 | 2 | LDPC BG2 |
| 3 | 0.1719 | 88 | 2 | LDPC BG2 |
| 4 | 0.2676 | 137 | 2 | LDPC BG2 |
| 5 | 0.4063 | 208 | 2 | LDPC BG2 |
| 6 | 0.5957 | 305 | 2 | LDPC BG2 |
| 7 | 0.832 | 426 | 2 | LDPC BG2 |
| 8 | 1.1094 | 568 | 2 | LDPC BG2 |
| 9 | 1.4023 | 718 | 2 | LDPC BG2 |
| 10 | 1.7109 | 438 | 4 | LDPC BG2 |
| 11 | 2.1523 | 551 | 4 | LDPC BG2 |
| 12 | 2.6133 | 669 | 4 | LDPC BG2 |
| 13 | 3.0586 | 783 | 4 | LDPC BG2 |
| 14 | 3.4141 | 874 | 4 | LDPC BG2 |
| 15 | 3.9785 | 679 | 6 | LDPC BG1 |

3.3.2 Target BLER=$10^{-2}$

TABLE 75

| Index | SE | CR | Mod | Code |
|---|---|---|---|---|
| 0 | — | — | — | — |
| 1 | 0.0703 | 36 | 2 | LDPC BG2 |
| 2 | 0.1133 | 58 | 2 | LDPC BG2 |
| 3 | 0.1797 | 92 | 2 | LDPC BG2 |
| 4 | 0.2852 | 146 | 2 | LDPC BG2 |
| 5 | 0.4316 | 221 | 2 | LDPC BG2 |
| 6 | 0.627 | 321 | 2 | LDPC BG2 |
| 7 | 0.8711 | 446 | 2 | LDPC BG2 |
| 8 | 1.1504 | 589 | 2 | LDPC BG2 |
| 9 | 1.4336 | 734 | 2 | LDPC BG2 |
| 10 | 1.7578 | 450 | 4 | LDPC BG2 |
| 11 | 2.1992 | 563 | 4 | LDPC BG2 |
| 12 | 2.6484 | 678 | 4 | LDPC BG2 |
| 13 | 3.0742 | 787 | 4 | LDPC BG2 |
| 14 | 3.4609 | 886 | 4 | LDPC BG1 |
| 15 | 4.002 | 683 | 6 | LDPC BG2 |

An adjusted table is Table 76.

TABLE 76

| Index | SE | CR | Mod | Code |
|---|---|---|---|---|
| 0 | — | — | — | — |
| 1 | 0.0703 | 36 | 2 | LDPC BG2 |
| 2 | 0.1133 | 58 | 2 | LDPC BG2 |
| 3 | 0.1797 | 92 | 2 | LDPC BG2 |
| 4 | 0.2852 | 146 | 2 | LDPC BG2 |
| 5 | 0.4316 | 221 | 2 | LDPC BG2 |
| 6 | 0.627 | 321 | 2 | LDPC BG2 |
| 7 | 0.8711 | 446 | 2 | LDPC BG2 |
| 8 | 1.1504 | 589 | 2 | LDPC BG2 |
| 9 | 1.4336 | 734 | 2 | LDPC BG2 |
| 10 | 1.7578 | 450 | 4 | LDPC BG2 |

TABLE 76-continued

| Index | SE | CR | Mod | Code |
|---|---|---|---|---|
| 11 | 2.1992 | 563 | 4 | LDPC BG2 |
| 12 | 2.6484 | 678 | 4 | LDPC BG2 |
| 13 | 3.0742 | 787 | 4 | LDPC BG2 |
| 14 | 3.4180 | 875 | 4 | LDPC BG2 |
| 15 | 3.9668 | 677 | 6 | LDPC BG1 |

3.3.3 Target BLER=$10^{-3}$

TABLE 77

| Index | SE | CR | Mod | Code |
|---|---|---|---|---|
| 0 | — | — | — | — |
| 1 | 0.0684 | 35 | 2 | LDPC BG2 |
| 2 | 0.1172 | 60 | 2 | LDPC BG2 |
| 3 | 0.1914 | 98 | 2 | LDPC BG2 |
| 4 | 0.3027 | 155 | 2 | LDPC BG2 |
| 5 | 0.4531 | 232 | 2 | LDPC BG2 |
| 6 | 0.6563 | 336 | 2 | LDPC BG2 |
| 7 | 0.9082 | 465 | 2 | LDPC BG2 |
| 8 | 1.1875 | 608 | 2 | LDPC BG2 |
| 9 | 1.4609 | 748 | 2 | LDPC BG2 |
| 10 | 1.8008 | 461 | 4 | LDPC BG2 |
| 11 | 2.2344 | 572 | 4 | LDPC BG2 |
| 12 | 2.6797 | 686 | 4 | LDPC BG2 |
| 13 | 3.0859 | 790 | 4 | LDPC BG1 |
| 14 | 3.4648 | 887 | 4 | LDPC BG1 |
| 15 | 4.002 | 683 | 6 | LDPC BG2 |

An adjusted table is Table 78.

TABLE 78

| Index | SE | CR | Mod | Code |
|---|---|---|---|---|
| 0 | — | — | — | — |
| 1 | 0.0684 | 35 | 2 | LDPC BG2 |
| 2 | 0.1172 | 60 | 2 | LDPC BG2 |
| 3 | 0.1914 | 98 | 2 | LDPC BG2 |
| 4 | 0.3027 | 155 | 2 | LDPC BG2 |
| 5 | 0.4531 | 232 | 2 | LDPC BG2 |
| 6 | 0.6563 | 336 | 2 | LDPC BG2 |
| 7 | 0.9082 | 465 | 2 | LDPC BG2 |
| 8 | 1.1875 | 608 | 2 | LDPC BG2 |
| 9 | 1.4609 | 748 | 2 | LDPC BG2 |
| 10 | 1.8008 | 461 | 4 | LDPC BG2 |
| 11 | 2.2344 | 572 | 4 | LDPC BG2 |
| 12 | 2.6797 | 686 | 4 | LDPC BG2 |
| 13 | 3.0820 | 789 | 4 | LDPC BG2 |
| 14 | 3.4219 | 876 | 4 | LDPC BG2 |
| 15 | 3.9551 | 675 | 6 | LDPC BG1 |

3.3.4 Target BLER=$10^{-4}$

TABLE 79

| Index | SE | CR | Mod | Code |
|---|---|---|---|---|
| 0 | — | — | — | — |
| 1 | 0.0684 | 35 | 2 | LDPC BG2 |
| 2 | 0.1211 | 62 | 2 | LDPC BG2 |
| 3 | 0.2031 | 104 | 2 | LDPC BG2 |
| 4 | 0.3184 | 163 | 2 | LDPC BG2 |
| 5 | 0.4727 | 242 | 2 | LDPC BG2 |
| 6 | 0.6816 | 349 | 2 | LDPC BG2 |
| 7 | 0.9375 | 480 | 2 | LDPC BG2 |
| 8 | 1.2168 | 623 | 2 | LDPC BG2 |
| 9 | 1.4688 | 752 | 2 | LDPC BG2 |
| 10 | 1.832 | 469 | 4 | LDPC BG2 |
| 11 | 2.2617 | 579 | 4 | LDPC BG2 |

TABLE 79-continued

| Index | SE | CR | Mod | Code |
|---|---|---|---|---|
| 12 | 2.6914 | 689 | 4 | LDPC BG2 |
| 13 | 3.0859 | 790 | 4 | LDPC BG1 |
| 14 | 3.4531 | 884 | 4 | LDPC BG1 |
| 15 | 4.002 | 683 | 6 | LDPC BG2 |

An adjusted table is Table 80.

TABLE 80

| Index | SE | CR | Mod | Code |
|---|---|---|---|---|
| 0 | — | — | — | — |
| 1 | 0.0684 | 35 | 2 | LDPC BG2 |
| 2 | 0.1211 | 62 | 2 | LDPC BG2 |
| 3 | 0.2031 | 104 | 2 | LDPC BG2 |
| 4 | 0.3184 | 163 | 2 | LDPC BG2 |
| 5 | 0.4727 | 242 | 2 | LDPC BG2 |
| 6 | 0.6816 | 349 | 2 | LDPC BG2 |
| 7 | 0.9375 | 480 | 2 | LDPC BG2 |
| 8 | 1.2168 | 623 | 2 | LDPC BG2 |
| 9 | 1.4688 | 752 | 2 | LDPC BG2 |
| 10 | 1.832 | 469 | 4 | LDPC BG2 |
| 11 | 2.2617 | 579 | 4 | LDPC BG2 |
| 12 | 2.6914 | 689 | 4 | LDPC BG2 |
| 13 | 3.0352 | 777 | 4 | LDPC BG2 |
| 14 | 3.3750 | 864 | 4 | LDPC BG2 |
| 15 | 3.9375 | 672 | 6 | LDPC BG1 |

3.3.5 Target BLER=$10^{-5}$

TABLE 81

| Index | SE | CR | Mod | Code |
|---|---|---|---|---|
| 0 | — | — | — | — |
| 1 | 0.0684 | 35 | 2 | LDPC BG2 |
| 2 | 0.125 | 64 | 2 | LDPC BG2 |
| 3 | 0.2148 | 110 | 2 | LDPC BG2 |
| 4 | 0.3359 | 172 | 2 | LDPC BG2 |
| 5 | 0.4961 | 254 | 2 | LDPC BG2 |
| 6 | 0.709 | 363 | 2 | LDPC BG2 |
| 7 | 0.9668 | 495 | 2 | LDPC BG2 |
| 8 | 1.2402 | 635 | 2 | LDPC BG2 |
| 9 | 1.4883 | 762 | 2 | LDPC BG1 |
| 10 | 1.8789 | 481 | 4 | LDPC BG2 |
| 11 | 2.2969 | 588 | 4 | LDPC BG2 |
| 12 | 2.6953 | 690 | 4 | LDPC BG1 |
| 13 | 3.1016 | 794 | 4 | LDPC BG1 |
| 14 | 3.5156 | 600 | 6 | LDPC BG2 |
| 15 | 4.002 | 683 | 6 | LDPC BG2 |

An adjusted table is Table 82.

TABLE 82

| Index | SE | CR | Mod | Code |
|---|---|---|---|---|
| 0 | — | — | — | — |
| 1 | 0.0684 | 35 | 2 | LDPC BG2 |
| 2 | 0.125 | 64 | 2 | LDPC BG2 |
| 3 | 0.2148 | 110 | 2 | LDPC BG2 |
| 4 | 0.3359 | 172 | 2 | LDPC BG2 |
| 5 | 0.4961 | 254 | 2 | LDPC BG2 |
| 6 | 0.709 | 363 | 2 | LDPC BG2 |
| 7 | 0.9668 | 495 | 2 | LDPC BG2 |
| 8 | 1.2402 | 635 | 2 | LDPC BG2 |
| 9 | 1.4727 | 377 | 4 | LDPC BG2 |
| 10 | 1.8789 | 481 | 4 | LDPC BG2 |
| 11 | 2.2969 | 588 | 4 | LDPC BG2 |

TABLE 82-continued

| Index | SE | CR | Mod | Code |
|---|---|---|---|---|
| 12 | 2.6953 | 690 | 4 | LDPC BG2 |
| 13 | 2.9688 | 760 | 4 | LDPC BG2 |
| 14 | 3.4570 | 590 | 6 | LDPC BG1 |
| 15 | 3.9551 | 675 | 6 | LDPC BG1 |

3.3.6 Target BLER=$10^{-6}$

TABLE 83

| Index | SE | CR | Mod | Code |
|---|---|---|---|---|
| 0 | — | — | — | — |
| 1 | 0.0664 | 34 | 2 | LDPC BG2 |
| 2 | 0.1367 | 70 | 2 | LDPC BG2 |
| 3 | 0.2383 | 122 | 2 | LDPC BG2 |
| 4 | 0.3652 | 187 | 2 | LDPC BG2 |
| 5 | 0.5313 | 272 | 2 | LDPC BG2 |
| 6 | 0.75 | 384 | 2 | LDPC BG2 |
| 7 | 1.0137 | 519 | 2 | LDPC BG2 |
| 8 | 1.2832 | 657 | 2 | LDPC BG2 |
| 9 | 1.5273 | 391 | 4 | LDPC BG2 |
| 10 | 1.9492 | 499 | 4 | LDPC BG2 |
| 11 | 2.3516 | 602 | 4 | LDPC BG2 |
| 12 | 2.7695 | 709 | 4 | LDPC BG1 |
| 13 | 3.1406 | 804 | 4 | LDPC BG1 |
| 14 | 3.6035 | 615 | 6 | LDPC BG2 |
| 15 | 4.002 | 683 | 6 | LDPC BG1 |

An adjusted table is Table 84.

TABLE 84

| Index | SE | CR | Mod | Code |
|---|---|---|---|---|
| 0 | — | — | — | — |
| 1 | 0.0664 | 34 | 2 | LDPC BG2 |
| 2 | 0.1367 | 70 | 2 | LDPC BG2 |
| 3 | 0.2383 | 122 | 2 | LDPC BG2 |
| 4 | 0.3652 | 187 | 2 | LDPC BG2 |
| 5 | 0.5313 | 272 | 2 | LDPC BG2 |
| 6 | 0.75 | 384 | 2 | LDPC BG2 |
| 7 | 1.0137 | 519 | 2 | LDPC BG2 |
| 8 | 1.2832 | 657 | 2 | LDPC BG2 |
| 9 | 1.5273 | 391 | 4 | LDPC BG2 |
| 10 | 1.9492 | 499 | 4 | LDPC BG2 |
| 11 | 2.3516 | 602 | 4 | LDPC BG2 |
| 12 | 2.7109 | 694 | 4 | LDPC BG2 |
| 13 | 2.9570 | 757 | 4 | LDPC BG2 |
| 14 | 3.5332 | 603 | 6 | LDPC BG1 |
| 15 | 4.002 | 683 | 6 | LDPC BG1 |

3.4 Minimum code rate $R_{min}$=40/1024, and maximum code rate $R_{max}$=2/3

3.4.1 Target BLER=$10^{-1}$

TABLE 85

| Index | SE | CR | Mod | Code |
|---|---|---|---|---|
| 0 | — | — | — | — |
| 1 | 0.0781 | 40 | 2 | LDPC BG2 |
| 2 | 0.123 | 63 | 2 | LDPC BG2 |
| 3 | 0.1875 | 96 | 2 | LDPC BG2 |
| 4 | 0.291 | 149 | 2 | LDPC BG2 |
| 5 | 0.4355 | 223 | 2 | LDPC BG2 |
| 6 | 0.6289 | 322 | 2 | LDPC BG2 |
| 7 | 0.8672 | 444 | 2 | LDPC BG2 |
| 8 | 1.1445 | 586 | 2 | LDPC BG2 |
| 9 | 1.4297 | 732 | 2 | LDPC BG2 |
| 10 | 1.75 | 448 | 4 | LDPC BG2 |
| 11 | 2.1875 | 560 | 4 | LDPC BG2 |
| 12 | 2.6367 | 675 | 4 | LDPC BG2 |
| 13 | 3.0703 | 786 | 4 | LDPC BG2 |

TABLE 85-continued

| Index | SE | CR | Mod | Code |
|---|---|---|---|---|
| 14 | 3.4688 | 888 | 4 | LDPC BG1 |
| 15 | 4.002 | 683 | 6 | LDPC BG2 |

An adjusted table is Table 86.

TABLE 86

| Index | SE | CR | Mod | Code |
|---|---|---|---|---|
| 0 | — | — | — | — |
| 1 | 0.0781 | 40 | 2 | LDPC BG2 |
| 2 | 0.123 | 63 | 2 | LDPC BG2 |
| 3 | 0.1875 | 96 | 2 | LDPC BG2 |
| 4 | 0.291 | 149 | 2 | LDPC BG2 |
| 5 | 0.4355 | 223 | 2 | LDPC BG2 |
| 6 | 0.6289 | 322 | 2 | LDPC BG2 |
| 7 | 0.8672 | 444 | 2 | LDPC BG2 |
| 8 | 1.1445 | 586 | 2 | LDPC BG2 |
| 9 | 1.4297 | 732 | 2 | LDPC BG2 |
| 10 | 1.75 | 448 | 4 | LDPC BG2 |
| 11 | 2.1875 | 560 | 4 | LDPC BG2 |
| 12 | 2.6367 | 675 | 4 | LDPC BG2 |
| 13 | 3.0703 | 786 | 4 | LDPC BG2 |
| 14 | 3.4180 | 875 | 4 | LDPC BG2 |
| 15 | 3.9785 | 679 | 6 | LDPC BG1 |

3.4.2 Target BLER=$10^{-2}$

TABLE 87

| Index | SE | CR | Mod | Code |
|---|---|---|---|---|
| 0 | — | — | — | — |
| 1 | 0.0781 | 40 | 2 | LDPC BG2 |
| 2 | 0.127 | 65 | 2 | LDPC BG2 |
| 3 | 0.1992 | 102 | 2 | LDPC BG2 |
| 4 | 0.3105 | 159 | 2 | LDPC BG2 |
| 5 | 0.4648 | 238 | 2 | LDPC BG2 |
| 6 | 0.6641 | 340 | 2 | LDPC BG2 |
| 7 | 0.9121 | 467 | 2 | LDPC BG2 |
| 8 | 1.1895 | 609 | 2 | LDPC BG2 |
| 9 | 1.4648 | 750 | 2 | LDPC BG2 |
| 10 | 1.8008 | 461 | 4 | LDPC BG2 |
| 11 | 2.2344 | 572 | 4 | LDPC BG2 |
| 12 | 2.6758 | 685 | 4 | LDPC BG2 |
| 13 | 3.0898 | 791 | 4 | LDPC BG2 |
| 14 | 3.4688 | 888 | 4 | LDPC BG1 |
| 15 | 4.002 | 683 | 6 | LDPC BG2 |

An adjusted table is Table 88.

TABLE 88

| Index | SE | CR | Mod | Code |
|---|---|---|---|---|
| 0 | — | — | — | — |
| 1 | 0.0781 | 40 | 2 | LDPC BG2 |
| 2 | 0.127 | 65 | 2 | LDPC BG2 |
| 3 | 0.1992 | 102 | 2 | LDPC BG2 |
| 4 | 0.3105 | 159 | 2 | LDPC BG2 |
| 5 | 0.4648 | 238 | 2 | LDPC BG2 |
| 6 | 0.6641 | 340 | 2 | LDPC BG2 |
| 7 | 0.9121 | 467 | 2 | LDPC BG2 |
| 8 | 1.1895 | 609 | 2 | LDPC BG2 |
| 9 | 1.4648 | 750 | 2 | LDPC BG2 |
| 10 | 1.8008 | 461 | 4 | LDPC BG2 |
| 11 | 2.2344 | 572 | 4 | LDPC BG2 |
| 12 | 2.6758 | 685 | 4 | LDPC BG2 |

TABLE 88-continued

| Index | SE | CR | Mod | Code |
|---|---|---|---|---|
| 13 | 3.0898 | 791 | 4 | LDPC BG2 |
| 14 | 3.4258 | 877 | 4 | LDPC BG2 |
| 15 | 3.9668 | 677 | 6 | LDPC BG1 |

3.4.3 Target BLER=$10^{-3}$

TABLE 89

| Index | SE | CR | Mod | Code |
|---|---|---|---|---|
| 0 | — | — | — | — |
| 1 | 0.0781 | 40 | 2 | LDPC BG2 |
| 2 | 0.127 | 65 | 2 | LDPC BG2 |
| 3 | 0.207 | 106 | 2 | LDPC BG2 |
| 4 | 0.3223 | 165 | 2 | LDPC BG2 |
| 5 | 0.4785 | 245 | 2 | LDPC BG2 |
| 6 | 0.6855 | 351 | 2 | LDPC BG2 |
| 7 | 0.9395 | 481 | 2 | LDPC BG2 |
| 8 | 1.2168 | 623 | 2 | LDPC BG2 |
| 9 | 1.4824 | 759 | 2 | LDPC BG2 |
| 10 | 1.832 | 469 | 4 | LDPC BG2 |
| 11 | 2.2617 | 579 | 4 | LDPC BG2 |
| 12 | 2.6953 | 690 | 4 | LDPC BG2 |
| 13 | 3.0977 | 793 | 4 | LDPC BG1 |
| 14 | 3.4688 | 888 | 4 | LDPC BG1 |
| 15 | 4.002 | 683 | 6 | LDPC BG2 |

An adjusted table is Table 90.

TABLE 90

| Index | SE | CR | Mod | Code |
|---|---|---|---|---|
| 0 | — | — | — | — |
| 1 | 0.0781 | 40 | 2 | LDPC BG2 |
| 2 | 0.127 | 65 | 2 | LDPC BG2 |
| 3 | 0.207 | 106 | 2 | LDPC BG2 |
| 4 | 0.3223 | 165 | 2 | LDPC BG2 |
| 5 | 0.4785 | 245 | 2 | LDPC BG2 |
| 6 | 0.6855 | 351 | 2 | LDPC BG2 |
| 7 | 0.9395 | 481 | 2 | LDPC BG2 |
| 8 | 1.2168 | 623 | 2 | LDPC BG2 |
| 9 | 1.4824 | 759 | 2 | LDPC BG2 |
| 10 | 1.832 | 469 | 4 | LDPC BG2 |
| 11 | 2.2617 | 579 | 4 | LDPC BG2 |
| 12 | 2.6953 | 690 | 4 | LDPC BG2 |
| 13 | 3.0938 | 792 | 4 | LDPC BG2 |
| 14 | 3.4258 | 877 | 4 | LDPC BG2 |
| 15 | 3.9551 | 675 | 6 | LDPC BG1 |

3.4.4 Target BLER=$10^{-4}$

TABLE 91

| Index | SE | CR | Mod | Code |
|---|---|---|---|---|
| 0 | — | — | — | — |
| 1 | 0.0781 | 40 | 2 | LDPC BG2 |
| 2 | 0.1289 | 66 | 2 | LDPC BG2 |
| 3 | 0.2148 | 110 | 2 | LDPC BG2 |
| 4 | 0.332 | 170 | 2 | LDPC BG2 |
| 5 | 0.4922 | 252 | 2 | LDPC BG2 |
| 6 | 0.7031 | 360 | 2 | LDPC BG2 |
| 7 | 0.959 | 491 | 2 | LDPC BG2 |
| 8 | 1.2344 | 632 | 2 | LDPC BG2 |
| 9 | 1.4824 | 759 | 2 | LDPC BG1 |
| 10 | 1.8516 | 474 | 4 | LDPC BG2 |
| 11 | 2.2813 | 584 | 4 | LDPC BG2 |

TABLE 91-continued

| Index | SE | CR | Mod | Code |
|---|---|---|---|---|
| 12 | 2.707 | 693 | 4 | LDPC BG2 |
| 13 | 3.0977 | 793 | 4 | LDPC BG1 |
| 14 | 3.457 | 885 | 4 | LDPC BG1 |
| 15 | 4.002 | 683 | 6 | LDPC BG2 |

An adjusted table is Table 92.

TABLE 92

| Index | SE | CR | Mod | Code |
|---|---|---|---|---|
| 0 | — | — | — | — |
| 1 | 0.0781 | 40 | 2 | LDPC BG2 |
| 2 | 0.1289 | 66 | 2 | LDPC BG2 |
| 3 | 0.2148 | 110 | 2 | LDPC BG2 |
| 4 | 0.332 | 170 | 2 | LDPC BG2 |
| 5 | 0.4922 | 252 | 2 | LDPC BG2 |
| 6 | 0.7031 | 360 | 2 | LDPC BG2 |
| 7 | 0.959 | 491 | 2 | LDPC BG2 |
| 8 | 1.2344 | 632 | 2 | LDPC BG2 |
| 9 | 1.4824 | 759 | 2 | LDPC BG2 |
| 10 | 1.8516 | 474 | 4 | LDPC BG2 |
| 11 | 2.2813 | 584 | 4 | LDPC BG2 |
| 12 | 2.707 | 693 | 4 | LDPC BG2 |
| 13 | 3.0391 | 778 | 4 | LDPC BG2 |
| 14 | 3.3789 | 865 | 4 | LDPC BG2 |
| 15 | 3.9375 | 672 | 6 | LDPC BG1 |

3.4.5 Target BLER=$10^{-5}$

TABLE 93

| Index | SE | CR | Mod | Code |
|---|---|---|---|---|
| 0 | — | — | — | — |
| 1 | 0.0781 | 40 | 2 | LDPC BG2 |
| 2 | 0.1328 | 68 | 2 | LDPC BG2 |
| 3 | 0.2266 | 116 | 2 | LDPC BG2 |
| 4 | 0.3496 | 179 | 2 | LDPC BG2 |
| 5 | 0.5117 | 262 | 2 | LDPC BG2 |
| 6 | 0.7266 | 372 | 2 | LDPC BG2 |
| 7 | 0.9863 | 505 | 2 | LDPC BG2 |
| 8 | 1.2559 | 643 | 2 | LDPC BG2 |
| 9 | 1.498 | 767 | 2 | LDPC BG1 |
| 10 | 1.8984 | 486 | 4 | LDPC BG2 |
| 11 | 2.3125 | 592 | 4 | LDPC BG2 |
| 12 | 2.707 | 693 | 4 | LDPC BG1 |
| 13 | 3.1055 | 795 | 4 | LDPC BG1 |
| 14 | 3.5215 | 601 | 6 | LDPC BG2 |
| 15 | 4.002 | 683 | 6 | LDPC BG2 |

An adjusted table is Table 94.

TABLE 94

| Index | SE | CR | Mod | Code |
|---|---|---|---|---|
| 0 | — | — | — | — |
| 1 | 0.0781 | 40 | 2 | LDPC BG2 |
| 2 | 0.1328 | 68 | 2 | LDPC BG2 |
| 3 | 0.2266 | 116 | 2 | LDPC BG2 |
| 4 | 0.3496 | 179 | 2 | LDPC BG2 |
| 5 | 0.5117 | 262 | 2 | LDPC BG2 |
| 6 | 0.7266 | 372 | 2 | LDPC BG2 |
| 7 | 0.9863 | 505 | 2 | LDPC BG2 |
| 8 | 1.2559 | 643 | 2 | LDPC BG2 |
| 9 | 1.4883 | 381 | 4 | LDPC BG2 |
| 10 | 1.8984 | 486 | 4 | LDPC BG2 |
| 11 | 2.3125 | 592 | 4 | LDPC BG2 |
| 12 | 2.7031 | 692 | 4 | LDPC BG2 |

TABLE 94-continued

| Index | SE | CR | Mod | Code |
|---|---|---|---|---|
| 13 | 2.9727 | 761 | 4 | LDPC BG2 |
| 14 | 3.4570 | 590 | 6 | LDPC BG1 |
| 15 | 3.9551 | 675 | 6 | LDPC BG1 |

3.4.6 Target BLER=$10^{-6}$

TABLE 95

| Index | SE | CR | Mod | Code |
|---|---|---|---|---|
| 0 | — | — | — | — |
| 1 | 0.0781 | 40 | 2 | LDPC BG2 |
| 2 | 0.1426 | 73 | 2 | LDPC BG2 |
| 3 | 0.2461 | 126 | 2 | LDPC BG2 |
| 4 | 0.375 | 192 | 2 | LDPC BG2 |
| 5 | 0.543 | 278 | 2 | LDPC BG2 |
| 6 | 0.7637 | 391 | 2 | LDPC BG2 |
| 7 | 1.0273 | 526 | 2 | LDPC BG2 |
| 8 | 1.293 | 662 | 2 | LDPC BG2 |
| 9 | 1.5352 | 393 | 4 | LDPC BG2 |
| 10 | 1.9648 | 503 | 4 | LDPC BG2 |
| 11 | 2.3594 | 604 | 4 | LDPC BG2 |
| 12 | 2.7773 | 711 | 4 | LDPC BG1 |
| 13 | 3.1445 | 805 | 4 | LDPC BG1 |
| 14 | 3.6035 | 615 | 6 | LDPC BG2 |
| 15 | 4.002 | 683 | 6 | LDPC BG1 |

An adjusted table is Table 96.

TABLE 96

| Index | SE | CR | Mod | Code |
|---|---|---|---|---|
| 0 | — | — | — | — |
| 1 | 0.0781 | 40 | 2 | LDPC BG2 |
| 2 | 0.1426 | 73 | 2 | LDPC BG2 |
| 3 | 0.2461 | 126 | 2 | LDPC BG2 |
| 4 | 0.375 | 192 | 2 | LDPC BG2 |
| 5 | 0.543 | 278 | 2 | LDPC BG2 |
| 6 | 0.7637 | 391 | 2 | LDPC BG2 |
| 7 | 1.0273 | 526 | 2 | LDPC BG2 |
| 8 | 1.293 | 662 | 2 | LDPC BG2 |
| 9 | 1.5352 | 393 | 4 | LDPC BG2 |
| 10 | 1.9648 | 503 | 4 | LDPC BG2 |
| 11 | 2.3594 | 604 | 4 | LDPC BG2 |
| 12 | 2.7148 | 695 | 4 | LDPC BG2 |
| 13 | 2.9609 | 758 | 4 | LDPC BG2 |
| 14 | 3.5391 | 604 | 6 | LDPC BG1 |
| 15 | 4.002 | 683 | 6 | LDPC BG1 |

4. A coding scheme includes the LDPC BG2 and the polar code.

This section may also allow some adjustments to a mapping table for engineering use, for example, the polar code is used for QPSK, and the LDPC BG2 is used for 16QAM and 64QAM. In other words, an idea of adjusting the mapping table is to map a value of the modulation order to the coding scheme.

4.1 No limitation on a code rate 4.1.1 Target BLER=$10^{-1}$

TABLE 97

| Index | SE | CR | Mod | Code |
|---|---|---|---|---|
| 0 | — | — | — | — |
| 1 | 0.0684 | 35 | 2 | Polar |
| 2 | 0.1133 | 58 | 2 | Polar |
| 3 | 0.1934 | 99 | 2 | Polar |
| 4 | 0.3203 | 164 | 2 | Polar |
| 5 | 0.5254 | 269 | 2 | Polar |

TABLE 97-continued

| Index | SE | CR | Mod | Code |
|---|---|---|---|---|
| 6 | 0.8164 | 418 | 2 | Polar |
| 7 | 1.2012 | 615 | 2 | LDPC BG2 |
| 8 | 1.5859 | 406 | 4 | LDPC BG2 |
| 9 | 2.1992 | 563 | 4 | LDPC BG2 |
| 10 | 2.8359 | 726 | 4 | LDPC BG2 |
| 11 | 3.3867 | 867 | 4 | Polar |
| 12 | 4.1543 | 709 | 6 | LDPC BG2 |
| 13 | 4.8691 | 831 | 6 | LDPC BG2 |
| 14 | 5.4961 | 938 | 6 | Polar |
| 15 | 5.707 | 974 | 6 | LDPC BG2 |

An adjusted table is Table 98.

TABLE 98

| Index | SE | CR | Mod | Code |
|---|---|---|---|---|
| 0 | — | — | — | — |
| 1 | 0.0684 | 35 | 2 | Polar |
| 2 | 0.1133 | 58 | 2 | Polar |
| 3 | 0.1934 | 99 | 2 | Polar |
| 4 | 0.3203 | 164 | 2 | Polar |
| 5 | 0.5254 | 269 | 2 | Polar |
| 6 | 0.8164 | 418 | 2 | Polar |
| 7 | 1.1934 | 611 | 2 | Polar |
| 8 | 1.5859 | 406 | 4 | LDPC BG2 |
| 9 | 2.1992 | 563 | 4 | LDPC BG2 |
| 10 | 2.8359 | 726 | 4 | LDPC BG2 |
| 11 | 3.3750 | 864 | 4 | LDPC BG2 |
| 12 | 4.1543 | 709 | 6 | LDPC BG2 |
| 13 | 4.8691 | 831 | 6 | LDPC BG2 |
| 14 | 5.4258 | 926 | 6 | LDPC BG2 |
| 15 | 5.707 | 974 | 6 | LDPC BG2 |

4.1.2 Target BLER=$10^{-2}$

TABLE 99

| Index | SE | CR | Mod | Code |
|---|---|---|---|---|
| 0 | — | — | — | — |
| 1 | 0.0684 | 35 | 2 | Polar |
| 2 | 0.1152 | 59 | 2 | Polar |
| 3 | 0.2031 | 104 | 2 | Polar |
| 4 | 0.3398 | 174 | 2 | Polar |
| 5 | 0.5566 | 285 | 2 | Polar |
| 6 | 0.8711 | 446 | 2 | LDPC BG2 |
| 7 | 1.2656 | 648 | 2 | LDPC BG2 |
| 8 | 1.6719 | 428 | 4 | LDPC BG2 |
| 9 | 2.2852 | 585 | 4 | LDPC BG2 |
| 10 | 2.9063 | 744 | 4 | LDPC BG2 |
| 11 | 3.4141 | 874 | 4 | LDPC BG2 |
| 12 | 4.207 | 718 | 6 | LDPC BG2 |
| 13 | 4.8926 | 835 | 6 | LDPC BG2 |
| 14 | 5.4668 | 933 | 6 | Polar |
| 15 | 5.707 | 974 | 6 | LDPC BG2 |

An adjusted table is Table 100.

TABLE 100

| Index | SE | CR | Mod | Code |
|---|---|---|---|---|
| 0 | — | — | — | — |
| 1 | 0.0684 | 35 | 2 | Polar |
| 2 | 0.1152 | 59 | 2 | Polar |
| 3 | 0.2031 | 104 | 2 | Polar |
| 4 | 0.3398 | 174 | 2 | Polar |
| 5 | 0.5566 | 285 | 2 | Polar |
| 6 | 0.8613 | 441 | 2 | Polar |
| 7 | 1.2402 | 635 | 2 | Polar |
| 8 | 1.6719 | 428 | 4 | LDPC BG2 |
| 9 | 2.2852 | 585 | 4 | LDPC BG2 |

TABLE 100-continued

| Index | SE | CR | Mod | Code |
|---|---|---|---|---|
| 10 | 2.9063 | 744 | 4 | LDPC BG2 |
| 11 | 3.4141 | 874 | 4 | LDPC BG2 |
| 12 | 4.207 | 718 | 6 | LDPC BG2 |
| 13 | 4.8926 | 835 | 6 | LDPC BG2 |
| 14 | 5.4375 | 928 | 6 | LDPC BG2 |
| 15 | 5.707 | 974 | 6 | LDPC BG2 |

4.1.3 Target BLER=$10^{-3}$

TABLE 101

| Index | SE | CR | Mod | Code |
|---|---|---|---|---|
| 0 | — | — | — | — |
| 1 | 0.0703 | 36 | 2 | Polar |
| 2 | 0.1191 | 61 | 2 | Polar |
| 3 | 0.209 | 107 | 2 | Polar |
| 4 | 0.3555 | 182 | 2 | Polar |
| 5 | 0.5801 | 297 | 2 | Polar |
| 6 | 0.916 | 469 | 2 | LDPC BG2 |
| 7 | 1.3125 | 672 | 2 | LDPC BG2 |
| 8 | 1.7344 | 444 | 4 | LDPC BG2 |
| 9 | 2.3477 | 601 | 4 | LDPC BG2 |
| 10 | 2.957 | 757 | 4 | LDPC BG2 |
| 11 | 3.498 | 597 | 6 | LDPC BG2 |
| 12 | 4.248 | 725 | 6 | LDPC BG2 |
| 13 | 4.9102 | 838 | 6 | LDPC BG2 |
| 14 | 5.4492 | 930 | 6 | LDPC BG2 |
| 15 | 5.707 | 974 | 6 | LDPC BG2 |

An adjusted table is Table 102.

TABLE 102

| Index | SE | CR | Mod | Code |
|---|---|---|---|---|
| 0 | — | — | — | — |
| 1 | 0.0703 | 36 | 2 | Polar |
| 2 | 0.1191 | 61 | 2 | Polar |
| 3 | 0.209 | 107 | 2 | Polar |
| 4 | 0.3555 | 182 | 2 | Polar |
| 5 | 0.5801 | 297 | 2 | Polar |
| 6 | 0.8945 | 458 | 2 | Polar |
| 7 | 1.2754 | 653 | 2 | Polar |
| 8 | 1.7344 | 444 | 4 | LDPC BG2 |
| 9 | 2.3477 | 601 | 4 | LDPC BG2 |
| 10 | 2.957 | 757 | 4 | LDPC BG2 |
| 11 | 3.498 | 597 | 6 | LDPC BG2 |
| 12 | 4.248 | 725 | 6 | LDPC BG2 |
| 13 | 4.9102 | 838 | 6 | LDPC BG2 |
| 14 | 5.4492 | 930 | 6 | LDPC BG2 |
| 15 | 5.707 | 974 | 6 | LDPC BG2 |

4.1.4 Target BLER=$10^{-4}$

TABLE 103

| Index | SE | CR | Mod | Code |
|---|---|---|---|---|
| 0 | — | — | — | — |
| 1 | 0.0703 | 36 | 2 | Polar |
| 2 | 0.123 | 63 | 2 | Polar |
| 3 | 0.2168 | 111 | 2 | Polar |
| 4 | 0.3691 | 189 | 2 | Polar |
| 5 | 0.6055 | 310 | 2 | Polar |
| 6 | 0.959 | 491 | 2 | LDPC BG2 |
| 7 | 1.3516 | 692 | 2 | LDPC BG2 |
| 8 | 1.8047 | 462 | 4 | LDPC BG2 |
| 9 | 2.418 | 619 | 4 | LDPC BG2 |
| 10 | 2.9766 | 762 | 4 | LDPC BG2 |
| 11 | 3.5918 | 613 | 6 | LDPC BG2 |
| 12 | 4.2832 | 731 | 6 | LDPC BG2 |
| 13 | 4.9219 | 840 | 6 | LDPC BG2 |

TABLE 103-continued

| Index | SE | CR | Mod | Code |
|---|---|---|---|---|
| 14 | 5.4727 | 934 | 6 | LDPC BG2 |
| 15 | 5.707 | 974 | 6 | LDPC BG2 |

An adjusted table is Table 104.

TABLE 104

| Index | SE | CR | Mod | Code |
|---|---|---|---|---|
| 0 | — | — | — | — |
| 1 | 0.0703 | 36 | 2 | Polar |
| 2 | 0.123 | 63 | 2 | Polar |
| 3 | 0.2168 | 111 | 2 | Polar |
| 4 | 0.3691 | 189 | 2 | Polar |
| 5 | 0.6055 | 310 | 2 | Polar |
| 6 | 0.9277 | 475 | 2 | Polar |
| 7 | 1.3105 | 671 | 2 | Polar |
| 8 | 1.8047 | 462 | 4 | LDPC BG2 |
| 9 | 2.418 | 619 | 4 | LDPC BG2 |
| 10 | 2.9766 | 762 | 4 | LDPC BG2 |
| 11 | 3.5918 | 613 | 6 | LDPC BG2 |
| 12 | 4.2832 | 731 | 6 | LDPC BG2 |
| 13 | 4.9219 | 840 | 6 | LDPC BG2 |
| 14 | 5.4727 | 934 | 6 | LDPC BG2 |
| 15 | 5.707 | 974 | 6 | LDPC BG2 |

4.1.5 Target BLER=$10^{-5}$

TABLE 105

| Index | SE | CR | Mod | Code |
|---|---|---|---|---|
| 0 | — | — | — | — |
| 1 | 0.0703 | 36 | 2 | Polar |
| 2 | 0.127 | 65 | 2 | Polar |
| 3 | 0.2227 | 114 | 2 | Polar |
| 4 | 0.3867 | 198 | 2 | Polar |
| 5 | 0.6348 | 325 | 2 | Polar |
| 6 | 1 | 512 | 2 | LDPC BG2 |
| 7 | 1.3809 | 707 | 2 | LDPC BG2 |
| 8 | 1.8945 | 485 | 4 | LDPC BG2 |
| 9 | 2.5039 | 641 | 4 | LDPC BG2 |
| 10 | 2.9766 | 762 | 4 | Polar |
| 11 | 3.6621 | 625 | 6 | LDPC BG2 |
| 12 | 4.2891 | 732 | 6 | LDPC BG2 |
| 13 | 4.9219 | 840 | 6 | Polar |
| 14 | 5.5254 | 943 | 6 | Polar |
| 15 | 5.7129 | 975 | 6 | LDPC BG2 |

An adjusted table is Table 106.

TABLE 106

| Index | SE | CR | Mod | Code |
|---|---|---|---|---|
| 0 | — | — | — | — |
| 1 | 0.0703 | 36 | 2 | Polar |
| 2 | 0.127 | 65 | 2 | Polar |
| 3 | 0.2227 | 114 | 2 | Polar |
| 4 | 0.3867 | 198 | 2 | Polar |
| 5 | 0.6348 | 325 | 2 | Polar |
| 6 | 0.9707 | 497 | 2 | Polar |
| 7 | 1.3594 | 696 | 2 | Polar |
| 8 | 1.8945 | 485 | 4 | LDPC BG2 |
| 9 | 2.5039 | 641 | 4 | LDPC BG2 |
| 10 | 2.9609 | 758 | 4 | LDPC BG2 |
| 11 | 3.6621 | 625 | 6 | LDPC BG2 |
| 12 | 4.2891 | 732 | 6 | LDPC BG2 |

TABLE 106-continued

| Index | SE | CR | Mod | Code |
|---|---|---|---|---|
| 13 | 4.8926 | 835 | 6 | LDPC BG2 |
| 14 | 5.4961 | 938 | 6 | LDPC BG2 |
| 15 | 5.7129 | 975 | 6 | LDPC BG2 |

4.1.6 Target BLER=$10^{-6}$

TABLE 107

| Index | SE | CR | Mod | Code |
|---|---|---|---|---|
| 0 | — | — | — | — |
| 1 | 0.0703 | 36 | 2 | Polar |
| 2 | 0.1289 | 66 | 2 | Polar |
| 3 | 0.2305 | 118 | 2 | Polar |
| 4 | 0.4043 | 207 | 2 | Polar |
| 5 | 0.6641 | 340 | 2 | Polar |
| 6 | 1.0156 | 520 | 2 | Polar |
| 7 | 1.4063 | 720 | 2 | Polar |
| 8 | 1.9297 | 494 | 4 | LDPC BG2 |
| 9 | 2.5156 | 644 | 4 | LDPC BG2 |
| 10 | 3.0664 | 785 | 4 | Polar |
| 11 | 3.6328 | 620 | 6 | LDPC BG2 |
| 12 | 4.3008 | 734 | 6 | Polar |
| 13 | 5.0332 | 859 | 6 | Polar |
| 14 | 5.5898 | 954 | 6 | Polar |
| 15 | 5.7363 | 979 | 6 | LDPC BG2 |

An adjusted table is Table 108.

TABLE 108

| Index | SE | CR | Mod | Code |
|---|---|---|---|---|
| 0 | — | — | — | — |
| 1 | 0.0703 | 36 | 2 | Polar |
| 2 | 0.1289 | 66 | 2 | Polar |
| 3 | 0.2305 | 118 | 2 | Polar |
| 4 | 0.4043 | 207 | 2 | Polar |
| 5 | 0.6641 | 340 | 2 | Polar |
| 6 | 1.0156 | 520 | 2 | Polar |
| 7 | 1.4063 | 720 | 2 | Polar |
| 8 | 1.9297 | 494 | 4 | LDPC BG2 |
| 9 | 2.5156 | 644 | 4 | LDPC BG2 |
| 10 | 2.9336 | 751 | 4 | LDPC BG2 |
| 11 | 3.6328 | 620 | 6 | LDPC BG2 |
| 12 | 4.2773 | 730 | 6 | LDPC BG2 |
| 13 | 4.8457 | 827 | 6 | LDPC BG2 |
| 14 | 5.4844 | 936 | 6 | LDPC BG2 |
| 15 | 5.7363 | 979 | 6 | LDPC BG2 |

4.2 Minimum code rate $R_{min}$=40/1024, and no limitation on a maximum code rate 4.2.1 Target BLER=$10^{-1}$

TABLE 109

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.2109 | 108 | 2 | Polar |
| 4 | 0.3477 | 178 | 2 | Polar |
| 5 | 0.5605 | 287 | 2 | Polar |
| 6 | 0.8613 | 441 | 2 | Polar |
| 7 | 1.2461 | 638 | 2 | LDPC BG2 |
| 8 | 1.6445 | 421 | 4 | LDPC BG2 |
| 9 | 2.2539 | 577 | 4 | LDPC BG2 |
| 10 | 2.8828 | 738 | 4 | LDPC BG2 |
| 11 | 3.418 | 875 | 4 | Polar |

TABLE 109-continued

| Index | SE | CR | Mod | Code |
|---|---|---|---|---|
| 12 | 4.1895 | 715 | 6 | LDPC BG2 |
| 13 | 4.8867 | 834 | 6 | LDPC BG2 |
| 14 | 5.502 | 939 | 6 | Polar |
| 15 | 5.707 | 974 | 6 | LDPC BG2 |

An adjusted table is Table 110.

TABLE 110

| 0 | — | — | — | — |
|---|---|---|---|---|
| 1 | 0.0781 | 40 | 2 | Polar |
| 2 | 0.127 | 65 | 2 | Polar |
| 3 | 0.2109 | 108 | 2 | Polar |
| 4 | 0.3477 | 178 | 2 | Polar |
| 5 | 0.5605 | 287 | 2 | Polar |
| 6 | 0.8613 | 441 | 2 | Polar |
| 7 | 1.2383 | 634 | 2 | Polar |
| 8 | 1.6445 | 421 | 4 | LDPC BG2 |
| 9 | 2.2539 | 577 | 4 | LDPC BG2 |
| 10 | 2.8828 | 738 | 4 | LDPC BG2 |
| 11 | 3.4023 | 871 | 4 | LDPC BG2 |
| 12 | 4.1895 | 715 | 6 | LDPC BG2 |
| 13 | 4.8867 | 834 | 6 | LDPC BG2 |
| 14 | 5.4316 | 927 | 6 | LDPC BG2 |
| 15 | 5.707 | 974 | 6 | LDPC BG2 |

4.2.2 Target BLER=$10^{-2}$

TABLE 111

| Index | SE | CR | Mod | Code |
|---|---|---|---|---|
| 0 | — | — | — | — |
| 1 | 0.0781 | 40 | 2 | Polar |
| 2 | 0.1289 | 66 | 2 | Polar |
| 3 | 0.2207 | 113 | 2 | Polar |
| 4 | 0.3652 | 187 | 2 | Polar |
| 5 | 0.5918 | 303 | 2 | Polar |
| 6 | 0.916 | 469 | 2 | LDPC BG2 |
| 7 | 1.3066 | 669 | 2 | LDPC BG2 |
| 8 | 1.7266 | 442 | 4 | LDPC BG2 |
| 9 | 2.3359 | 598 | 4 | LDPC BG2 |
| 10 | 2.9453 | 754 | 4 | LDPC BG2 |
| 11 | 3.4805 | 594 | 6 | LDPC BG2 |
| 12 | 4.2363 | 723 | 6 | LDPC BG2 |
| 13 | 4.9043 | 837 | 6 | LDPC BG2 |
| 14 | 5.4727 | 934 | 6 | Polar |
| 15 | 5.707 | 974 | 6 | LDPC BG2 |

An adjusted table is Table 112.

TABLE 112

| Index | SE | CR | Mod | Code |
|---|---|---|---|---|
| 0 | — | — | — | — |
| 1 | 0.0781 | 40 | 2 | Polar |
| 2 | 0.1289 | 66 | 2 | Polar |
| 3 | 0.2207 | 113 | 2 | Polar |
| 4 | 0.3652 | 187 | 2 | Polar |
| 5 | 0.5918 | 303 | 2 | Polar |
| 6 | 0.9023 | 462 | 2 | Polar |
| 7 | 1.2813 | 656 | 2 | Polar |
| 8 | 1.7266 | 442 | 4 | LDPC BG2 |
| 9 | 2.3359 | 598 | 4 | LDPC BG2 |
| 10 | 2.9453 | 754 | 4 | LDPC BG2 |
| 11 | 3.4805 | 594 | 6 | LDPC BG2 |

TABLE 112-continued

| Index | SE | CR | Mod | Code |
|---|---|---|---|---|
| 12 | 4.2363 | 723 | 6 | LDPC BG2 |
| 13 | 4.9043 | 837 | 6 | LDPC BG2 |
| 14 | 5.4434 | 929 | 6 | LDPC BG2 |
| 15 | 5.707 | 974 | 6 | LDPC BG2 |

4.2.3 Target BLER=$10^{-3}$

TABLE 113

| Index | SE | CR | Mod | Code |
|---|---|---|---|---|
| 0 | — | — | — | — |
| 1 | 0.0781 | 40 | 2 | Polar |
| 2 | 0.1387 | 71 | 2 | Polar |
| 3 | 0.2344 | 120 | 2 | Polar |
| 4 | 0.3945 | 202 | 2 | Polar |
| 5 | 0.6328 | 324 | 2 | Polar |
| 6 | 0.9805 | 502 | 2 | LDPC BG2 |
| 7 | 1.3691 | 701 | 2 | LDPC BG2 |
| 8 | 1.8125 | 464 | 4 | LDPC BG2 |
| 9 | 2.418 | 619 | 4 | LDPC BG2 |
| 10 | 3.0078 | 770 | 4 | LDPC BG2 |
| 11 | 3.5566 | 607 | 6 | LDPC BG2 |
| 12 | 4.2891 | 732 | 6 | LDPC BG2 |
| 13 | 4.9277 | 841 | 6 | LDPC BG2 |
| 14 | 5.4609 | 932 | 6 | LDPC BG2 |
| 15 | 5.707 | 974 | 6 | LDPC BG2 |

An adjusted table is Table 114.

TABLE 114

| Index | SE | CR | Mod | Code |
|---|---|---|---|---|
| 0 | — | — | — | — |
| 1 | 0.0781 | 40 | 2 | Polar |
| 2 | 0.1387 | 71 | 2 | Polar |
| 3 | 0.2344 | 120 | 2 | Polar |
| 4 | 0.3945 | 202 | 2 | Polar |
| 5 | 0.6328 | 324 | 2 | Polar |
| 6 | 0.9551 | 489 | 2 | Polar |
| 7 | 1.3320 | 682 | 2 | Polar |
| 8 | 1.8125 | 464 | 4 | LDPC BG2 |
| 9 | 2.418 | 619 | 4 | LDPC BG2 |
| 10 | 3.0078 | 770 | 4 | LDPC BG2 |
| 11 | 3.5566 | 607 | 6 | LDPC BG2 |
| 12 | 4.2891 | 732 | 6 | LDPC BG2 |
| 13 | 4.9277 | 841 | 6 | LDPC BG2 |
| 14 | 5.4609 | 932 | 6 | LDPC BG2 |
| 15 | 5.707 | 974 | 6 | LDPC BG2 |

4.2.4 Target BLER=$10^{-4}$

TABLE 115

| Index | SE | CR | Mod | Code |
|---|---|---|---|---|
| 0 | — | — | — | — |
| 1 | 0.0781 | 40 | 2 | Polar |
| 2 | 0.1426 | 73 | 2 | Polar |
| 3 | 0.2422 | 124 | 2 | Polar |
| 4 | 0.4102 | 210 | 2 | Polar |
| 5 | 0.6621 | 339 | 2 | LDPC BG2 |
| 6 | 1.0254 | 525 | 2 | LDPC BG2 |
| 7 | 1.4043 | 719 | 2 | LDPC BG2 |
| 8 | 1.8789 | 481 | 4 | LDPC BG2 |
| 9 | 2.4844 | 636 | 4 | LDPC BG2 |
| 10 | 3.0117 | 771 | 4 | LDPC BG2 |

TABLE 115-continued

| Index | SE | CR | Mod | Code |
|---|---|---|---|---|
| 11 | 3.6328 | 620 | 6 | LDPC BG2 |
| 12 | 4.3066 | 735 | 6 | LDPC BG2 |
| 13 | 4.9453 | 844 | 6 | LDPC BG2 |
| 14 | 5.4844 | 936 | 6 | LDPC BG2 |
| 15 | 5.707 | 974 | 6 | LDPC BG2 |

An adjusted table is Table 116.

TABLE 116

| Index | SE | CR | Mod | Code |
|---|---|---|---|---|
| 0 | — | — | — | — |
| 1 | 0.0781 | 40 | 2 | Polar |
| 2 | 0.1426 | 73 | 2 | Polar |
| 3 | 0.2422 | 124 | 2 | Polar |
| 4 | 0.4102 | 210 | 2 | Polar |
| 5 | 0.6582 | 337 | 2 | Polar |
| 6 | 0.9883 | 506 | 2 | Polar |
| 7 | 1.3672 | 700 | 2 | Polar |
| 8 | 1.8789 | 481 | 4 | LDPC BG2 |
| 9 | 2.4844 | 636 | 4 | LDPC BG2 |
| 10 | 3.0117 | 771 | 4 | LDPC BG2 |
| 11 | 3.6328 | 620 | 6 | LDPC BG2 |
| 12 | 4.3066 | 735 | 6 | LDPC BG2 |
| 13 | 4.9453 | 844 | 6 | LDPC BG2 |
| 14 | 5.4844 | 936 | 6 | LDPC BG2 |
| 15 | 5.707 | 974 | 6 | LDPC BG2 |

4.2.5 Target BLER=$10^{-5}$

TABLE 117

| Index | SE | CR | Mod | Code |
|---|---|---|---|---|
| 0 | — | — | — | — |
| 1 | 0.0781 | 40 | 2 | Polar |
| 2 | 0.1484 | 76 | 2 | Polar |
| 3 | 0.2578 | 132 | 2 | Polar |
| 4 | 0.4355 | 223 | 2 | Polar |
| 5 | 0.7012 | 359 | 2 | LDPC BG2 |
| 6 | 1.0762 | 551 | 2 | LDPC BG2 |
| 7 | 1.4336 | 734 | 2 | LDPC BG2 |
| 8 | 1.9883 | 509 | 4 | LDPC BG2 |
| 9 | 2.5781 | 660 | 4 | LDPC BG2 |
| 10 | 3.043 | 779 | 4 | Polar |
| 11 | 3.709 | 633 | 6 | LDPC BG2 |
| 12 | 4.3008 | 734 | 6 | LDPC BG2 |
| 13 | 4.9512 | 845 | 6 | Polar |
| 14 | 5.5313 | 944 | 6 | Polar |
| 15 | 5.7129 | 975 | 6 | LDPC BG2 |

An adjusted table is Table 118.

TABLE 118

| Index | SE | CR | Mod | Code |
|---|---|---|---|---|
| 0 | — | — | — | — |
| 1 | 0.0781 | 40 | 2 | Polar |
| 2 | 0.1484 | 76 | 2 | Polar |
| 3 | 0.2578 | 132 | 2 | Polar |
| 4 | 0.4355 | 223 | 2 | Polar |
| 5 | 0.6992 | 358 | 2 | Polar |
| 6 | 1.0449 | 535 | 2 | Polar |
| 7 | 1.4238 | 729 | 2 | Polar |
| 8 | 1.9883 | 509 | 4 | LDPC BG2 |
| 9 | 2.5781 | 660 | 4 | LDPC BG2 |
| 10 | 2.9961 | 767 | 4 | LDPC BG2 |
| 11 | 3.709 | 633 | 6 | LDPC BG2 |
| 12 | 4.3008 | 734 | 6 | LDPC BG2 |
| 13 | 4.9277 | 841 | 6 | LDPC BG2 |

TABLE 118-continued

| Index | SE | CR | Mod | Code |
|---|---|---|---|---|
| 14 | 5.5020 | 939 | 6 | LDPC BG2 |
| 15 | 5.7129 | 975 | 6 | LDPC BG2 |

4.2.6 Target BLER=$10^{-6}$

TABLE 119

| Index | SE | CR | Mod | Code |
|---|---|---|---|---|
| 0 | — | — | — | — |
| 1 | 0.0781 | 40 | 2 | Polar |
| 2 | 0.1523 | 78 | 2 | Polar |
| 3 | 0.2695 | 138 | 2 | Polar |
| 4 | 0.459 | 235 | 2 | Polar |
| 5 | 0.7344 | 376 | 2 | Polar |
| 6 | 1.0957 | 561 | 2 | LDPC BG2 |
| 7 | 1.4766 | 378 | 4 | LDPC BG2 |
| 8 | 2.0352 | 521 | 4 | LDPC BG2 |
| 9 | 2.5859 | 662 | 4 | LDPC BG2 |
| 10 | 3.1328 | 802 | 4 | Polar |
| 11 | 3.6797 | 628 | 6 | LDPC BG2 |
| 12 | 4.3535 | 743 | 6 | Polar |
| 13 | 5.0625 | 864 | 6 | Polar |
| 14 | 5.6016 | 956 | 6 | Polar |
| 15 | 5.7363 | 979 | 6 | LDPC BG2 |

An adjusted table is Table 120.

TABLE 120

| Index | SE | CR | Mod | Code |
|---|---|---|---|---|
| 0 | — | — | — | — |
| 1 | 0.0781 | 40 | 2 | Polar |
| 2 | 0.1523 | 78 | 2 | Polar |
| 3 | 0.2695 | 138 | 2 | Polar |
| 4 | 0.459 | 235 | 2 | Polar |
| 5 | 0.7344 | 376 | 2 | Polar |
| 6 | 1.0918 | 559 | 2 | Polar |
| 7 | 1.4766 | 378 | 4 | LDPC BG2 |
| 8 | 2.0352 | 521 | 4 | LDPC BG2 |
| 9 | 2.5859 | 662 | 4 | LDPC BG2 |
| 10 | 2.9766 | 762 | 4 | LDPC BG2 |
| 11 | 3.6797 | 628 | 6 | LDPC BG2 |
| 12 | 4.2949 | 733 | 6 | LDPC BG2 |
| 13 | 4.8867 | 834 | 6 | LDPC BG2 |
| 14 | 5.4961 | 938 | 6 | LDPC BG2 |
| 15 | 5.7363 | 979 | 6 | LDPC BG2 |

4.3 No limitation on a minimum code rate, and a maximum code rate $R_{max}=2/3$ 4.3.1 Target BLER=$10^{-1}$

TABLE 121

| Index | SE | CR | Mod | Code |
|---|---|---|---|---|
| 0 | — | — | — | — |
| 1 | 0.0684 | 35 | 2 | Polar |
| 2 | 0.0996 | 51 | 2 | Polar |
| 3 | 0.1543 | 79 | 2 | Polar |
| 4 | 0.2266 | 116 | 2 | Polar |
| 5 | 0.334 | 171 | 2 | Polar |
| 6 | 0.4902 | 251 | 2 | Polar |
| 7 | 0.6973 | 357 | 2 | Polar |
| 8 | 0.9609 | 492 | 2 | Polar |
| 9 | 1.2715 | 651 | 2 | LDPC BG2 |
| 10 | 1.5645 | 801 | 2 | LDPC BG2 |
| 11 | 2.0156 | 516 | 4 | LDPC BG2 |

TABLE 121-continued

| Index | SE | CR | Mod | Code |
|---|---|---|---|---|
| 12 | 2.5117 | 643 | 4 | LDPC BG2 |
| 13 | 2.9961 | 767 | 4 | LDPC BG2 |
| 14 | 3.4063 | 872 | 4 | Polar |
| 15 | 4.002 | 683 | 6 | LDPC BG2 |

An adjusted table is Table 122.

TABLE 122

| Index | SE | CR | Mod | Code |
|---|---|---|---|---|
| 0 | — | — | — | — |
| 1 | 0.0684 | 35 | 2 | Polar |
| 2 | 0.0996 | 51 | 2 | Polar |
| 3 | 0.1543 | 79 | 2 | Polar |
| 4 | 0.2266 | 116 | 2 | Polar |
| 5 | 0.334 | 171 | 2 | Polar |
| 6 | 0.4902 | 251 | 2 | Polar |
| 7 | 0.6973 | 357 | 2 | Polar |
| 8 | 0.9609 | 492 | 2 | Polar |
| 9 | 1.2617 | 646 | 2 | Polar |
| 10 | 1.5605 | 799 | 2 | Polar |
| 11 | 2.0156 | 516 | 4 | LDPC BG2 |
| 12 | 2.5117 | 643 | 4 | LDPC BG2 |
| 13 | 2.9961 | 767 | 4 | LDPC BG2 |
| 14 | 3.3906 | 868 | 4 | LDPC BG2 |
| 15 | 4.002 | 683 | 6 | LDPC BG2 |

4.3.2 Target BLER=$10^{-2}$

TABLE 123

| Index | SE | CR | Mod | Code |
|---|---|---|---|---|
| 0 | — | — | — | — |
| 1 | 0.0684 | 35 | 2 | Polar |
| 2 | 0.1016 | 52 | 2 | Polar |
| 3 | 0.1582 | 81 | 2 | Polar |
| 4 | 0.2363 | 121 | 2 | Polar |
| 5 | 0.3516 | 180 | 2 | Polar |
| 6 | 0.5137 | 263 | 2 | Polar |
| 7 | 0.7266 | 372 | 2 | Polar |
| 8 | 1.0098 | 517 | 2 | LDPC BG2 |
| 9 | 1.3164 | 674 | 2 | LDPC BG2 |
| 10 | 1.6094 | 412 | 4 | LDPC BG2 |
| 11 | 2.0703 | 530 | 4 | LDPC BG2 |
| 12 | 2.5547 | 654 | 4 | LDPC BG2 |
| 13 | 3.0195 | 773 | 4 | LDPC BG2 |
| 14 | 3.3984 | 870 | 4 | LDPC BG2 |
| 15 | 4.002 | 683 | 6 | LDPC BG2 |

An adjusted table is Table 124.

TABLE 124

| Index | SE | CR | Mod | Code |
|---|---|---|---|---|
| 0 | — | — | — | — |
| 1 | 0.0684 | 35 | 2 | Polar |
| 2 | 0.1016 | 52 | 2 | Polar |
| 3 | 0.1582 | 81 | 2 | Polar |
| 4 | 0.2363 | 121 | 2 | Polar |
| 5 | 0.3516 | 180 | 2 | Polar |
| 6 | 0.5137 | 263 | 2 | Polar |
| 7 | 0.7266 | 372 | 2 | Polar |
| 8 | 0.9922 | 508 | 2 | Polar |
| 9 | 1.2910 | 661 | 2 | Polar |
| 10 | 1.6094 | 412 | 4 | LDPC BG2 |
| 11 | 2.0703 | 530 | 4 | LDPC BG2 |
| 12 | 2.5547 | 654 | 4 | LDPC BG2 |

TABLE 124-continued

| Index | SE | CR | Mod | Code |
|---|---|---|---|---|
| 13 | 3.0195 | 773 | 4 | LDPC BG2 |
| 14 | 3.3984 | 870 | 4 | LDPC BG2 |
| 15 | 4.002 | 683 | 6 | LDPC BG2 |

4.3.3 Target BLER=$10^{-3}$

TABLE 125

| Index | SE | CR | Mod | Code |
|---|---|---|---|---|
| 0 | — | — | — | — |
| 1 | 0.0703 | 36 | 2 | Polar |
| 2 | 0.1035 | 53 | 2 | Polar |
| 3 | 0.1621 | 83 | 2 | Polar |
| 4 | 0.2422 | 124 | 2 | Polar |
| 5 | 0.3633 | 186 | 2 | Polar |
| 6 | 0.5313 | 272 | 2 | Polar |
| 7 | 0.7578 | 388 | 2 | LDPC BG2 |
| 8 | 1.0449 | 535 | 2 | LDPC BG2 |
| 9 | 1.3477 | 690 | 2 | LDPC BG2 |
| 10 | 1.6523 | 423 | 4 | LDPC BG2 |
| 11 | 2.1094 | 540 | 4 | LDPC BG2 |
| 12 | 2.582 | 661 | 4 | LDPC BG2 |
| 13 | 3.0313 | 776 | 4 | LDPC BG2 |
| 14 | 3.3984 | 870 | 4 | LDPC BG2 |
| 15 | 4.002 | 683 | 6 | LDPC BG2 |

An adjusted table is Table 126.

TABLE 126

| Index | SE | CR | Mod | Code |
|---|---|---|---|---|
| 0 | — | — | — | — |
| 1 | 0.0703 | 36 | 2 | Polar |
| 2 | 0.1035 | 53 | 2 | Polar |
| 3 | 0.1621 | 83 | 2 | Polar |
| 4 | 0.2422 | 124 | 2 | Polar |
| 5 | 0.3633 | 186 | 2 | Polar |
| 6 | 0.5313 | 272 | 2 | Polar |
| 7 | 0.7480 | 383 | 2 | Polar |
| 8 | 1.0156 | 520 | 2 | Polar |
| 9 | 1.3477 | 690 | 2 | Polar |
| 10 | 1.6523 | 423 | 4 | LDPC BG2 |
| 11 | 2.1094 | 540 | 4 | LDPC BG2 |
| 12 | 2.582 | 661 | 4 | LDPC BG2 |
| 13 | 3.0313 | 776 | 4 | LDPC BG2 |
| 14 | 3.3984 | 870 | 4 | LDPC BG2 |
| 15 | 4.002 | 683 | 6 | LDPC BG2 |

4.3.4 Target BLER=$10^{-4}$

TABLE 127

| Index | SE | CR | Mod | Code |
|---|---|---|---|---|
| 0 | — | — | — | — |
| 1 | 0.0703 | 36 | 2 | Polar |
| 2 | 0.1055 | 54 | 2 | Polar |
| 3 | 0.166 | 85 | 2 | Polar |
| 4 | 0.248 | 127 | 2 | Polar |
| 5 | 0.3711 | 190 | 2 | Polar |
| 6 | 0.543 | 278 | 2 | Polar |
| 7 | 0.7793 | 399 | 2 | LDPC BG2 |
| 8 | 1.0684 | 547 | 2 | LDPC BG2 |
| 9 | 1.3613 | 697 | 2 | LDPC BG2 |
| 10 | 1.6758 | 429 | 4 | LDPC BG2 |
| 11 | 2.1328 | 546 | 4 | LDPC BG2 |

TABLE 127-continued

| Index | SE | CR | Mod | Code |
|---|---|---|---|---|
| 12 | 2.5938 | 664 | 4 | LDPC BG2 |
| 13 | 2.9961 | 767 | 4 | LDPC BG2 |
| 14 | 3.3516 | 858 | 4 | Polar |
| 15 | 4.002 | 683 | 6 | LDPC BG2 |

An adjusted table is Table 128.

TABLE 128

| Index | SE | CR | Mod | Code |
|---|---|---|---|---|
| 0 | — | — | — | — |
| 1 | 0.0703 | 36 | 2 | Polar |
| 2 | 0.1055 | 54 | 2 | Polar |
| 3 | 0.166 | 85 | 2 | Polar |
| 4 | 0.248 | 127 | 2 | Polar |
| 5 | 0.3711 | 190 | 2 | Polar |
| 6 | 0.543 | 278 | 2 | Polar |
| 7 | 0.7617 | 390 | 2 | Polar |
| 8 | 1.0293 | 527 | 2 | Polar |
| 9 | 1.3203 | 676 | 2 | Polar |
| 10 | 1.6758 | 429 | 4 | LDPC BG2 |
| 11 | 2.1328 | 546 | 4 | LDPC BG2 |
| 12 | 2.5938 | 664 | 4 | LDPC BG2 |
| 13 | 2.9961 | 767 | 4 | LDPC BG2 |
| 14 | 3.3438 | 856 | 4 | LDPC BG2 |
| 15 | 4.002 | 683 | 6 | LDPC BG2 |

4.3.5 Target BLER=$10^{-5}$

TABLE 129

| Index | SE | CR | Mod | Code |
|---|---|---|---|---|
| 0 | — | — | — | — |
| 1 | 0.0703 | 36 | 2 | Polar |
| 2 | 0.1074 | 55 | 2 | Polar |
| 3 | 0.168 | 86 | 2 | Polar |
| 4 | 0.2539 | 130 | 2 | Polar |
| 5 | 0.3809 | 195 | 2 | Polar |
| 6 | 0.5547 | 284 | 2 | Polar |
| 7 | 0.7891 | 404 | 2 | LDPC BG2 |
| 8 | 1.0801 | 553 | 2 | LDPC BG2 |
| 9 | 1.3613 | 697 | 2 | LDPC BG2 |
| 10 | 1.6992 | 435 | 4 | LDPC BG2 |
| 11 | 2.1602 | 553 | 4 | LDPC BG2 |
| 12 | 2.6016 | 666 | 4 | LDPC BG2 |
| 13 | 2.9336 | 751 | 4 | LDPC BG2 |
| 14 | 3.3555 | 859 | 4 | Polar |
| 15 | 4.002 | 683 | 6 | LDPC BG2 |

An adjusted table is Table 130.

TABLE 130

| Index | SE | CR | Mod | Code |
|---|---|---|---|---|
| 0 | — | — | — | — |
| 1 | 0.0703 | 36 | 2 | Polar |
| 2 | 0.1074 | 55 | 2 | Polar |
| 3 | 0.168 | 86 | 2 | Polar |
| 4 | 0.2539 | 130 | 2 | Polar |
| 5 | 0.3809 | 195 | 2 | Polar |
| 6 | 0.5547 | 284 | 2 | Polar |
| 7 | 0.7891 | 399 | 2 | Polar |
| 8 | 1.0469 | 536 | 2 | Polar |
| 9 | 1.3379 | 685 | 2 | Polar |
| 10 | 1.6992 | 435 | 4 | LDPC BG2 |
| 11 | 2.1602 | 553 | 4 | LDPC BG2 |
| 12 | 2.6016 | 666 | 4 | LDPC BG2 |
| 13 | 2.9336 | 751 | 4 | LDPC BG2 |
| 14 | 3.2344 | 828 | 4 | LDPC BG2 |
| 15 | 4.002 | 683 | 6 | LDPC BG2 |

4.3.6 Target BLER=$10^{-6}$

TABLE 131

| Index | SE | CR | Mod | Code |
|---|---|---|---|---|
| 0 | — | — | — | — |
| 1 | 0.0703 | 36 | 2 | Polar |
| 2 | 0.1113 | 57 | 2 | Polar |
| 3 | 0.1719 | 88 | 2 | Polar |
| 4 | 0.2656 | 136 | 2 | Polar |
| 5 | 0.4023 | 206 | 2 | Polar |
| 6 | 0.5859 | 300 | 2 | Polar |
| 7 | 0.8262 | 423 | 2 | Polar |
| 8 | 1.1094 | 568 | 2 | LDPC BG2 |
| 9 | 1.4004 | 717 | 2 | Polar |
| 10 | 1.7227 | 441 | 4 | LDPC BG2 |
| 11 | 2.2227 | 569 | 4 | LDPC BG2 |
| 12 | 2.6328 | 674 | 4 | LDPC BG2 |
| 13 | 3.0469 | 780 | 4 | Polar |
| 14 | 3.6035 | 615 | 6 | LDPC BG2 |
| 15 | 3.9961 | 682 | 6 | LDPC BG2 |

An adjusted table is Table 132.

TABLE 132

| Index | SE | CR | Mod | Code |
|---|---|---|---|---|
| 0 | — | — | — | — |
| 1 | 0.0703 | 36 | 2 | Polar |
| 2 | 0.1113 | 57 | 2 | Polar |
| 3 | 0.1719 | 88 | 2 | Polar |
| 4 | 0.2656 | 136 | 2 | Polar |
| 5 | 0.4023 | 206 | 2 | Polar |
| 6 | 0.5859 | 300 | 2 | Polar |
| 7 | 0.8262 | 423 | 2 | Polar |
| 8 | 1.1055 | 566 | 2 | Polar |
| 9 | 1.4004 | 717 | 2 | Polar |
| 10 | 1.7227 | 441 | 4 | LDPC BG2 |
| 11 | 2.2227 | 569 | 4 | LDPC BG2 |
| 12 | 2.6328 | 674 | 4 | LDPC BG2 |
| 13 | 2.9258 | 749 | 4 | LDPC BG2 |
| 14 | 3.6035 | 615 | 6 | LDPC BG2 |
| 15 | 3.9961 | 682 | 6 | LDPC BG2 |

4.4 Minimum code rate $R_{min}$=40/1024, and maximum code rate $R_{max}$=2/3

4.4.1 Target BLER=$10^{-1}$

TABLE 133

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.168 | 86 | 2 | Polar |
| 4 | 0.2441 | 125 | 2 | Polar |
| 5 | 0.3594 | 184 | 2 | Polar |
| 6 | 0.5215 | 267 | 2 | Polar |
| 7 | 0.7324 | 375 | 2 | Polar |
| 8 | 0.998 | 511 | 2 | LDPC BG2 |
| 9 | 1.3066 | 669 | 2 | LDPC BG2 |
| 10 | 1.5938 | 408 | 4 | LDPC BG2 |
| 11 | 2.0508 | 525 | 4 | LDPC BG2 |

TABLE 133-continued

| Index | SE | CR | Mod | Code |
|---|---|---|---|---|
| 12 | 2.5391 | 650 | 4 | LDPC BG2 |
| 13 | 3.0117 | 771 | 4 | LDPC BG2 |
| 14 | 3.4141 | 874 | 4 | Polar |
| 15 | 4.002 | 683 | 6 | LDPC BG2 |

An adjusted table is Table 134.

TABLE 134

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.168 | 86 | 2 | Polar |
| 4 | 0.2441 | 125 | 2 | Polar |
| 5 | 0.3594 | 184 | 2 | Polar |
| 6 | 0.5215 | 267 | 2 | Polar |
| 7 | 0.7324 | 375 | 2 | Polar |
| 8 | 0.998 | 511 | 2 | Polar |
| 9 | 1.2969 | 664 | 2 | Polar |
| 10 | 1.5938 | 408 | 4 | LDPC BG2 |
| 11 | 2.0508 | 525 | 4 | LDPC BG2 |
| 12 | 2.5391 | 650 | 4 | LDPC BG2 |
| 13 | 3.0117 | 771 | 4 | LDPC BG2 |
| 14 | 3.3945 | 869 | 4 | LDPC BG2 |
| 15 | 4.002 | 683 | 6 | LDPC BG2 |

4.4.2 Target BLER=$10^{-2}$

TABLE 135

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.1738 | 89 | 2 | Polar |
| 4 | 0.2539 | 130 | 2 | Polar |
| 5 | 0.375 | 192 | 2 | Polar |
| 6 | 0.543 | 278 | 2 | Polar |
| 7 | 0.7637 | 391 | 2 | LDPC BG2 |
| 8 | 1.0469 | 536 | 2 | LDPC BG2 |
| 9 | 1.3477 | 690 | 2 | LDPC BG2 |
| 10 | 1.6484 | 422 | 4 | LDPC BG2 |
| 11 | 2.1055 | 539 | 4 | LDPC BG2 |
| 12 | 2.5781 | 660 | 4 | LDPC BG2 |
| 13 | 3.0352 | 777 | 4 | LDPC BG2 |
| 14 | 3.4023 | 871 | 4 | LDPC BG2 |
| 15 | 4.002 | 683 | 6 | LDPC BG2 |

An adjusted table is Table 136.

TABLE 136

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.1738 | 89 | 2 | Polar |
| 4 | 0.2539 | 130 | 2 | Polar |
| 5 | 0.375 | 192 | 2 | Polar |
| 6 | 0.543 | 278 | 2 | Polar |
| 7 | 0.7598 | 389 | 2 | Polar |
| 8 | 1.0273 | 526 | 2 | Polar |
| 9 | 1.3223 | 677 | 2 | Polar |
| 10 | 1.6484 | 422 | 4 | LDPC BG2 |
| 11 | 2.1055 | 539 | 4 | LDPC BG2 |
| 12 | 2.5781 | 660 | 4 | LDPC BG2 |

TABLE 136-continued

| Index | SE | CR | Mod | Code |
|---|---|---|---|---|
| 13 | 3.0352 | 777 | 4 | LDPC BG2 |
| 14 | 3.4023 | 871 | 4 | LDPC BG2 |
| 15 | 4.002 | 683 | 6 | LDPC BG2 |

4.4.3 Target BLER=$10^{-3}$

TABLE 137

| Index | SE | CR | Mod | Code |
|---|---|---|---|---|
| 0 | — | — | — | — |
| 1 | 0.0781 | 40 | 2 | Polar |
| 2 | 0.1191 | 61 | 2 | Polar |
| 3 | 0.1836 | 94 | 2 | Polar |
| 4 | 0.2715 | 139 | 2 | Polar |
| 5 | 0.4004 | 205 | 2 | Polar |
| 6 | 0.5742 | 294 | 2 | Polar |
| 7 | 0.8125 | 416 | 2 | LDPC BG2 |
| 8 | 1.0977 | 562 | 2 | LDPC BG2 |
| 9 | 1.3906 | 712 | 2 | LDPC BG2 |
| 10 | 1.707 | 437 | 4 | LDPC BG2 |
| 11 | 2.1563 | 552 | 4 | LDPC BG2 |
| 12 | 2.6172 | 670 | 4 | LDPC BG2 |
| 13 | 3.0508 | 781 | 4 | LDPC BG2 |
| 14 | 3.4063 | 872 | 4 | LDPC BG2 |
| 15 | 4.002 | 683 | 6 | LDPC BG2 |

An adjusted table is Table 138.

TABLE 138

| Index | SE | CR | Mod | Code |
|---|---|---|---|---|
| 0 | — | — | — | — |
| 1 | 0.0781 | 40 | 2 | Polar |
| 2 | 0.1191 | 61 | 2 | Polar |
| 3 | 0.1836 | 94 | 2 | Polar |
| 4 | 0.2715 | 139 | 2 | Polar |
| 5 | 0.4004 | 205 | 2 | Polar |
| 6 | 0.5742 | 294 | 2 | Polar |
| 7 | 0.7969 | 408 | 2 | Polar |
| 8 | 1.0645 | 545 | 2 | Polar |
| 9 | 1.3535 | 693 | 2 | Polar |
| 10 | 1.707 | 437 | 4 | LDPC BG2 |
| 11 | 2.1563 | 552 | 4 | LDPC BG2 |
| 12 | 2.6172 | 670 | 4 | LDPC BG2 |
| 13 | 3.0508 | 781 | 4 | LDPC BG2 |
| 14 | 3.4063 | 872 | 4 | LDPC BG2 |
| 15 | 4.002 | 683 | 6 | LDPC BG2 |

An adjusted table is Table 139.

TABLE 139

| Index | SE | CR | Mod | Code |
|---|---|---|---|---|
| 0 | — | — | — | — |
| 1 | 0.0781 | 40 | 2 | Polar |
| 2 | 0.123 | 63 | 2 | Polar |
| 3 | 0.1875 | 96 | 2 | Polar |
| 4 | 0.2773 | 142 | 2 | Polar |
| 5 | 0.4102 | 210 | 2 | Polar |
| 6 | 0.5859 | 300 | 2 | Polar |
| 7 | 0.832 | 426 | 2 | LDPC BG2 |
| 8 | 1.1211 | 574 | 2 | LDPC BG2 |
| 9 | 1.4004 | 717 | 2 | LDPC BG2 |
| 10 | 1.7305 | 443 | 4 | LDPC BG2 |
| 11 | 2.1797 | 558 | 4 | LDPC BG2 |

TABLE 139-continued

| Index | SE | CR | Mod | Code |
|---|---|---|---|---|
| 12 | 2.6289 | 673 | 4 | LDPC BG2 |
| 13 | 3.0078 | 770 | 4 | LDPC BG2 |
| 14 | 3.3594 | 860 | 4 | Polar |
| 15 | 4.002 | 683 | 6 | LDPC BG2 |

An adjusted table is Table 140.

TABLE 140

| Index | SE | CR | Mod | Code |
|---|---|---|---|---|
| 0 | — | — | — | — |
| 1 | 0.0781 | 40 | 2 | Polar |
| 2 | 0.123 | 63 | 2 | Polar |
| 3 | 0.1875 | 96 | 2 | Polar |
| 4 | 0.2773 | 142 | 2 | Polar |
| 5 | 0.4102 | 210 | 2 | Polar |
| 6 | 0.5859 | 300 | 2 | Polar |
| 7 | 0.8105 | 415 | 2 | Polar |
| 8 | 1.0781 | 552 | 2 | Polar |
| 9 | 1.3633 | 698 | 2 | Polar |
| 10 | 1.7305 | 443 | 4 | LDPC BG2 |
| 11 | 2.1797 | 558 | 4 | LDPC BG2 |
| 12 | 2.6289 | 673 | 4 | LDPC BG2 |
| 13 | 3.0078 | 770 | 4 | LDPC BG2 |
| 14 | 3.3555 | 859 | 4 | LDPC BG2 |
| 15 | 4.002 | 683 | 6 | LDPC BG2 |

4.4.4 Target BLER=$10^{-4}$

TABLE 141

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.1934 | 99 | 2 | Polar |
| 4 | 0.2891 | 148 | 2 | Polar |
| 5 | 0.4258 | 218 | 2 | Polar |
| 6 | 0.6074 | 311 | 2 | Polar |
| 7 | 0.8535 | 437 | 2 | LDPC BG2 |
| 8 | 1.1406 | 584 | 2 | LDPC BG2 |
| 9 | 1.4023 | 718 | 2 | LDPC BG2 |
| 10 | 1.7656 | 452 | 4 | LDPC BG2 |
| 11 | 2.2109 | 566 | 4 | LDPC BG2 |
| 12 | 2.6367 | 675 | 4 | LDPC BG2 |
| 13 | 2.9531 | 756 | 4 | Polar |
| 14 | 3.4512 | 589 | 6 | LDPC BG2 |
| 15 | 4.002 | 683 | 6 | LDPC BG2 |

An adjusted table is Table 142.

TABLE 142

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.1934 | 99 | 2 | Polar |
| 4 | 0.2891 | 148 | 2 | Polar |
| 5 | 0.4258 | 218 | 2 | Polar |
| 6 | 0.6074 | 311 | 2 | Polar |
| 7 | 0.8359 | 428 | 2 | Polar |
| 8 | 1.1055 | 566 | 2 | Polar |
| 9 | 1.3867 | 710 | 2 | Polar |
| 10 | 1.7656 | 452 | 4 | LDPC BG2 |
| 11 | 2.2109 | 566 | 4 | LDPC BG2 |

TABLE 142-continued

| Index | SE | CR | Mod | Code |
|---|---|---|---|---|
| 12 | 2.6367 | 675 | 4 | LDPC BG2 |
| 13 | 2.9453 | 754 | 4 | LDPC BG2 |
| 14 | 3.4512 | 589 | 6 | LDPC BG2 |
| 15 | 4.002 | 683 | 6 | LDPC BG2 |

4.4.5 Target BLER=$10^{-5}$

TABLE 143

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.1934 | 99 | 2 | Polar |
| 4 | 0.2891 | 148 | 2 | Polar |
| 5 | 0.4258 | 218 | 2 | Polar |
| 6 | 0.6074 | 311 | 2 | Polar |
| 7 | 0.8535 | 437 | 2 | LDPC BG2 |
| 8 | 1.1406 | 584 | 2 | LDPC BG2 |
| 9 | 1.4023 | 718 | 2 | LDPC BG2 |
| 10 | 1.7656 | 452 | 4 | LDPC BG2 |
| 11 | 2.2109 | 566 | 4 | LDPC BG2 |
| 12 | 2.6367 | 675 | 4 | LDPC BG2 |
| 13 | 2.9531 | 756 | 4 | Polar |
| 14 | 3.4512 | 589 | 6 | LDPC BG2 |
| 15 | 4.002 | 683 | 6 | LDPC BG2 |

An adjusted table is Table 144.

TABLE 144

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.1934 | 99 | 2 | Polar |
| 4 | 0.2891 | 148 | 2 | Polar |
| 5 | 0.4258 | 218 | 2 | Polar |
| 6 | 0.6074 | 311 | 2 | Polar |
| 7 | 0.8359 | 428 | 2 | Polar |
| 8 | 1.1055 | 566 | 2 | Polar |
| 9 | 1.3867 | 710 | 2 | Polar |
| 10 | 1.7656 | 452 | 4 | LDPC BG2 |
| 11 | 2.2109 | 566 | 4 | LDPC BG2 |
| 12 | 2.6367 | 675 | 4 | LDPC BG2 |
| 13 | 2.9453 | 754 | 4 | LDPC BG2 |
| 14 | 3.4512 | 589 | 6 | LDPC BG2 |
| 15 | 4.002 | 683 | 6 | LDPC BG2 |

4.4.6 Target BLER=$10^{-6}$

TABLE 145

| Index | SE | CR | Mod | Code |
|---|---|---|---|---|
| 0 | — | — | — | — |
| 1 | 0.0781 | 40 | 2 | Polar |
| 2 | 0.1328 | 68 | 2 | Polar |
| 3 | 0.1992 | 102 | 2 | Polar |
| 4 | 0.3047 | 156 | 2 | Polar |
| 5 | 0.4512 | 231 | 2 | Polar |
| 6 | 0.6445 | 330 | 2 | Polar |
| 7 | 0.8887 | 455 | 2 | Polar |
| 8 | 1.1719 | 600 | 2 | LDPC BG2 |
| 9 | 1.4492 | 742 | 2 | Polar |
| 10 | 1.8086 | 463 | 4 | LDPC BG2 |
| 11 | 2.2695 | 581 | 4 | LDPC BG2 |
| 12 | 2.6641 | 682 | 4 | LDPC BG2 |

TABLE 145-continued

| Index | SE | CR | Mod | Code |
|---|---|---|---|---|
| 13 | 3.0742 | 787 | 4 | Polar |
| 14 | 3.6035 | 615 | 6 | LDPC BG2 |
| 15 | 3.9961 | 682 | 6 | LDPC BG2 |

An adjusted table is Table 146.

TABLE 146

| Index | SE | CR | Mod | Code |
|---|---|---|---|---|
| 0 | — | — | — | — |
| 1 | 0.0781 | 40 | 2 | Polar |
| 2 | 0.1328 | 68 | 2 | Polar |
| 3 | 0.1992 | 102 | 2 | Polar |
| 4 | 0.3047 | 156 | 2 | Polar |
| 5 | 0.4512 | 231 | 2 | Polar |
| 6 | 0.6445 | 330 | 2 | Polar |
| 7 | 0.8887 | 455 | 2 | Polar |
| 8 | 1.1660 | 597 | 2 | Polar |
| 9 | 1.4492 | 742 | 2 | Polar |
| 10 | 1.8086 | 463 | 4 | LDPC BG2 |
| 11 | 2.2695 | 581 | 4 | LDPC BG2 |
| 12 | 2.6641 | 682 | 4 | LDPC BG2 |
| 13 | 2.9414 | 753 | 4 | LDPC BG2 |
| 14 | 3.6035 | 615 | 6 | LDPC BG2 |
| 15 | 3.9961 | 682 | 6 | LDPC BG2 |

5. A coding scheme includes the LDPC BG2, the LDPC BG1, and the polar code.

This section also allows some adjustments to a mapping table for engineering use, for example, the polar code is used for QPSK, the LDPC BG2 is used for 16QAM, and the LDPC BG1 is used for 64QAM.

5.1 No limitation on a code rate 5.1.1 Target BLER=$10^{-1}$

TABLE 147

| Index | SE | CR | Mod | Code |
|---|---|---|---|---|
| 0 | — | — | — | — |
| 1 | 0.0684 | 35 | 2 | Polar |
| 2 | 0.1113 | 57 | 2 | Polar |
| 3 | 0.1875 | 96 | 2 | Polar |
| 4 | 0.3047 | 156 | 2 | Polar |
| 5 | 0.4941 | 253 | 2 | Polar |
| 6 | 0.7637 | 391 | 2 | Polar |
| 7 | 1.123 | 575 | 2 | LDPC BG2 |
| 8 | 1.5078 | 772 | 2 | LDPC BG2 |
| 9 | 2.0352 | 521 | 4 | LDPC BG2 |
| 10 | 2.6563 | 680 | 4 | LDPC BG2 |
| 11 | 3.25 | 832 | 4 | LDPC BG1 |
| 12 | 3.8789 | 662 | 6 | LDPC BG2 |
| 13 | 4.623 | 789 | 6 | LDPC BG1 |
| 14 | 5.2969 | 904 | 6 | LDPC BG1 |
| 15 | 5.7129 | 975 | 6 | LDPC BG1 |

An adjusted table is Table 148.

TABLE 148

| Index | SE | CR | Mod | Code |
|---|---|---|---|---|
| 0 | — | — | — | — |
| 1 | 0.0684 | 35 | 2 | Polar |
| 2 | 0.1113 | 57 | 2 | Polar |
| 3 | 0.1875 | 96 | 2 | Polar |
| 4 | 0.3047 | 156 | 2 | Polar |
| 5 | 0.4941 | 253 | 2 | Polar |
| 6 | 0.7637 | 391 | 2 | Polar |
| 7 | 1.1172 | 572 | 2 | Polar |
| 8 | 1.4980 | 767 | 2 | Polar |

TABLE 148-continued

| Index | SE | CR | Mod | Code |
|---|---|---|---|---|
| 9 | 2.0352 | 521 | 4 | LDPC BG2 |
| 10 | 2.6563 | 680 | 4 | LDPC BG2 |
| 11 | 3.2266 | 826 | 4 | LDPC BG2 |
| 12 | 3.8555 | 658 | 6 | LDPC BG1 |
| 13 | 4.623 | 789 | 6 | LDPC BG1 |
| 14 | 5.2969 | 904 | 6 | LDPC BG1 |
| 15 | 5.7129 | 975 | 6 | LDPC BG1 |

5.1.2 Target BLER=$10^{-2}$

TABLE 149

| Index | SE | CR | Mod | Code |
|---|---|---|---|---|
| 0 | — | — | — | — |
| 1 | 0.0684 | 35 | 2 | Polar |
| 2 | 0.1133 | 58 | 2 | Polar |
| 3 | 0.1973 | 101 | 2 | Polar |
| 4 | 0.3223 | 165 | 2 | Polar |
| 5 | 0.5254 | 269 | 2 | Polar |
| 6 | 0.8145 | 417 | 2 | LDPC BG2 |
| 7 | 1.1895 | 609 | 2 | LDPC BG2 |
| 8 | 1.5566 | 797 | 2 | LDPC BG2 |
| 9 | 2.1289 | 545 | 4 | LDPC BG2 |
| 10 | 2.7383 | 701 | 4 | LDPC BG2 |
| 11 | 3.3047 | 846 | 4 | LDPC BG1 |
| 12 | 3.9492 | 674 | 6 | LDPC BG2 |
| 13 | 4.6699 | 797 | 6 | LDPC BG1 |
| 14 | 5.3145 | 907 | 6 | LDPC BG1 |
| 15 | 5.7129 | 975 | 6 | LDPC BG1 |

An adjusted table is Table 150.

TABLE 150

| Index | SE | CR | Mod | Code |
|---|---|---|---|---|
| 0 | — | — | — | — |
| 1 | 0.0684 | 35 | 2 | Polar |
| 2 | 0.1133 | 58 | 2 | Polar |
| 3 | 0.1973 | 101 | 2 | Polar |
| 4 | 0.3223 | 165 | 2 | Polar |
| 5 | 0.5254 | 269 | 2 | Polar |
| 6 | 0.8086 | 414 | 2 | Polar |
| 7 | 1.1680 | 598 | 2 | Polar |
| 8 | 1.5391 | 788 | 2 | Polar |
| 9 | 2.1289 | 545 | 4 | LDPC BG2 |
| 10 | 2.7383 | 701 | 4 | LDPC BG2 |
| 11 | 3.2773 | 839 | 4 | LDPC BG2 |
| 12 | 3.9141 | 668 | 6 | LDPC BG1 |
| 13 | 4.6699 | 797 | 6 | LDPC BG1 |
| 14 | 5.3145 | 907 | 6 | LDPC BG1 |
| 15 | 5.7129 | 975 | 6 | LDPC BG1 |

5.1.3 Target BLER=$10^{-3}$

TABLE 151

| Index | SE | CR | Mod | Code |
|---|---|---|---|---|
| 0 | — | — | — | — |
| 1 | 0.0703 | 36 | 2 | Polar |
| 2 | 0.1172 | 60 | 2 | Polar |
| 3 | 0.2031 | 104 | 2 | Polar |
| 4 | 0.3379 | 173 | 2 | Polar |
| 5 | 0.5488 | 281 | 2 | Polar |
| 6 | 0.8594 | 440 | 2 | LDPC BG2 |
| 7 | 1.2402 | 635 | 2 | LDPC BG2 |
| 8 | 1.6094 | 412 | 4 | LDPC BG2 |
| 9 | 2.1953 | 562 | 4 | LDPC BG2 |
| 10 | 2.7969 | 716 | 4 | LDPC BG2 |
| 11 | 3.3438 | 856 | 4 | LDPC BG1 |
| 12 | 4.002 | 683 | 6 | LDPC BG2 |

TABLE 151-continued

| Index | SE | CR | Mod | Code |
|---|---|---|---|---|
| 13 | 4.6992 | 802 | 6 | LDPC BG1 |
| 14 | 5.3262 | 909 | 6 | LDPC BG1 |
| 15 | 5.707 | 974 | 6 | LDPC BG1 |

An adjusted table is Table 152.

TABLE 152

| Index | SE | CR | Mod | Code |
|---|---|---|---|---|
| 0 | — | — | — | — |
| 1 | 0.0703 | 36 | 2 | Polar |
| 2 | 0.1172 | 60 | 2 | Polar |
| 3 | 0.2031 | 104 | 2 | Polar |
| 4 | 0.3379 | 173 | 2 | Polar |
| 5 | 0.5488 | 281 | 2 | Polar |
| 6 | 0.8398 | 430 | 2 | Polar |
| 7 | 1.2031 | 616 | 2 | Polar |
| 8 | 1.6094 | 412 | 4 | LDPC BG2 |
| 9 | 2.1953 | 562 | 4 | LDPC BG2 |
| 10 | 2.7969 | 716 | 4 | LDPC BG2 |
| 11 | 3.3008 | 845 | 4 | LDPC BG2 |
| 12 | 3.9551 | 675 | 6 | LDPC BG1 |
| 13 | 4.6992 | 802 | 6 | LDPC BG1 |
| 14 | 5.3262 | 909 | 6 | LDPC BG1 |
| 15 | 5.707 | 974 | 6 | LDPC BG1 |

5.1.4 Target BLER=$10^{-4}$

TABLE 153

| Index | SE | CR | Mod | Code |
|---|---|---|---|---|
| 0 | — | — | — | — |
| 1 | 0.0703 | 36 | 2 | Polar |
| 2 | 0.1211 | 62 | 2 | Polar |
| 3 | 0.209 | 107 | 2 | Polar |
| 4 | 0.3496 | 179 | 2 | Polar |
| 5 | 0.5684 | 291 | 2 | Polar |
| 6 | 0.8926 | 457 | 2 | LDPC BG2 |
| 7 | 1.2734 | 652 | 2 | LDPC BG2 |
| 8 | 1.6641 | 426 | 4 | LDPC BG2 |
| 9 | 2.25 | 576 | 4 | LDPC BG2 |
| 10 | 2.832 | 725 | 4 | LDPC BG2 |
| 11 | 3.3633 | 861 | 4 | LDPC BG1 |
| 12 | 4.0605 | 693 | 6 | LDPC BG1 |
| 13 | 4.7285 | 807 | 6 | LDPC BG1 |
| 14 | 5.3379 | 911 | 6 | LDPC BG1 |
| 15 | 5.707 | 974 | 6 | LDPC BG1 |

An adjusted table is Table 154.

TABLE 154

| Index | SE | CR | Mod | Code |
|---|---|---|---|---|
| 0 | — | — | — | — |
| 1 | 0.0703 | 36 | 2 | Polar |
| 2 | 0.1211 | 62 | 2 | Polar |
| 3 | 0.209 | 107 | 2 | Polar |
| 4 | 0.3496 | 179 | 2 | Polar |
| 5 | 0.5684 | 291 | 2 | Polar |
| 6 | 0.8652 | 443 | 2 | LDPC BG2 |
| 7 | 1.2305 | 630 | 2 | LDPC BG2 |
| 8 | 1.6641 | 426 | 4 | LDPC BG2 |
| 9 | 2.25 | 576 | 4 | LDPC BG2 |
| 10 | 2.832 | 725 | 4 | LDPC BG2 |
| 11 | 3.2578 | 834 | 4 | LDPC BG2 |
| 12 | 3.9902 | 681 | 6 | LDPC BG1 |

TABLE 154-continued

| Index | SE | CR | Mod | Code |
|---|---|---|---|---|
| 13 | 4.7285 | 807 | 6 | LDPC BG1 |
| 14 | 5.3379 | 911 | 6 | LDPC BG1 |
| 15 | 5.707 | 974 | 6 | LDPC BG1 |

5.1.5 Target BLER=$10^{-5}$

TABLE 155

| Index | SE | CR | Mod | Code |
|---|---|---|---|---|
| 0 | — | — | — | — |
| 1 | 0.0703 | 36 | 2 | Polar |
| 2 | 0.123 | 63 | 2 | Polar |
| 3 | 0.2109 | 108 | 2 | Polar |
| 4 | 0.3594 | 184 | 2 | Polar |
| 5 | 0.582 | 298 | 2 | Polar |
| 6 | 0.9082 | 465 | 2 | LDPC BG2 |
| 7 | 1.2852 | 658 | 2 | LDPC BG2 |
| 8 | 1.6914 | 433 | 4 | LDPC BG2 |
| 9 | 2.2813 | 584 | 4 | LDPC BG2 |
| 10 | 2.8438 | 728 | 4 | LDPC BG1 |
| 11 | 3.3594 | 860 | 4 | LDPC BG1 |
| 12 | 4.0781 | 696 | 6 | LDPC BG2 |
| 13 | 4.7461 | 810 | 6 | LDPC BG1 |
| 14 | 5.3496 | 913 | 6 | LDPC BG1 |
| 15 | 5.7129 | 975 | 6 | LDPC BG1 |

An adjusted table is Table 156.

TABLE 156

| Index | SE | CR | Mod | Code |
|---|---|---|---|---|
| 0 | — | — | — | — |
| 1 | 0.0703 | 36 | 2 | Polar |
| 2 | 0.123 | 63 | 2 | Polar |
| 3 | 0.2109 | 108 | 2 | Polar |
| 4 | 0.3594 | 184 | 2 | Polar |
| 5 | 0.582 | 298 | 2 | Polar |
| 6 | 0.8867 | 454 | 2 | Polar |
| 7 | 1.2520 | 641 | 2 | Polar |
| 8 | 1.6914 | 433 | 4 | LDPC BG2 |
| 9 | 2.2813 | 584 | 4 | LDPC BG2 |
| 10 | 2.8086 | 719 | 4 | LDPC BG2 |
| 11 | 3.1680 | 811 | 4 | LDPC BG2 |
| 12 | 4.0254 | 687 | 6 | LDPC BG1 |
| 13 | 4.7461 | 810 | 6 | LDPC BG1 |
| 14 | 5.3496 | 913 | 6 | LDPC BG1 |
| 15 | 5.7129 | 975 | 6 | LDPC BG1 |

5.1.6 Target BLER=$10^{-6}$

TABLE 157

| Index | SE | CR | Mod | Code |
|---|---|---|---|---|
| 0 | — | — | — | — |
| 1 | 0.0703 | 36 | 2 | Polar |
| 2 | 0.125 | 64 | 2 | Polar |
| 3 | 0.2168 | 111 | 2 | Polar |
| 4 | 0.3711 | 190 | 2 | Polar |
| 5 | 0.5996 | 307 | 2 | Polar |
| 6 | 0.9141 | 468 | 2 | Polar |
| 7 | 1.2832 | 657 | 2 | LDPC BG2 |
| 8 | 1.6719 | 428 | 4 | LDPC BG1 |
| 9 | 2.2734 | 582 | 4 | LDPC BG2 |
| 10 | 2.8477 | 729 | 4 | LDPC BG1 |
| 11 | 3.3398 | 855 | 4 | LDPC BG1 |
| 12 | 3.9961 | 682 | 6 | LDPC BG1 |

TABLE 157-continued

| Index | SE | CR | Mod | Code |
|---|---|---|---|---|
| 13 | 4.752 | 811 | 6 | LDPC BG1 |
| 14 | 5.3496 | 913 | 6 | LDPC BG1 |
| 15 | 5.7129 | 975 | 6 | LDPC BG1 |

An adjusted table is Table 158.

TABLE 158

| Index | SE | CR | Mod | Code |
|---|---|---|---|---|
| 0 | — | — | — | — |
| 1 | 0.0703 | 36 | 2 | Polar |
| 2 | 0.125 | 64 | 2 | Polar |
| 3 | 0.2168 | 111 | 2 | Polar |
| 4 | 0.3711 | 190 | 2 | Polar |
| 5 | 0.5996 | 307 | 2 | Polar |
| 6 | 0.9141 | 468 | 2 | Polar |
| 7 | 1.2813 | 656 | 2 | Polar |
| 8 | 1.6523 | 423 | 4 | LDPC BG2 |
| 9 | 2.2734 | 582 | 4 | LDPC BG2 |
| 10 | 2.7656 | 708 | 4 | LDPC BG2 |
| 11 | 3.1250 | 800 | 4 | LDPC BG2 |
| 12 | 3.9961 | 682 | 6 | LDPC BG1 |
| 13 | 4.752 | 811 | 6 | LDPC BG1 |
| 14 | 5.3496 | 913 | 6 | LDPC BG1 |
| 15 | 5.7129 | 975 | 6 | LDPC BG1 |

5.2 Minimum code rate $R_{min}=40/1024$, and no limitation on a maximum code rate 5.2.1 Target BLER=$10^{-1}$

TABLE 159

| Index | SE | CR | Mod | Code |
|---|---|---|---|---|
| 0 | — | — | — | — |
| 1 | 0.0781 | 40 | 2 | Polar |
| 2 | 0.123 | 63 | 2 | Polar |
| 3 | 0.2051 | 105 | 2 | Polar |
| 4 | 0.3301 | 169 | 2 | Polar |
| 5 | 0.5273 | 270 | 2 | Polar |
| 6 | 0.8066 | 413 | 2 | Polar |
| 7 | 1.168 | 598 | 2 | LDPC BG2 |
| 8 | 1.543 | 790 | 2 | LDPC BG2 |
| 9 | 2.0898 | 535 | 4 | LDPC BG2 |
| 10 | 2.6992 | 691 | 4 | LDPC BG2 |
| 11 | 3.2813 | 840 | 4 | LDPC BG1 |
| 12 | 3.9141 | 668 | 6 | LDPC BG2 |
| 13 | 4.6465 | 793 | 6 | LDPC BG1 |
| 14 | 5.3027 | 905 | 6 | LDPC BG1 |
| 15 | 5.7129 | 975 | 6 | LDPC BG1 |

An adjusted table is Table 160.

TABLE 160

| Index | SE | CR | Mod | Code |
|---|---|---|---|---|
| 0 | — | — | — | — |
| 1 | 0.0781 | 40 | 2 | Polar |
| 2 | 0.123 | 63 | 2 | Polar |
| 3 | 0.2051 | 105 | 2 | Polar |
| 4 | 0.3301 | 169 | 2 | Polar |
| 5 | 0.5273 | 270 | 2 | Polar |
| 6 | 0.8066 | 413 | 2 | Polar |
| 7 | 1.1621 | 595 | 2 | Polar |
| 8 | 1.5352 | 786 | 2 | Polar |
| 9 | 2.0898 | 535 | 4 | LDPC BG2 |
| 10 | 2.6992 | 691 | 4 | LDPC BG2 |
| 11 | 3.2539 | 833 | 4 | LDPC BG2 |

TABLE 160-continued

| Index | SE | CR | Mod | Code |
|---|---|---|---|---|
| 12 | 3.8906 | 664 | 6 | LDPC BG1 |
| 13 | 4.6465 | 793 | 6 | LDPC BG1 |
| 14 | 5.3027 | 905 | 6 | LDPC BG1 |
| 15 | 5.7129 | 975 | 6 | LDPC BG1 |

5.2.2 Target BLER=$10^{-2}$

TABLE 161

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.2129 | 109 | 2 | Polar |
| 4 | 0.3477 | 178 | 2 | Polar |
| 5 | 0.5586 | 286 | 2 | Polar |
| 6 | 0.8574 | 439 | 2 | LDPC BG2 |
| 7 | 1.2324 | 631 | 2 | LDPC BG2 |
| 8 | 1.5977 | 409 | 4 | LDPC BG2 |
| 9 | 2.1797 | 558 | 4 | LDPC BG2 |
| 10 | 2.7773 | 711 | 4 | LDPC BG2 |
| 11 | 3.332 | 853 | 4 | LDPC BG1 |
| 12 | 3.9785 | 679 | 6 | LDPC BG2 |
| 13 | 4.6875 | 800 | 6 | LDPC BG1 |
| 14 | 5.3203 | 908 | 6 | LDPC BG1 |
| 15 | 5.7129 | 975 | 6 | LDPC BG1 |

An adjusted table is Table 162.

TABLE 162

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.2129 | 109 | 2 | Polar |
| 4 | 0.3477 | 178 | 2 | Polar |
| 5 | 0.5586 | 286 | 2 | Polar |
| 6 | 0.8477 | 434 | 2 | Polar |
| 7 | 1.2090 | 619 | 2 | Polar |
| 8 | 1.5977 | 409 | 4 | LDPC BG2 |
| 9 | 2.1797 | 558 | 4 | LDPC BG2 |
| 10 | 2.7773 | 711 | 4 | LDPC BG2 |
| 11 | 3.3008 | 845 | 4 | LDPC BG2 |
| 12 | 3.9434 | 673 | 6 | LDPC BG1 |
| 13 | 4.6875 | 800 | 6 | LDPC BG1 |
| 14 | 5.3203 | 908 | 6 | LDPC BG1 |
| 15 | 5.7129 | 975 | 6 | LDPC BG1 |

5.2.3 Target BLER=$10^{-3}$

TABLE 163

| Index | SE | CR | Mod | Code |
|---|---|---|---|---|
| 0 | — | — | — | — |
| 1 | 0.0781 | 40 | 2 | Polar |
| 2 | 0.1367 | 70 | 2 | Polar |
| 3 | 0.2285 | 117 | 2 | Polar |
| 4 | 0.377 | 193 | 2 | Polar |
| 5 | 0.5977 | 306 | 2 | Polar |
| 6 | 0.9219 | 472 | 2 | LDPC BG2 |
| 7 | 1.2988 | 665 | 2 | LDPC BG2 |
| 8 | 1.6875 | 432 | 4 | LDPC BG2 |
| 9 | 2.2656 | 580 | 4 | LDPC BG2 |
| 10 | 2.8516 | 730 | 4 | LDPC BG2 |
| 11 | 3.3789 | 865 | 4 | LDPC BG1 |
| 12 | 4.043 | 690 | 6 | LDPC BG2 |

TABLE 163-continued

| Index | SE | CR | Mod | Code |
|---|---|---|---|---|
| 13 | 4.7285 | 807 | 6 | LDPC BG1 |
| 14 | 5.3379 | 911 | 6 | LDPC BG1 |
| 15 | 5.707 | 974 | 6 | LDPC BG1 |

An adjusted table is Table 164.

TABLE 164

| Index | SE | CR | Mod | Code |
|---|---|---|---|---|
| 0 | — | — | — | — |
| 1 | 0.0781 | 40 | 2 | Polar |
| 2 | 0.1367 | 70 | 2 | Polar |
| 3 | 0.2285 | 117 | 2 | Polar |
| 4 | 0.377 | 193 | 2 | Polar |
| 5 | 0.5977 | 306 | 2 | Polar |
| 6 | 0.8984 | 460 | 2 | Polar |
| 7 | 1.2617 | 646 | 2 | Polar |
| 8 | 1.6875 | 432 | 4 | LDPC BG2 |
| 9 | 2.2656 | 580 | 4 | LDPC BG2 |
| 10 | 2.8516 | 730 | 4 | LDPC BG2 |
| 11 | 3.3359 | 854 | 4 | LDPC BG2 |
| 12 | 3.9961 | 682 | 6 | LDPC BG1 |
| 13 | 4.7285 | 807 | 6 | LDPC BG1 |
| 14 | 5.3379 | 911 | 6 | LDPC BG1 |
| 15 | 5.707 | 974 | 6 | LDPC BG1 |

5.2.4 Target BLER=$10^{-4}$

TABLE 165

| Index | SE | CR | Mod | Code |
|---|---|---|---|---|
| 0 | — | — | — | — |
| 1 | 0.0781 | 40 | 2 | Polar |
| 2 | 0.1406 | 72 | 2 | Polar |
| 3 | 0.2344 | 120 | 2 | Polar |
| 4 | 0.3887 | 199 | 2 | Polar |
| 5 | 0.6191 | 317 | 2 | Polar |
| 6 | 0.957 | 490 | 2 | LDPC BG2 |
| 7 | 1.3301 | 681 | 2 | LDPC BG2 |
| 8 | 1.7383 | 445 | 4 | LDPC BG2 |
| 9 | 2.3164 | 593 | 4 | LDPC BG2 |
| 10 | 2.8828 | 738 | 4 | LDPC BG2 |
| 11 | 3.3984 | 870 | 4 | LDPC BG1 |
| 12 | 4.1016 | 700 | 6 | LDPC BG2 |
| 13 | 4.7578 | 812 | 6 | LDPC BG1 |
| 14 | 5.3496 | 913 | 6 | LDPC BG1 |
| 15 | 5.707 | 974 | 6 | LDPC BG1 |

An adjusted table is Table 166.

TABLE 166

| Index | SE | CR | Mod | Code |
|---|---|---|---|---|
| 0 | — | — | — | — |
| 1 | 0.0781 | 40 | 2 | Polar |
| 2 | 0.1406 | 72 | 2 | Polar |
| 3 | 0.2344 | 120 | 2 | Polar |
| 4 | 0.3887 | 199 | 2 | Polar |
| 5 | 0.6191 | 317 | 2 | Polar |
| 6 | 0.9258 | 474 | 2 | Polar |
| 7 | 1.2871 | 659 | 2 | Polar |
| 8 | 1.7383 | 445 | 4 | LDPC BG2 |
| 9 | 2.3164 | 593 | 4 | LDPC BG2 |
| 10 | 2.8828 | 738 | 4 | LDPC BG2 |
| 11 | 3.3008 | 845 | 4 | LDPC BG2 |
| 12 | 4.0313 | 688 | 6 | LDPC BG1 |

TABLE 166-continued

| Index | SE | CR | Mod | Code |
|---|---|---|---|---|
| 13 | 4.7578 | 812 | 6 | LDPC BG1 |
| 14 | 5.3496 | 913 | 6 | LDPC BG1 |
| 15 | 5.707 | 974 | 6 | LDPC BG1 |

5.2.5 Target BLER=$10^{-5}$

TABLE 167

| Index | SE | CR | Mod | Code |
|---|---|---|---|---|
| 0 | — | — | — | — |
| 1 | 0.0781 | 40 | 2 | Polar |
| 2 | 0.1445 | 74 | 2 | Polar |
| 3 | 0.2441 | 125 | 2 | Polar |
| 4 | 0.4063 | 208 | 2 | Polar |
| 5 | 0.6426 | 329 | 2 | Polar |
| 6 | 0.9844 | 504 | 2 | LDPC BG2 |
| 7 | 1.3457 | 689 | 2 | LDPC BG2 |
| 8 | 1.7852 | 457 | 4 | LDPC BG2 |
| 9 | 2.3555 | 603 | 4 | LDPC BG2 |
| 10 | 2.9063 | 744 | 4 | LDPC BG1 |
| 11 | 3.4023 | 871 | 4 | LDPC BG1 |
| 12 | 4.125 | 704 | 6 | LDPC BG2 |
| 13 | 4.7754 | 815 | 6 | LDPC BG1 |
| 14 | 5.3613 | 915 | 6 | LDPC BG1 |
| 15 | 5.7129 | 975 | 6 | LDPC BG1 |

An adjusted table is Table 168.

TABLE 168

| Index | SE | CR | Mod | Code |
|---|---|---|---|---|
| 0 | — | — | — | — |
| 1 | 0.0781 | 40 | 2 | Polar |
| 2 | 0.1445 | 74 | 2 | Polar |
| 3 | 0.2441 | 125 | 2 | Polar |
| 4 | 0.4063 | 208 | 2 | Polar |
| 5 | 0.6426 | 329 | 2 | Polar |
| 6 | 0.9570 | 490 | 2 | Polar |
| 7 | 1.3184 | 675 | 2 | Polar |
| 8 | 1.7852 | 457 | 4 | LDPC BG2 |
| 9 | 2.3555 | 603 | 4 | LDPC BG2 |
| 10 | 2.8516 | 730 | 4 | LDPC BG2 |
| 11 | 3.2148 | 823 | 4 | LDPC BG2 |
| 12 | 4.0723 | 695 | 6 | LDPC BG1 |
| 13 | 4.7754 | 815 | 6 | LDPC BG1 |
| 14 | 5.3613 | 915 | 6 | LDPC BG1 |
| 15 | 5.7129 | 975 | 6 | LDPC BG1 |

5.2.6 Target BLER=$10^{-6}$

TABLE 169

| Index | SE | CR | Mod | Code |
|---|---|---|---|---|
| 0 | — | — | — | — |
| 1 | 0.0781 | 40 | 2 | Polar |
| 2 | 0.1484 | 76 | 2 | Polar |
| 3 | 0.252 | 129 | 2 | Polar |
| 4 | 0.4219 | 216 | 2 | Polar |
| 5 | 0.666 | 341 | 2 | Polar |
| 6 | 0.9883 | 506 | 2 | Polar |
| 7 | 1.3516 | 692 | 2 | Polar |
| 8 | 1.7617 | 451 | 4 | LDPC BG2 |
| 9 | 2.3477 | 601 | 4 | LDPC BG2 |
| 10 | 2.9102 | 745 | 4 | LDPC BG1 |
| 11 | 3.5273 | 602 | 6 | LDPC BG2 |

TABLE 169-continued

| Index | SE | CR | Mod | Code |
|---|---|---|---|---|
| 12 | 4.043 | 690 | 6 | LDPC BG1 |
| 13 | 4.7813 | 816 | 6 | LDPC BG1 |
| 14 | 5.3613 | 915 | 6 | LDPC BG1 |
| 15 | 5.7129 | 975 | 6 | LDPC BG1 |

An adjusted table is Table 170.

TABLE 170

| Index | SE | CR | Mod | Code |
|---|---|---|---|---|
| 0 | — | — | — | — |
| 1 | 0.0781 | 40 | 2 | Polar |
| 2 | 0.1484 | 76 | 2 | Polar |
| 3 | 0.252 | 129 | 2 | Polar |
| 4 | 0.4219 | 216 | 2 | Polar |
| 5 | 0.666 | 341 | 2 | Polar |
| 6 | 0.9883 | 506 | 2 | Polar |
| 7 | 1.3516 | 692 | 2 | Polar |
| 8 | 1.7617 | 451 | 4 | LDPC BG2 |
| 9 | 2.3477 | 601 | 4 | LDPC BG2 |
| 10 | 2.8086 | 719 | 4 | LDPC BG2 |
| 11 | 3.3340 | 569 | 6 | LDPC BG1 |
| 12 | 4.043 | 690 | 6 | LDPC BG1 |
| 13 | 4.7813 | 816 | 6 | LDPC BG1 |
| 14 | 5.3613 | 915 | 6 | LDPC BG1 |
| 15 | 5.7129 | 975 | 6 | LDPC BG1 |

5.3 No limitation on a minimum code rate, and a maximum code rate $R_{max}=2/3$ 5.3.1 Target BLER=$10^{-1}$

TABLE 171

| Index | SE | CR | Mod | Code |
|---|---|---|---|---|
| 0 | — | — | — | — |
| 1 | 0.0684 | 35 | 2 | Polar |
| 2 | 0.0996 | 51 | 2 | Polar |
| 3 | 0.1543 | 79 | 2 | Polar |
| 4 | 0.2266 | 116 | 2 | Polar |
| 5 | 0.334 | 171 | 2 | Polar |
| 6 | 0.4902 | 251 | 2 | Polar |
| 7 | 0.6973 | 357 | 2 | Polar |
| 8 | 0.9609 | 492 | 2 | Polar |
| 9 | 1.2715 | 651 | 2 | LDPC BG2 |
| 10 | 1.5645 | 801 | 2 | LDPC BG2 |
| 11 | 2.0156 | 516 | 4 | LDPC BG2 |
| 12 | 2.5117 | 643 | 4 | LDPC BG2 |
| 13 | 2.9961 | 767 | 4 | LDPC BG2 |
| 14 | 3.4375 | 880 | 4 | LDPC BG1 |
| 15 | 4.002 | 683 | 6 | LDPC BG1 |

An adjusted table is Table 172.

TABLE 172

| Index | SE | CR | Mod | Code |
|---|---|---|---|---|
| 0 | — | — | — | — |
| 1 | 0.0684 | 35 | 2 | Polar |
| 2 | 0.0996 | 51 | 2 | Polar |
| 3 | 0.1543 | 79 | 2 | Polar |
| 4 | 0.2266 | 116 | 2 | Polar |
| 5 | 0.334 | 171 | 2 | Polar |
| 6 | 0.4902 | 251 | 2 | Polar |
| 7 | 0.6973 | 357 | 2 | Polar |
| 8 | 0.9609 | 492 | 2 | Polar |
| 9 | 1.2617 | 646 | 2 | Polar |
| 10 | 1.5645 | 801 | 2 | Polar |
| 11 | 2.0156 | 516 | 4 | LDPC BG2 |
| 12 | 2.5117 | 643 | 4 | LDPC BG2 |
| 13 | 2.9961 | 767 | 4 | LDPC BG2 |

TABLE 172-continued

| Index | SE | CR | Mod | Code |
|---|---|---|---|---|
| 14 | 3.3906 | 868 | 4 | LDPC BG2 |
| 15 | 3.9785 | 679 | 6 | LDPC BG1 |

5.3.2 Target BLER=$10^{-2}$

TABLE 173

| Index | SE | CR | Mod | Code |
|---|---|---|---|---|
| 0 | — | — | — | — |
| 1 | 0.0684 | 35 | 2 | Polar |
| 2 | 0.1016 | 52 | 2 | Polar |
| 3 | 0.1582 | 81 | 2 | Polar |
| 4 | 0.2363 | 121 | 2 | Polar |
| 5 | 0.3516 | 180 | 2 | Polar |
| 6 | 0.5137 | 263 | 2 | Polar |
| 7 | 0.7266 | 372 | 2 | Polar |
| 8 | 1.0098 | 517 | 2 | LDPC BG2 |
| 9 | 1.3164 | 674 | 2 | LDPC BG2 |
| 10 | 1.6094 | 412 | 4 | LDPC BG2 |
| 11 | 2.0703 | 530 | 4 | LDPC BG2 |
| 12 | 2.5547 | 654 | 4 | LDPC BG2 |
| 13 | 3.0195 | 773 | 4 | LDPC BG2 |
| 14 | 3.4375 | 880 | 4 | LDPC BG1 |
| 15 | 4.002 | 683 | 6 | LDPC BG2 |

An adjusted table is Table 174.

TABLE 174

| Index | SE | CR | Mod | Code |
|---|---|---|---|---|
| 0 | — | — | — | — |
| 1 | 0.0684 | 35 | 2 | Polar |
| 2 | 0.1016 | 52 | 2 | Polar |
| 3 | 0.1582 | 81 | 2 | Polar |
| 4 | 0.2363 | 121 | 2 | Polar |
| 5 | 0.3516 | 180 | 2 | Polar |
| 6 | 0.5137 | 263 | 2 | Polar |
| 7 | 0.7266 | 372 | 2 | Polar |
| 8 | 0.9922 | 508 | 2 | Polar |
| 9 | 1.2910 | 661 | 2 | Polar |
| 10 | 1.6094 | 412 | 4 | LDPC BG2 |
| 11 | 2.0703 | 530 | 4 | LDPC BG2 |
| 12 | 2.5547 | 654 | 4 | LDPC BG2 |
| 13 | 3.0195 | 773 | 4 | LDPC BG2 |
| 14 | 3.3984 | 870 | 4 | LDPC BG2 |
| 15 | 3.9668 | 677 | 6 | LDPC BG1 |

5.3.3 Target BLER=$10^{-3}$

TABLE 175

| Index | SE | CR | Mod | Code |
|---|---|---|---|---|
| 0 | — | — | — | — |
| 1 | 0.0703 | 36 | 2 | Polar |
| 2 | 0.1035 | 53 | 2 | Polar |
| 3 | 0.1621 | 83 | 2 | Polar |
| 4 | 0.2422 | 124 | 2 | Polar |
| 5 | 0.3633 | 186 | 2 | Polar |
| 6 | 0.5313 | 272 | 2 | Polar |
| 7 | 0.7578 | 388 | 2 | LDPC BG2 |
| 8 | 1.0449 | 535 | 2 | LDPC BG2 |
| 9 | 1.3477 | 690 | 2 | LDPC BG2 |
| 10 | 1.6523 | 423 | 4 | LDPC BG2 |
| 11 | 2.1094 | 540 | 4 | LDPC BG2 |
| 12 | 2.582 | 661 | 4 | LDPC BG2 |

TABLE 175-continued

| Index | SE | CR | Mod | Code |
|---|---|---|---|---|
| 13 | 3.0313 | 776 | 4 | LDPC BG2 |
| 14 | 3.4414 | 881 | 4 | LDPC BG1 |
| 15 | 4.002 | 683 | 6 | LDPC BG2 |

An adjusted table is Table 176.

TABLE 176

| Index | SE | CR | Mod | Code |
|---|---|---|---|---|
| 0 | — | — | — | — |
| 1 | 0.0703 | 36 | 2 | Polar |
| 2 | 0.1035 | 53 | 2 | Polar |
| 3 | 0.1621 | 83 | 2 | Polar |
| 4 | 0.2422 | 124 | 2 | Polar |
| 5 | 0.3633 | 186 | 2 | Polar |
| 6 | 0.5313 | 272 | 2 | Polar |
| 7 | 0.7480 | 383 | 2 | Polar |
| 8 | 1.0156 | 520 | 2 | Polar |
| 9 | 1.3105 | 671 | 2 | Polar |
| 10 | 1.6523 | 423 | 4 | LDPC BG2 |
| 11 | 2.1094 | 540 | 4 | LDPC BG2 |
| 12 | 2.582 | 661 | 4 | LDPC BG2 |
| 13 | 3.0313 | 776 | 4 | LDPC BG2 |
| 14 | 3.3984 | 870 | 4 | LDPC BG2 |
| 15 | 3.9551 | 675 | 6 | LDPC BG1 |

5.3.4 Target BLER=$10^{-4}$

TABLE 177

| Index | SE | CR | Mod | Code |
|---|---|---|---|---|
| 0 | — | — | — | — |
| 1 | 0.0703 | 36 | 2 | Polar |
| 2 | 0.1055 | 54 | 2 | Polar |
| 3 | 0.166 | 85 | 2 | Polar |
| 4 | 0.248 | 127 | 2 | Polar |
| 5 | 0.3711 | 190 | 2 | Polar |
| 6 | 0.543 | 278 | 2 | Polar |
| 7 | 0.7793 | 399 | 2 | LDPC BG2 |
| 8 | 1.0684 | 547 | 2 | LDPC BG2 |
| 9 | 1.3613 | 697 | 2 | LDPC BG2 |
| 10 | 1.6758 | 429 | 4 | LDPC BG2 |
| 11 | 2.1328 | 546 | 4 | LDPC BG2 |
| 12 | 2.5938 | 664 | 4 | LDPC BG2 |
| 13 | 3.0234 | 774 | 4 | LDPC BG1 |
| 14 | 3.4297 | 878 | 4 | LDPC BG1 |
| 15 | 4.002 | 683 | 6 | LDPC BG2 |

An adjusted table is Table 178.

TABLE 178

| Index | SE | CR | Mod | Code |
|---|---|---|---|---|
| 0 | — | — | — | — |
| 1 | 0.0703 | 36 | 2 | Polar |
| 2 | 0.1055 | 54 | 2 | Polar |
| 3 | 0.166 | 85 | 2 | Polar |
| 4 | 0.248 | 127 | 2 | Polar |
| 5 | 0.3711 | 190 | 2 | Polar |
| 6 | 0.543 | 278 | 2 | Polar |
| 7 | 0.7617 | 390 | 2 | Polar |
| 8 | 1.0293 | 527 | 2 | Polar |
| 9 | 1.3203 | 676 | 2 | Polar |
| 10 | 1.6758 | 429 | 4 | LDPC BG2 |
| 11 | 2.1328 | 546 | 4 | LDPC BG2 |
| 12 | 2.5938 | 664 | 4 | LDPC BG2 |

TABLE 178-continued

| Index | SE | CR | Mod | Code |
|---|---|---|---|---|
| 13 | 2.9961 | 767 | 4 | LDPC BG2 |
| 14 | 3.3438 | 856 | 4 | LDPC BG2 |
| 15 | 3.9375 | 672 | 6 | LDPC BG1 |

5.3.5 Target BLER=$10^{-5}$

TABLE 179

| Index | SE | CR | Mod | Code |
|---|---|---|---|---|
| 0 | — | — | — | — |
| 1 | 0.0703 | 36 | 2 | Polar |
| 2 | 0.1074 | 55 | 2 | Polar |
| 3 | 0.168 | 86 | 2 | Polar |
| 4 | 0.2539 | 130 | 2 | Polar |
| 5 | 0.3809 | 195 | 2 | Polar |
| 6 | 0.5547 | 284 | 2 | Polar |
| 7 | 0.7891 | 404 | 2 | LDPC BG2 |
| 8 | 1.0801 | 553 | 2 | LDPC BG2 |
| 9 | 1.3613 | 697 | 2 | LDPC BG2 |
| 10 | 1.6992 | 435 | 4 | LDPC BG2 |
| 11 | 2.1602 | 553 | 4 | LDPC BG2 |
| 12 | 2.6016 | 666 | 4 | LDPC BG2 |
| 13 | 3.0352 | 777 | 4 | LDPC BG1 |
| 14 | 3.418 | 875 | 4 | LDPC BG1 |
| 15 | 4.002 | 683 | 6 | LDPC BG2 |

An adjusted table is Table 180.

TABLE 180

| Index | SE | CR | Mod | Code |
|---|---|---|---|---|
| 0 | — | — | — | — |
| 1 | 0.0703 | 36 | 2 | Polar |
| 2 | 0.1074 | 55 | 2 | Polar |
| 3 | 0.168 | 86 | 2 | Polar |
| 4 | 0.2539 | 130 | 2 | Polar |
| 5 | 0.3809 | 195 | 2 | Polar |
| 6 | 0.5547 | 284 | 2 | Polar |
| 7 | 0.7793 | 399 | 2 | Polar |
| 8 | 1.0469 | 536 | 2 | Polar |
| 9 | 1.3379 | 685 | 2 | Polar |
| 10 | 1.6992 | 435 | 4 | LDPC BG2 |
| 11 | 2.1602 | 553 | 4 | LDPC BG2 |
| 12 | 2.6016 | 666 | 4 | LDPC BG2 |
| 13 | 2.9336 | 751 | 4 | LDPC BG2 |
| 14 | 3.2344 | 828 | 4 | LDPC BG2 |
| 15 | 3.9551 | 675 | 6 | LDPC BG1 |

5.3.6 Target BLER=$10^{-6}$

TABLE 181

| Index | SE | CR | Mod | Code |
|---|---|---|---|---|
| 0 | — | — | — | — |
| 1 | 0.0703 | 36 | 2 | Polar |
| 2 | 0.1113 | 57 | 2 | Polar |
| 3 | 0.1719 | 88 | 2 | Polar |
| 4 | 0.2656 | 136 | 2 | Polar |
| 5 | 0.4023 | 206 | 2 | Polar |
| 6 | 0.5859 | 300 | 2 | Polar |
| 7 | 0.8262 | 423 | 2 | Polar |
| 8 | 1.1094 | 568 | 2 | LDPC BG2 |
| 9 | 1.4004 | 717 | 2 | Polar |
| 10 | 1.7227 | 441 | 4 | LDPC BG2 |
| 11 | 2.2227 | 569 | 4 | LDPC BG2 |
| 12 | 2.6719 | 684 | 4 | LDPC BG1 |

TABLE 181-continued

| Index | SE | CR | Mod | Code |
|---|---|---|---|---|
| 13 | 3.0938 | 792 | 4 | LDPC BG1 |
| 14 | 3.6035 | 615 | 6 | LDPC BG2 |
| 15 | 4.0371 | 689 | 6 | LDPC BG1 |

An adjusted table is Table 182.

TABLE 182

| Index | SE | CR | Mod | Code |
|---|---|---|---|---|
| 0 | — | — | — | — |
| 1 | 0.0703 | 36 | 2 | Polar |
| 2 | 0.1113 | 57 | 2 | Polar |
| 3 | 0.1719 | 88 | 2 | Polar |
| 4 | 0.2656 | 136 | 2 | Polar |
| 5 | 0.4023 | 206 | 2 | Polar |
| 6 | 0.5859 | 300 | 2 | Polar |
| 7 | 0.8262 | 423 | 2 | Polar |
| 8 | 1.1055 | 566 | 2 | Polar |
| 9 | 1.4004 | 717 | 2 | Polar |
| 10 | 1.7227 | 441 | 4 | LDPC BG2 |
| 11 | 2.2227 | 569 | 4 | LDPC BG2 |
| 12 | 2.6328 | 674 | 4 | LDPC BG2 |
| 13 | 2.9258 | 749 | 4 | LDPC BG2 |
| 14 | 3.5098 | 599 | 6 | LDPC BG1 |
| 15 | 4.0371 | 689 | 6 | LDPC BG1 |

5.4 Minimum code rate $R_{min}=40/1024$, and maximum code rate $R_{max}=2/3$ 5.4.1 Target BLER=$10^{-1}$

TABLE 183

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.168 | 86 | 2 | Polar |
| 4 | 0.2441 | 125 | 2 | Polar |
| 5 | 0.3594 | 184 | 2 | Polar |
| 6 | 0.5215 | 267 | 2 | Polar |
| 7 | 0.7324 | 375 | 2 | Polar |
| 8 | 0.998 | 511 | 2 | LDPC BG2 |
| 9 | 1.3066 | 669 | 2 | LDPC BG2 |
| 10 | 1.5938 | 408 | 4 | LDPC BG2 |
| 11 | 2.0508 | 525 | 4 | LDPC BG2 |
| 12 | 2.5391 | 650 | 4 | LDPC BG2 |
| 13 | 3.0117 | 771 | 4 | LDPC BG2 |
| 14 | 3.4414 | 881 | 4 | LDPC BG1 |
| 15 | 4.002 | 683 | 6 | LDPC BG2 |

An adjusted table is Table 184.

TABLE 184

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.168 | 86 | 2 | Polar |
| 4 | 0.2441 | 125 | 2 | Polar |
| 5 | 0.3594 | 184 | 2 | Polar |
| 6 | 0.5215 | 267 | 2 | Polar |
| 7 | 0.7324 | 375 | 2 | Polar |
| 8 | 0.9980 | 511 | 2 | Polar |
| 9 | 1.2969 | 664 | 2 | Polar |
| 10 | 1.5938 | 408 | 4 | LDPC BG2 |
| 11 | 2.0508 | 525 | 4 | LDPC BG2 |

TABLE 184-continued

| Index | SE | CR | Mod | Code |
|---|---|---|---|---|
| 12 | 2.5391 | 650 | 4 | LDPC BG2 |
| 13 | 3.0117 | 771 | 4 | LDPC BG2 |
| 14 | 3.3945 | 869 | 4 | LDPC BG2 |
| 15 | 3.9785 | 679 | 6 | LDPC BG1 |

5.4.2 Target BLER=$10^{-2}$

TABLE 185

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.1738 | 89 | 2 | Polar |
| 4 | 0.2539 | 130 | 2 | Polar |
| 5 | 0.375 | 192 | 2 | Polar |
| 6 | 0.543 | 278 | 2 | Polar |
| 7 | 0.7637 | 391 | 2 | LDPC BG2 |
| 8 | 1.0469 | 536 | 2 | LDPC BG2 |
| 9 | 1.3477 | 690 | 2 | LDPC BG2 |
| 10 | 1.6484 | 422 | 4 | LDPC BG2 |
| 11 | 2.1055 | 539 | 4 | LDPC BG2 |
| 12 | 2.5781 | 660 | 4 | LDPC BG2 |
| 13 | 3.0352 | 777 | 4 | LDPC BG2 |
| 14 | 3.4453 | 882 | 4 | LDPC BG1 |
| 15 | 4.002 | 683 | 6 | LDPC BG2 |

An adjusted table is Table 186.

TABLE 186

| Index | SE | CR | Mod | Code |
|---|---|---|---|---|
| 0 | — | — | — | — |
| 1 | 0.0781 | 40 | 2 | Polar |
| 2 | 0.1113 | 57 | 2 | Polar |
| 3 | 0.1738 | 89 | 2 | Polar |
| 4 | 0.2539 | 130 | 2 | Polar |
| 5 | 0.375 | 192 | 2 | Polar |
| 6 | 0.543 | 278 | 2 | Polar |
| 7 | 0.7598 | 389 | 2 | Polar |
| 8 | 1.0273 | 526 | 2 | Polar |
| 9 | 1.3223 | 677 | 2 | Polar |
| 10 | 1.6484 | 422 | 4 | LDPC BG2 |
| 11 | 2.1055 | 539 | 4 | LDPC BG2 |
| 12 | 2.5781 | 660 | 4 | LDPC BG2 |
| 13 | 3.0352 | 777 | 4 | LDPC BG2 |
| 14 | 3.4023 | 871 | 4 | LDPC BG2 |
| 15 | 3.9668 | 677 | 6 | LDPC BG1 |

5.4.3 Target BLER=$10^{-3}$

TABLE 187

| Index | SE | CR | Mod | Code |
|---|---|---|---|---|
| 0 | — | — | — | — |
| 1 | 0.0781 | 40 | 2 | Polar |
| 2 | 0.1191 | 61 | 2 | Polar |
| 3 | 0.1836 | 94 | 2 | Polar |
| 4 | 0.2715 | 139 | 2 | Polar |
| 5 | 0.4004 | 205 | 2 | Polar |
| 6 | 0.5742 | 294 | 2 | Polar |
| 7 | 0.8125 | 416 | 2 | LDPC BG2 |
| 8 | 1.0977 | 562 | 2 | LDPC BG2 |
| 9 | 1.3906 | 712 | 2 | LDPC BG2 |
| 10 | 1.707 | 437 | 4 | LDPC BG2 |
| 11 | 2.1563 | 552 | 4 | LDPC BG2 |
| 12 | 2.6172 | 670 | 4 | LDPC BG2 |

TABLE 187-continued

| Index | SE | CR | Mod | Code |
|---|---|---|---|---|
| 13 | 3.0508 | 781 | 4 | LDPC BG2 |
| 14 | 3.4492 | 883 | 4 | LDPC BG1 |
| 15 | 4.002 | 683 | 6 | LDPC BG2 |

An adjusted table is Table 188.

TABLE 188

| Index | SE | CR | Mod | Code |
|---|---|---|---|---|
| 0 | — | — | — | — |
| 1 | 0.0781 | 40 | 2 | Polar |
| 2 | 0.1191 | 61 | 2 | Polar |
| 3 | 0.1836 | 94 | 2 | Polar |
| 4 | 0.2715 | 139 | 2 | Polar |
| 5 | 0.4004 | 205 | 2 | Polar |
| 6 | 0.5742 | 294 | 2 | Polar |
| 7 | 0.7969 | 408 | 2 | Polar |
| 8 | 1.0645 | 545 | 2 | Polar |
| 9 | 1.3535 | 693 | 2 | Polar |
| 10 | 1.707 | 437 | 4 | LDPC BG2 |
| 11 | 2.1563 | 552 | 4 | LDPC BG2 |
| 12 | 2.6172 | 670 | 4 | LDPC BG2 |
| 13 | 3.0508 | 781 | 4 | LDPC BG2 |
| 14 | 3.4063 | 872 | 4 | LDPC BG2 |
| 15 | 3.9551 | 675 | 6 | LDPC BG1 |

5.4.4 Target BLER=$10^{-4}$

TABLE 189

| Index | SE | CR | Mod | Code |
|---|---|---|---|---|
| 0 | — | — | — | — |
| 1 | 0.0781 | 40 | 2 | Polar |
| 2 | 0.123 | 63 | 2 | Polar |
| 3 | 0.1875 | 96 | 2 | Polar |
| 4 | 0.2773 | 142 | 2 | Polar |
| 5 | 0.4102 | 210 | 2 | Polar |
| 6 | 0.5859 | 300 | 2 | Polar |
| 7 | 0.832 | 426 | 2 | LDPC BG2 |
| 8 | 1.1211 | 574 | 2 | LDPC BG2 |
| 9 | 1.4004 | 717 | 2 | LDPC BG2 |
| 10 | 1.7305 | 443 | 4 | LDPC BG2 |
| 11 | 2.1797 | 558 | 4 | LDPC BG2 |
| 12 | 2.6289 | 673 | 4 | LDPC BG2 |
| 13 | 3.0469 | 780 | 4 | LDPC BG1 |
| 14 | 3.4375 | 880 | 4 | LDPC BG1 |
| 15 | 4.002 | 683 | 6 | LDPC BG2 |

An adjusted table is Table 190.

TABLE 190

| Index | SE | CR | Mod | Code |
|---|---|---|---|---|
| 0 | — | — | — | — |
| 1 | 0.0781 | 40 | 2 | Polar |
| 2 | 0.123 | 63 | 2 | Polar |
| 3 | 0.1875 | 96 | 2 | Polar |
| 4 | 0.2773 | 142 | 2 | Polar |
| 5 | 0.4102 | 210 | 2 | Polar |
| 6 | 0.5859 | 300 | 2 | Polar |
| 7 | 0.8105 | 415 | 2 | Polar |
| 8 | 1.0781 | 552 | 2 | Polar |
| 9 | 1.3633 | 698 | 2 | Polar |
| 10 | 1.7305 | 443 | 4 | LDPC BG2 |
| 11 | 2.1797 | 558 | 4 | LDPC BG2 |
| 12 | 2.6289 | 673 | 4 | LDPC BG2 |

TABLE 190-continued

| Index | SE | CR | Mod | Code |
|---|---|---|---|---|
| 13 | 3.0078 | 770 | 4 | LDPC BG2 |
| 14 | 3.3555 | 859 | 4 | LDPC BG2 |
| 15 | 3.9375 | 672 | 6 | LDPC BG1 |

5.4.5 Target BLER=$10^{-5}$

TABLE 191

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.1934 | 99 | 2 | Polar |
| 4 | 0.2891 | 148 | 2 | Polar |
| 5 | 0.4258 | 218 | 2 | Polar |
| 6 | 0.6074 | 311 | 2 | Polar |
| 7 | 0.8535 | 437 | 2 | LDPC BG2 |
| 8 | 1.1406 | 584 | 2 | LDPC BG2 |
| 9 | 1.4102 | 722 | 2 | LDPC BG1 |
| 10 | 1.7656 | 452 | 4 | LDPC BG2 |
| 11 | 2.2109 | 566 | 4 | LDPC BG2 |
| 12 | 2.6367 | 675 | 4 | LDPC BG2 |
| 13 | 3.0586 | 783 | 4 | LDPC BG1 |
| 14 | 3.4512 | 589 | 6 | LDPC BG2 |
| 15 | 4.002 | 683 | 6 | LDPC BG2 |

An adjusted table is Table 192.

TABLE 192

| Index | SE | CR | Mod | Code |
|---|---|---|---|---|
| 0 | — | — | — | — |
| 1 | 0.0781 | 40 | 2 | Polar |
| 2 | 0.127 | 65 | 2 | Polar |
| 3 | 0.1934 | 99 | 2 | Polar |
| 4 | 0.2891 | 148 | 2 | Polar |
| 5 | 0.4258 | 218 | 2 | Polar |
| 6 | 0.6074 | 311 | 2 | Polar |
| 7 | 0.8359 | 428 | 2 | Polar |
| 8 | 1.1055 | 566 | 2 | Polar |
| 9 | 1.3867 | 710 | 2 | Polar |
| 10 | 1.7656 | 452 | 4 | LDPC BG2 |
| 11 | 2.2109 | 566 | 4 | LDPC BG2 |
| 12 | 2.6367 | 675 | 4 | LDPC BG2 |
| 13 | 2.9453 | 754 | 4 | LDPC BG2 |
| 14 | 3.4277 | 585 | 6 | LDPC BG1 |
| 15 | 3.9551 | 675 | 6 | LDPC BG1 |

5.4.6 Target BLER=$10^{-6}$

TABLE 193

| Index | SE | CR | Mod | Code |
|---|---|---|---|---|
| 0 | — | — | — | — |
| 1 | 0.0781 | 40 | 2 | Polar |
| 2 | 0.1328 | 68 | 2 | Polar |
| 3 | 0.1992 | 102 | 2 | Polar |
| 4 | 0.3047 | 156 | 2 | Polar |
| 5 | 0.4512 | 231 | 2 | Polar |
| 6 | 0.6445 | 330 | 2 | Polar |
| 7 | 0.8887 | 455 | 2 | Polar |
| 8 | 1.1719 | 600 | 2 | LDPC BG2 |
| 9 | 1.4492 | 742 | 2 | Polar |
| 10 | 1.8086 | 463 | 4 | LDPC BG2 |
| 11 | 2.2695 | 581 | 4 | LDPC BG2 |
| 12 | 2.7109 | 694 | 4 | LDPC BG1 |

TABLE 193-continued

| Index | SE | CR | Mod | Code |
|---|---|---|---|---|
| 13 | 3.1172 | 798 | 4 | LDPC BG1 |
| 14 | 3.6035 | 615 | 6 | LDPC BG2 |
| 15 | 4.0371 | 689 | 6 | LDPC BG1 |

An adjusted table is Table 194.

TABLE 194

| Index | SE | CR | Mod | Code |
|---|---|---|---|---|
| 0 | — | — | — | — |
| 1 | 0.0781 | 40 | 2 | Polar |
| 2 | 0.1328 | 68 | 2 | Polar |
| 3 | 0.1992 | 102 | 2 | Polar |
| 4 | 0.3047 | 156 | 2 | Polar |
| 5 | 0.4512 | 231 | 2 | Polar |
| 6 | 0.6445 | 330 | 2 | Polar |
| 7 | 0.8887 | 455 | 2 | Polar |
| 8 | 1.1660 | 597 | 2 | Polar |
| 9 | 1.4492 | 742 | 2 | Polar |
| 10 | 1.8086 | 463 | 4 | LDPC BG2 |
| 11 | 2.2695 | 581 | 4 | LDPC BG2 |
| 12 | 2.6641 | 682 | 4 | LDPC BG2 |
| 13 | 2.9414 | 753 | 4 | LDPC BG2 |
| 14 | 3.5332 | 603 | 6 | LDPC BG1 |
| 15 | 4.0371 | 689 | 6 | LDPC BG1 |

The foregoing describes in detail the CQI tables provided in this application. The following provides another design idea of the CQI table.

To reduce design complexity of CQI tables in the URLLC scenario, CQI tables in an eMBB scenario may be reused as many as possible.

Specifically, because the URLLC scenario requires higher data transmission reliability, in this embodiment of this application, N entries with highest CQI indexes (referred to as an index below) in the CQI tables in the eMBB scenario are deleted, and N entries with lower code rates are added between entries index=0 and index=1. The following provides possible designs of a CQI table in three scenarios with N=1, 2, and 3.

(1) Target BLER=$10^{-1}$

Any mapping relationship between a CQI index and a code rate, spectral efficiency, or a modulation order may be shown in Table 195, Table 196, or Table 197.

TABLE 195

| Index | CR | SE | Mod |
|---|---|---|---|
| 0 | — | — | — |
| 1 | 49 | 0.0957 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 196

| Index | CR | SE | Mod |
|---|---|---|---|
| 0 | — | — | — |
| 1 | 46 | 0.0898 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 197

| Index | CR | SE | Mod |
|---|---|---|---|
| 0 | — | — | — |
| 1 | 64 | 0.1250 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

(2) Target BLER=$10^{-2}$

Any mapping relationship between a CQI index and a code rate, spectral efficiency, or a modulation order may be shown in Table 198, Table 199, Table 200, or Table 201.

TABLE 198

| Index | CR | SE | Mod |
|---|---|---|---|
| 0 | — | — | — |
| 1 | 48 | 0.0938 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 199

| Index | CR | SE | Mod |
|---|---|---|---|
| 0 | — | — | — |
| 1 | 43 | 0.0840 | 2 |
| 2 | 78 | 0.1523 | 2 |

TABLE 199-continued

| Index | CR | SE | Mod |
|---|---|---|---|
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 200

| Index | CR | SE | Mod |
|---|---|---|---|
| 0 | — | — | — |
| 1 | 51 | 0.0996 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 201

| Index | CR | SE | Mod |
|---|---|---|---|
| 0 | — | — | — |
| 1 | 68 | 0.1328 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

(3) Target BLER=$10^{-3}$

Any mapping relationship between a CQI index and a code rate, spectral efficiency, or a modulation order may be shown in Table 202, Table 203, Table 204, or Table 205.

TABLE 202

| Index | CR | SE | Mod |
|---|---|---|---|
| 0 | — | — | — |
| 1 | 47 | 0.0918 | 2 |
| 2 | 78 | 0.1523 | 2 |
| 3 | 120 | 0.2344 | 2 |
| 4 | 193 | 0.377 | 2 |
| 5 | 308 | 0.6016 | 2 |

TABLE 202-continued

| Index | CR | SE | Mod |
|---|---|---|---|
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 203

| Index | CR | SE | Mod |
|---|---|---|---|
| 0 | — | — | — |
| 1 | 42 | 0.082 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 204

| Index | CR | SE | Mod |
|---|---|---|---|
| 0 | — | — | — |
| 1 | 58 | 0.1133 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 205

| Index | CR | SE | Mod |
|---|---|---|---|
| 0 | — | — | — |
| 1 | 41 | 0.0801 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |

TABLE 205-continued

| Index | CR | SE | Mod |
|---|---|---|---|
| 14 | 772 | 4.5234 | 6 |
| 15 | 873 | 5.1152 | 6 |

(4) Target BLER=$10^{-4}$

Any mapping relationship between a CQI index and a code rate, spectral efficiency, or a modulation order may be shown in Table 206, Table 207, Table 208, or Table 209.

TABLE 206

| Index | CR | SE | Mod |
|---|---|---|---|
| 0 | — | — | — |
| 1 | 46 | 0.0898 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 207

| Index | CR | SE | Mod |
|---|---|---|---|
| 0 | — | — | — |
| 1 | 43 | 0.0840 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 208

| Index | CR | SE | Mod |
|---|---|---|---|
| 0 | — | — | — |
| 1 | 26 | 0.0508 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 209

| Index | CR | SE | Mod |
|---|---|---|---|
| 0 | — | — | — |
| 1 | 50 | 0.0977 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

(5) Target BLER=$10^{-5}$

A mapping relationship between a CQI index and a code rate, spectral efficiency, or a modulation order may be shown in Table 210, Table 211, Table 212, or Table 213.

TABLE 210

| Index | CR | SE | Mod |
|---|---|---|---|
| 0 | — | — | — |
| 1 | 46 | 0.0898 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 211

| Index | CR | SE | Mod |
|---|---|---|---|
| 0 | — | — | — |
| 1 | 33 | 0.0645 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 212

| Index | CR | SE | Mod |
|---|---|---|---|
| 0 | — | — | — |
| 1 | 43 | 0.084 | 2 |
| 2 | 78 | 0.1523 | 2 |

TABLE 212-continued

| Index | CR | SE | Mod |
|---|---|---|---|
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 213

| Index | CR | SE | Mod |
|---|---|---|---|
| 0 | — | — | — |
| 1 | 16 | 0.0313 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

(6) Target BLER=$10^{-6}$

Any mapping relationship between a CQI index and a code rate, spectral efficiency, or a modulation order may be shown in any row in Table 214, Table 215, Table 216, or Table 217.

TABLE 214

| Index | CR | SE | Mod |
|---|---|---|---|
| 0 | — | — | — |
| 1 | 45 | 0.0879 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 215

| Index | CR | SE | Mod |
|---|---|---|---|
| 0 | — | — | — |
| 1 | 49 | 0.0957 | 2 |
| 2 | 78 | 0.1523 | 2 |
| 3 | 120 | 0.2344 | 2 |
| 4 | 193 | 0.377 | 2 |

TABLE 215-continued

| Index | CR | SE | Mod |
|---|---|---|---|
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 216

| Index | CR | SE | Mod |
|---|---|---|---|
| 0 | — | — | — |
| 1 | 36 | 0.0703 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

TABLE 217

| Index | CR | SE | Mod |
|---|---|---|---|
| 0 | — | — | — |
| 1 | 10 | 0.0195 | 2 |
| 2 | 78 | 0.1523 | 2 |
| 3 | 120 | 0.2344 | 2 |
| 4 | 193 | 0.377 | 2 |
| 5 | 308 | 0.6016 | 2 |
| 6 | 449 | 0.877 | 2 |
| 7 | 602 | 1.1758 | 2 |
| 8 | 378 | 1.4766 | 4 |
| 9 | 490 | 1.9141 | 4 |
| 10 | 616 | 2.4063 | 4 |
| 11 | 466 | 2.7305 | 6 |
| 12 | 567 | 3.3223 | 6 |
| 13 | 666 | 3.9023 | 6 |
| 14 | 772 | 4.5234 | 6 |
| 15 | 873 | 5.1152 | 6 |

The following further describes another possible design of the CQI table.

(7) Target BLER=$10^{-1}$

Any mapping relationship between a CQI index and a code rate, spectral efficiency, or a modulation order may be shown in Table 218.

TABLE 218

| Index | CR | SE | Mod |
|---|---|---|---|
| 0 | — | — | — |
| 1 | 33 | 0.0645 | 2 |
| 2 | 48 | 0.0938 | 2 |
| 3 | 78 | 0.1523 | 2 |
| 4 | 120 | 0.2344 | 2 |
| 5 | 193 | 0.377 | 2 |

TABLE 218-continued

| Index | CR  | SE     | Mod |
|-------|-----|--------|-----|
| 6     | 308 | 0.6016 | 2   |
| 7     | 449 | 0.877  | 2   |
| 8     | 602 | 1.1758 | 2   |
| 9     | 378 | 1.4766 | 4   |
| 10    | 490 | 1.9141 | 4   |
| 11    | 616 | 2.4063 | 4   |
| 12    | 466 | 2.7305 | 6   |
| 13    | 567 | 3.3223 | 6   |
| 14    | 666 | 3.9023 | 6   |
| 15    | 772 | 4.5234 | 6   |

(8) Target BLER=$10^{-2}$

Any mapping relationship between a CQI index and a code rate, spectral efficiency, or a modulation order may be shown in Table 219.

TABLE 219

| Index | CR  | SE     | Mod |
|-------|-----|--------|-----|
| 0     | —   | —      | —   |
| 1     | 31  | 0.0605 | 2   |
| 2     | 47  | 0.0918 | 2   |
| 3     | 78  | 0.1523 | 2   |
| 4     | 120 | 0.2344 | 2   |
| 5     | 193 | 0.377  | 2   |
| 6     | 308 | 0.6016 | 2   |
| 7     | 449 | 0.877  | 2   |
| 8     | 602 | 1.1758 | 2   |
| 9     | 378 | 1.4766 | 4   |
| 10    | 490 | 1.9141 | 4   |
| 11    | 616 | 2.4063 | 4   |
| 12    | 466 | 2.7305 | 6   |
| 13    | 567 | 3.3223 | 6   |
| 14    | 666 | 3.9023 | 6   |
| 15    | 772 | 4.5234 | 6   |

(9) Target BLER=$10^{-3}$

Any mapping relationship between a CQI index and a code rate, spectral efficiency, or a modulation order may be shown in Table 220.

TABLE 220

| Index | CR  | SE     | Mod |
|-------|-----|--------|-----|
| 0     | —   | —      | —   |
| 1     | 30  | 0.0586 | 2   |
| 2     | 46  | 0.0898 | 2   |
| 3     | 78  | 0.1523 | 2   |
| 4     | 120 | 0.2344 | 2   |
| 5     | 193 | 0.377  | 2   |
| 6     | 308 | 0.6016 | 2   |
| 7     | 449 | 0.877  | 2   |
| 8     | 602 | 1.1758 | 2   |
| 9     | 378 | 1.4766 | 4   |
| 10    | 490 | 1.9141 | 4   |
| 11    | 616 | 2.4063 | 4   |
| 12    | 466 | 2.7305 | 6   |
| 13    | 567 | 3.3223 | 6   |
| 14    | 666 | 3.9023 | 6   |
| 15    | 772 | 4.5234 | 6   |

(10) Target BLER=$10^{-4}$

Any mapping relationship between a CQI index and a code rate, spectral efficiency, or a modulation order may be shown in Table 221.

TABLE 221

| Index | CR  | SE     | Mod |
|-------|-----|--------|-----|
| 0     | —   | —      | —   |
| 1     | 28  | 0.0547 | 2   |
| 2     | 46  | 0.0898 | 2   |
| 3     | 78  | 0.1523 | 2   |
| 4     | 120 | 0.2344 | 2   |
| 5     | 193 | 0.377  | 2   |
| 6     | 308 | 0.6016 | 2   |
| 7     | 449 | 0.877  | 2   |
| 8     | 602 | 1.1758 | 2   |
| 9     | 378 | 1.4766 | 4   |
| 10    | 490 | 1.9141 | 4   |
| 11    | 616 | 2.4063 | 4   |
| 12    | 466 | 2.7305 | 6   |
| 13    | 567 | 3.3223 | 6   |
| 14    | 666 | 3.9023 | 6   |
| 15    | 772 | 4.5234 | 6   |

(11) Target BLER=$10^{-5}$

Any mapping relationship between a CQI index and a code rate, spectral efficiency, or a modulation order may be shown in Table 222.

TABLE 222

| Index | CR  | SE     | Mod |
|-------|-----|--------|-----|
| 0     | —   | —      | —   |
| 1     | 27  | 0.0527 | 2   |
| 2     | 45  | 0.0879 | 2   |
| 3     | 78  | 0.1523 | 2   |
| 4     | 120 | 0.2344 | 2   |
| 5     | 193 | 0.377  | 2   |
| 6     | 308 | 0.6016 | 2   |
| 7     | 449 | 0.877  | 2   |
| 8     | 602 | 1.1758 | 2   |
| 9     | 378 | 1.4766 | 4   |
| 10    | 490 | 1.9141 | 4   |
| 11    | 616 | 2.4063 | 4   |
| 12    | 466 | 2.7305 | 6   |
| 13    | 567 | 3.3223 | 6   |
| 14    | 666 | 3.9023 | 6   |
| 15    | 772 | 4.5234 | 6   |

(12) Target BLER=$10^{-6}$

Any mapping relationship between a CQI index and a code rate, spectral efficiency, or a modulation order may be shown in Table 223.

TABLE 223

| Index | CR  | SE     | Mod |
|-------|-----|--------|-----|
| 0     | —   | —      | —   |
| 1     | 26  | 0.0508 | 2   |
| 2     | 45  | 0.0879 | 2   |
| 3     | 78  | 0.1523 | 2   |
| 4     | 120 | 0.2344 | 2   |
| 5     | 193 | 0.377  | 2   |
| 6     | 308 | 0.6016 | 2   |
| 7     | 449 | 0.877  | 2   |
| 8     | 602 | 1.1758 | 2   |
| 9     | 378 | 1.4766 | 4   |
| 10    | 490 | 1.9141 | 4   |
| 11    | 616 | 2.4063 | 4   |
| 12    | 466 | 2.7305 | 6   |
| 13    | 567 | 3.3223 | 6   |
| 14    | 666 | 3.9023 | 6   |
| 15    | 772 | 4.5234 | 6   |

The following provides another design idea of the CQI table. A CQI table corresponding to another target BLER is generated by using a signal-to-noise ratio point the same as that of the target BLER=$10^{-5}$. The target BLER=$10^{-3}$ is used as an example herein, and when the LDPC BG2 is used for channel coding, a possible CQI table is Table 224.

TABLE 224

| Index | CR | SE | Mod |
|---|---|---|---|
| 0 | — | — | — |
| 1 | 25 | 0.0488 | 2 |
| 2 | 55 | 0.1074 | 2 |
| 3 | 105 | 0.2051 | 2 |
| 4 | 187 | 0.3652 | 2 |
| 5 | 310 | 0.6055 | 2 |
| 6 | 477 | 0.9316 | 2 |
| 7 | 666 | 1.3008 | 2 |
| 8 | 430 | 1.6797 | 4 |
| 9 | 576 | 2.25 | 4 |
| 10 | 724 | 2.8281 | 4 |
| 11 | 847 | 3.3086 | 4 |
| 12 | 680 | 3.9844 | 6 |
| 13 | 792 | 4.6406 | 6 |
| 14 | 886 | 5.1914 | 6 |
| 15 | 953 | 5.584 | 6 |

Similarly, the target BLER=$10^{-3}$ is used as an example, and when the polar code and the LDPC BG2 are used for channel coding, a possible CQI table is Table 225.

TABLE 225

| Index | SE | CR | Mod | Code |
|---|---|---|---|---|
| 0 | — | — | — | — |
| 1 | 0.0215 | 11 | 2 | Polar |
| 2 | 0.0879 | 45 | 2 | Polar |
| 3 | 0.1602 | 82 | 2 | Polar |
| 4 | 0.2695 | 138 | 2 | Polar |
| 5 | 0.4512 | 231 | 2 | Polar |
| 6 | 0.7148 | 366 | 2 | Polar |
| 7 | 1.0645 | 545 | 2 | Polar |
| 8 | 1.4453 | 740 | 2 | Polar |
| 9 | 2 | 512 | 4 | LDPC BG2 |
| 10 | 2.6172 | 670 | 4 | LDPC BG2 |
| 11 | 3.1719 | 812 | 4 | LDPC BG2 |
| 12 | 3.8027 | 649 | 6 | LDPC BG2 |
| 13 | 4.5293 | 773 | 6 | LDPC BG2 |
| 14 | 5.127 | 875 | 6 | LDPC BG2 |
| 15 | 5.5781 | 952 | 6 | LDPC BG2 |

The following provides another design idea of the CQI table. Considering that a highest code rate in a CQI table in the eMBB scenario in the 5G standard is 948, a highest code rate of a CQI table used in the URLLC scenario may be limited to 948, and considering that different target BLERs correspond to a same signal-to-noise ratio range of CQI tables, a corresponding CQI table is generated. By using examples in which only the LDPC BG2 is used for channel coding and both the polar code and the LDPC BG2 are used for channel coding, the following provides possible CQI table designs when the target BLER is $10^{-3}$ and $10^{-5}$.

(1) The LDPC BG2 is used for channel coding.
When the target BLER is $10^{-3}$, a possible CQI table is Table 226.

TABLE 226

| Index | CR | SE | Mod |
|---|---|---|---|
| 0 | — | — | — |
| 1 | 55 | 0.1074 | 2 |
| 2 | 99 | 0.1934 | 2 |
| 3 | 171 | 0.334 | 2 |
| 4 | 275 | 0.5371 | 2 |
| 5 | 418 | 0.8164 | 2 |

TABLE 226-continued

| Index | CR | SE | Mod |
|---|---|---|---|
| 6 | 587 | 1.1465 | 2 |
| 7 | 756 | 1.4766 | 2 |
| 8 | 490 | 1.9141 | 4 |
| 9 | 625 | 2.4414 | 4 |
| 10 | 758 | 2.9609 | 4 |
| 11 | 866 | 3.3828 | 4 |
| 12 | 691 | 4.0488 | 6 |
| 13 | 793 | 4.6465 | 6 |
| 14 | 879 | 5.1504 | 6 |
| 15 | 948 | 5.5547 | 6 |

When the target BLER is $10^{-5}$, a possible CQI table is Table 227.

TABLE 227

| Index | CR | SE | Mod |
|---|---|---|---|
| 0 | — | — | — |
| 1 | 35 | 0.0684 | 2 |
| 2 | 74 | 0.1445 | 2 |
| 3 | 141 | 0.2754 | 2 |
| 4 | 234 | 0.457 | 2 |
| 5 | 368 | 0.7188 | 2 |
| 6 | 538 | 1.0508 | 2 |
| 7 | 706 | 1.3789 | 2 |
| 8 | 462 | 1.8047 | 4 |
| 9 | 598 | 2.3359 | 4 |
| 10 | 719 | 2.8086 | 4 |
| 11 | 800 | 3.125 | 4 |
| 12 | 668 | 3.9141 | 6 |
| 13 | 739 | 4.3301 | 6 |
| 14 | 840 | 4.9219 | 6 |
| 15 | 930 | 5.4492 | 6 |

(2) The polar code and the LDPC BG2 are used for channel coding.
When the target BLER is $10^{-3}$, a possible CQI table is Table 228.

TABLE 228

| Index | SE | CR | Mod | Code |
|---|---|---|---|---|
| 0 | — | — | — | — |
| 1 | 0.0879 | 45 | 2 | Polar |
| 2 | 0.1523 | 78 | 2 | Polar |
| 3 | 0.248 | 127 | 2 | Polar |
| 4 | 0.4023 | 206 | 2 | Polar |
| 5 | 0.623 | 319 | 2 | Polar |
| 6 | 0.918 | 470 | 2 | Polar |
| 7 | 1.2676 | 649 | 2 | Polar |
| 8 | 1.6758 | 429 | 4 | LDPC BG2 |
| 9 | 2.2305 | 571 | 4 | LDPC BG2 |
| 10 | 2.7969 | 716 | 4 | LDPC BG2 |
| 11 | 3.2773 | 839 | 4 | LDPC BG2 |
| 12 | 3.9141 | 668 | 6 | LDPC BG2 |
| 13 | 4.5703 | 780 | 6 | LDPC BG2 |
| 14 | 5.1152 | 873 | 6 | LDPC BG2 |
| 15 | 5.5547 | 948 | 6 | LDPC BG2 |

When the target BLER is $10^{-5}$, a possible CQI table is Table 229.

TABLE 229

| Index | SE | CR | Mod | Code |
|---|---|---|---|---|
| 0 | — | — | — | — |
| 1 | 0.0703 | 36 | 2 | Polar |
| 2 | 0.1211 | 62 | 2 | Polar |
| 3 | 0.2051 | 105 | 2 | Polar |

TABLE 229-continued

| Index | SE | CR | Mod | Code |
|---|---|---|---|---|
| 4 | 0.3418 | 175 | 2 | Polar |
| 5 | 0.5469 | 280 | 2 | Polar |
| 6 | 0.8301 | 425 | 2 | Polar |
| 7 | 1.1758 | 602 | 2 | Polar |
| 8 | 1.5586 | 399 | 4 | LDPC BG2 |
| 9 | 2.125 | 544 | 4 | LDPC BG2 |
| 10 | 2.668 | 683 | 4 | LDPC BG2 |
| 11 | 3.0313 | 776 | 4 | LDPC BG2 |
| 12 | 3.75 | 640 | 6 | LDPC BG2 |
| 13 | 4.3008 | 734 | 6 | LDPC BG2 |
| 14 | 4.875 | 832 | 6 | LDPC BG2 |
| 15 | 5.4492 | 930 | 6 | LDPC BG2 |

Any mapping relationship between a CQI index and spectral efficiency, a code rate, or a coding scheme in the mapping tables shown above may meet all mapping relationships shown in a table above, or may meet only some mapping relationships in a table. For example, a mapping relationship between a CQI index in the first column and parameters in other columns of a mapping table may only meet a mapping relationship shown in a row or mapping relationships in several rows, or may meet a mapping relationship shown in each row in the entire table. For another example, from a row of a table above, there may be the mapping relationship shown in the table between a CQI index and only one column or several columns in the row. This is not limited in this embodiment of this application.

The foregoing describes in detail the data sending method in this embodiment of this application. According to the data sending method provided in this embodiment of this application, data transmission reliability can be improved.

Further, the plurality of mapping tables (or referred to as CQI tables) in this embodiment of this application may meet different reliability requirements. A simple and feasible solution is provided for use cases with different BLER requirements, for example, may be applied to different use cases in the URLLC scenario in the NR.

The following describes a data sending apparatus in the embodiments of this application with reference to FIG. 3 to FIG. 6.

Figure 3:
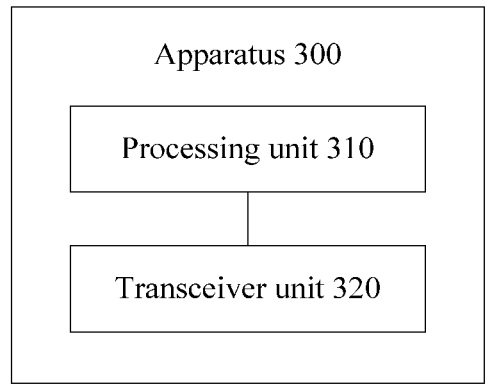
FIG. 3 is a schematic block diagram of a data sending apparatus 300 according to an embodiment of this application.

FIG. 3 is a schematic block diagram of a data sending apparatus 300 according to an embodiment of this application. The apparatus 300 mainly includes a processing unit 310 and a transceiver unit 320.

The processing unit 310 is configured to obtain a modulation order, a code rate, or spectral efficiency, and select an index of a reference channel quality indicator (CQI) from a prestored mapping table based on the obtained modulation order, code rate, or spectral efficiency, where the mapping table includes a mapping relationship between a CQI index and a modulation order, a code rate, or spectral efficiency.

The transceiver unit 320 is configured to send first indication information to a network device, where the first indication information is used to indicate the index of the reference CQI.

The transceiver unit 320 is further configured to receive second indication information from the network device, where the second indication information is used to indicate an index of a target channel quality indicator (CQI).

The processing unit 310 is further configured to determine, from the mapping table based on the index of the target CQI, at least one of a modulation order, a code rate, and a coding scheme that are corresponding to the target CQI.

The foregoing and other operations or functions of the units of the apparatus 300 in this embodiment of this application are used to implement corresponding operations and/or procedures performed by the terminal device in the embodiments of this application. For brevity, details are not described herein.

Figure 4:
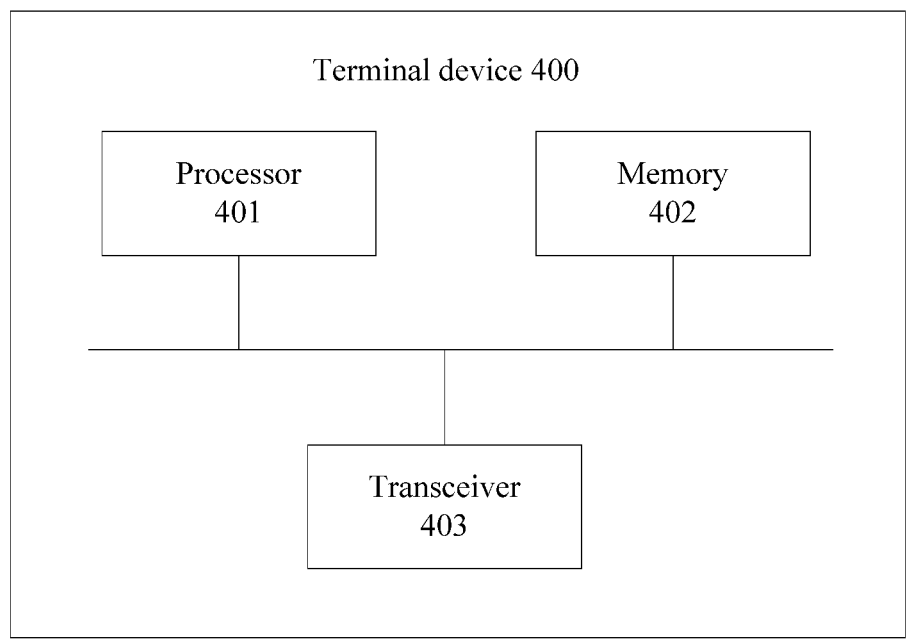
FIG. 4 is a schematic structural diagram of a terminal device 400 according to an embodiment of this application.

FIG. 4 is a schematic structural diagram of a terminal device 400 according to an embodiment of this application. As shown in FIG. 4, the terminal device 400 includes one or more processors 401, one or more memories 402, and one or more transceivers 403. The processor 401 is configured to control the transceiver 403 to receive and send a signal, and the memory 402 is configured to store a computer program. The processor 401 is configured to invoke the computer program from the memory 402 and run the computer program, so that the terminal device 400 performs corresponding procedures and/or operations performed by the terminal device in the embodiments of this application. The memory 402 and the transceiver 403 may be coupled by using a bus or an interface, or may be integrated together, and details are not described herein.

It should be noted that the apparatus 300 shown in FIG. 3 may be implemented by the terminal device 400 shown in FIG. 4. For example, the processing unit 310 may be implemented by the processor 401, and the transceiver unit 320 may be implemented by the transceiver 403.

In addition, this application provides a computer readable storage medium. The computer readable storage medium stores a computer instruction, and when the computer instruction runs on a computer, the computer performs corresponding operations and/or procedures performed by the terminal device in the data sending method.

This application further provides a computer program product, and the computer program product includes computer program code. When the computer program code runs on a computer, the computer performs corresponding operations and/or procedures performed by the terminal device in the data sending method.

This application further provides a chip (or a chip system), including a memory and a processor. The memory is configured to store a computer program, and the processor is configured to invoke the computer program from the memory and run the computer program, so that a communications device in which the chip is installed performs corresponding operations and/or procedures performed by the terminal device in the data sending method. The memory and the processor may be coupled by using a bus, or may be integrated together.

The communications device herein may be a terminal device.

Figure 5:
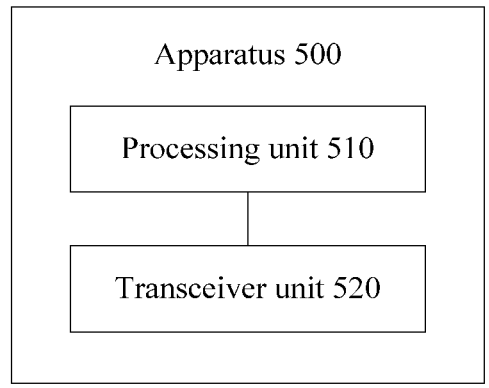
FIG. 5 is a schematic block diagram of a data sending apparatus 500 according to an embodiment of this application.

FIG. 5 is a schematic block diagram of a data sending apparatus 500 according to an embodiment of this application. The apparatus 500 mainly includes a processing unit 510 and a transceiver unit 520.

The processing unit 510 is configured to determine a modulation order, a code rate, or spectral efficiency that needs to be used to send data, and select an index of a target CQI from a prestored mapping table based on the determined modulation order, code rate, or spectral efficiency, where the mapping table includes a mapping relationship between a CQI index and a modulation order, a code rate, or spectral efficiency.

The transceiver unit 520 is configured to send second indication information to a terminal device, where the second indication information is used to indicate the index of the target CQI.

The foregoing and other operations or functions of the units of the apparatus 500 in this embodiment of this application are used to implement corresponding operations and/or procedures performed by the network device in the embodiments of this application. For brevity, details are not described herein.

Optionally, the apparatus 500 may be a chip or an integrated circuit.

Figure 6:
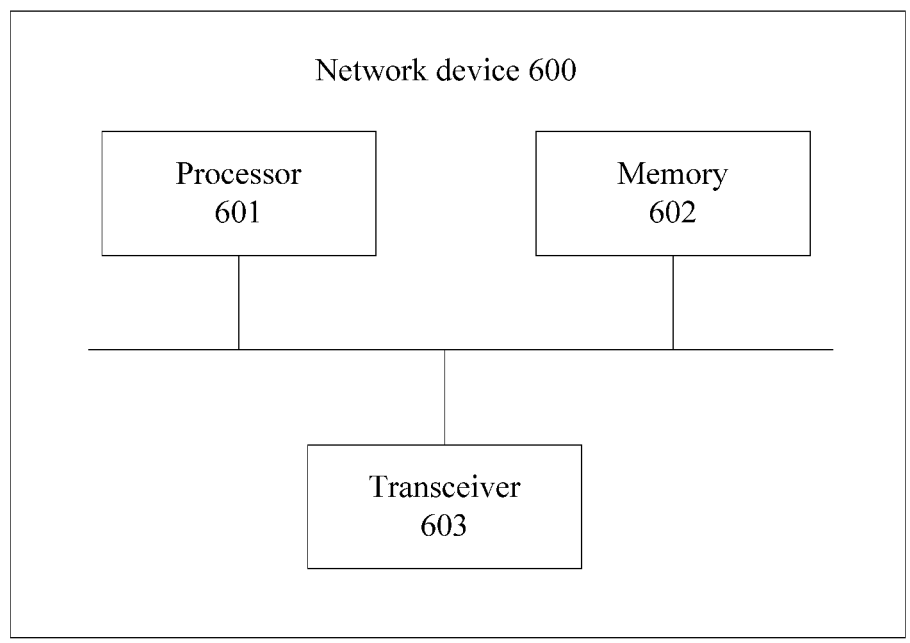
FIG. 6 is a schematic structural diagram of a network device 600 according to an embodiment of this application.

FIG. 6 is a schematic structural diagram of a network device 600 according to an embodiment of this application. As shown in FIG. 6, the network device 600 includes one or more processors 601, one or more memories 602, and one or more transceivers 603. The processor 601 is configured to control the transceiver 603 to receive and send a signal, and the memory 602 is configured to store a computer program. The processor 601 is configured to invoke the computer program from the memory 602 and run the computer program, so that the network device 600 performs corresponding procedures and/or operations performed by the network device in the embodiments of this application. The memory 602 and the transceiver 603 may be coupled by using a bus or an interface, or may be integrated together, and details are not described herein.

It should be noted that the apparatus 500 shown in FIG. 5 may be implemented by the network device 600 shown in FIG. 6. For example, the processing unit 510 may be implemented by the processor 601. The transceiver unit 520 may be implemented by the transceiver 603.

In addition, this application provides a computer readable storage medium. The computer readable storage medium stores a computer instruction, and when the computer instruction runs on a computer, the computer performs corresponding operations and/or procedures performed by the network device in the data sending method.

This application further provides a computer program product, and the computer program product includes computer program code. When the computer program code runs on a computer, the computer performs corresponding operations and/or procedures performed by the network device in the data sending method.

This application further provides a chip (or a chip system), including a memory and a processor. The memory is configured to store a computer program, and the processor is configured to invoke the computer program from the memory and run the computer program, so that a communications device in which the chip is installed performs corresponding operations and/or procedures performed by the network device in the data sending method. The memory and the processor may be coupled by using a bus, or may be integrated together.

In the foregoing embodiments, the processor may be a central processing unit (CPU), a general purpose processor, a digital signal processor (DSP), an application-specific integrated circuit (ASIC), a field programmable gate array (FPGA) or another programmable logic device, a discrete gate or transistor logic device, a discrete hardware component, a microprocessor, one or more integrated circuits configured to control program execution in the solutions of this application, or the like. For example, the processor may include a digital signal processor device, a microprocessor device, an analog-to-digital converter, and a digital-to-analog converter. The processor may allocate control and signal processing functions of mobile devices between these devices based on respective functions of the devices. In addition, the processor may include a function for operating one or more software programs, and the software program may be stored in a memory. The function of the processor may be implemented by hardware, or may be implemented by executing corresponding software by hardware. The hardware or the software includes one or more units corresponding to the foregoing function.

The memory may be a read-only memory (ROM) or another type of static storage device that is capable of storing static information and a static instruction, or a random access memory (RAM) or another type of dynamic storage device that is capable of storing information and an instruction, or may be an electrically erasable programmable read-only memory EEPROM), a compact disc read-only memory (CD-ROM) or other compact disc storage, optical disc storage (which includes a compact disc, a laser disc, an optical disc, a digital versatile disc, a Blu-ray disc, and the like), a disk storage medium or another magnetic storage device, or any other medium that can be used to carry or store expected program code having an instruction or a data structure form and that can be accessed by a computer. However, this is not limited herein.

When the functions are implemented in a form of a software functional unit and sold or used as an independent product, the functions may be stored in a computer readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method for communicating a modulation and coding scheme (MCS), comprising:
    receiving, by a terminal device, indication information from a network device, wherein the indication information comprises an index of a target MCS;
    determining, by the terminal device one or more parameters from a mapping table based on the index of the target MCS, wherein the one or more parameters comprise: a modulation order, a code rate, or a spectral efficiency; and
    processing, by the terminal device, uplink or downlink data based on the determined one or more parameters;
    wherein the mapping table comprises one or more of the following mapping relationships which are applicable in ultra-reliable and low latency communications:
    an MCS index in the mapping table corresponds to a modulation order 2, a code rate 30, and a spectral efficiency 0.0586, wherein an actual code rate is obtained by dividing the code rate 30 by 1024;
    an MCS index in the mapping table corresponds to a modulation order 2, a code rate 50, and a spectral efficiency 0.0977, wherein an actual code rate is obtained by dividing the code rate 50 by 1024;

an MCS index in the mapping table corresponds to a modulation order 2, a code rate 40, and a spectral efficiency 0.0781, wherein an actual code rate is obtained by dividing the code rate 40 by 1024; or an MCS index in the mapping table corresponds to a modulation order 2, a code rate 64, and a spectral efficiency 0.1250, wherein an actual code rate is obtained by dividing the code rate 64 by 1024.

2. The method according to claim 1, wherein the mapping table further comprises one or more mapping relationships between an MCS index and a coding scheme.

3. The method according to claim 2, wherein the coding scheme is either a polar code coding scheme or a low density parity check (LDPC) code coding scheme.

4. A communication apparatus, comprising:
a processor coupled to a memory configured to store program instructions for execution by the processor, wherein by executing the program instructions, the communication apparatus is configured to:
receive indication information from a network device, wherein the indication information comprises an index of a target modulation and coding scheme (MCS);
determine one or more parameters from a mapping table based on the index of the target MCS, wherein the one or more parameters comprise: a modulation order, a code rate, or a spectral efficiency; and
process uplink or downlink data based on the determined one or more parameters;
wherein the mapping table comprises one or more of the following mapping relationships which are applicable in ultra-reliable and low latency communications:
an MCS index in the mapping table corresponds to a modulation order 2, a code rate 30, and a spectral efficiency 0.0586, wherein an actual code rate is obtained by dividing the code rate 30 by 1024;
an MCS index in the mapping table corresponds to a modulation order 2, a code rate 50, and a spectral efficiency 0.0977, wherein an actual code rate is obtained by dividing the code rate 50 by 1024;
an MCS index in the mapping table corresponds to a modulation order 2, a code rate 40, and a spectral efficiency 0.0781, wherein an actual code rate is obtained by dividing the code rate 40 by 1024; or
an MCS index in the mapping table corresponds to a modulation order 2, a code rate 64, and a spectral efficiency 0.1250, wherein an actual code rate is obtained by dividing the code rate 64 by 1024.

5. The communication apparatus according to claim 4, wherein the memory is further configured to store the mapping table.

6. The communication apparatus according to claim 4, wherein the mapping table further comprises one or more mapping relationships between an MCS index and a coding scheme.

7. The communication apparatus according to claim 6, wherein the coding scheme is either a polar code coding scheme or a low density parity check (LDPC) code coding scheme.

8. The communications apparatus according to claim 4, wherein the processor and the memory are separate components of the communications apparatus.

9. The communications apparatus according to claim 4, wherein the processor and the memory are implemented in the communications apparatus as a microchip.

10. The communications apparatus according to claim 4, wherein the communications apparatus is a terminal device.

11. A microchip in a communication apparatus, comprising one or more processing circuits, wherein the one or more processing circuits are configured to:
receive indication information from a network device, wherein the indication information comprises an index of a target modulation and coding scheme (MCS);
determine one or more parameters from a mapping table based on the index of the target MCS, wherein the one or more parameters comprise: a modulation order, a code rate, or a spectral efficiency; and
process uplink or downlink data based on the determined one or more parameters;
wherein the mapping table comprises one or more of the following mapping relationships which are applicable in ultra-reliable and low latency communications:
an MCS index in the mapping table corresponds to a modulation order 2, a code rate 30, and a spectral efficiency 0.0586, wherein an actual code rate is obtained by dividing the code rate 30 by 1024;
an MCS index in the mapping table corresponds to a modulation order 2, a code rate 50, and a spectral efficiency 0.0977, wherein an actual code rate is obtained by dividing the code rate 50 by 1024;
an MCS index in the mapping table corresponds to a modulation order 2, a code rate 40, and a spectral efficiency 0.0781, wherein an actual code rate is obtained by dividing the code rate 40 by 1024; or
an MCS index in the mapping table corresponds to a modulation order 2, a code rate 64, and a spectral efficiency 0.1250, wherein an actual code rate is obtained by dividing the code rate 64 by 1024.

12. The microchip according to claim 11, wherein the mapping table further comprises one or more mapping relationships between an MCS index and a coding scheme.

13. The microchip according to claim 12, wherein the coding scheme is either a polar code coding scheme or a low density parity check (LDPC) code coding scheme.

14. A method for use by a microprocessor in a terminal device, comprising:
controlling the terminal device to receive indication information from a network device, wherein the indication information comprises an index of a target modulation and coding scheme (MCS);
controlling the terminal device to determine one or more parameters from a mapping table based on the index of the target MCS, wherein the one or more parameters comprise: a modulation order, a code rate, or a spectral efficiency; and
controlling the terminal device to process uplink or downlink data based on the determined one or more parameters;
wherein the mapping table comprises one or more of the following mapping relationships which are applicable in ultra-reliable and low latency communications:
an MCS index in the mapping table corresponds to a modulation order 2, a code rate 30, and a spectral efficiency 0.0586, wherein an actual code rate is obtained by dividing the code rate 30 by 1024;
an MCS index in the mapping table corresponds to a modulation order 2, a code rate 50, and a spectral efficiency 0.0977, wherein an actual code rate is obtained by dividing the code rate 50 by 1024;
an MCS index in the mapping table corresponds to a modulation order 2, a code rate 40, and a spectral efficiency 0.0781, wherein an actual code rate is obtained by dividing the code rate 40 by 1024; or an MCS index in the mapping table corresponds to a modulation order 2, a code rate 64, and a spectral efficiency 0.1250, wherein an actual code rate is obtained by dividing the code rate 64 by 1024.

15. The method according to claim 14, wherein the mapping table further comprises one or more mapping relationships between an MCS index and a coding scheme.

16. The method according to claim 15, wherein the coding scheme is either a polar code coding scheme or a low density parity check (LDPC) code coding scheme.

* * * * *